(12) United States Patent
Rice et al.

(10) Patent No.: US 7,798,764 B2
(45) Date of Patent: Sep. 21, 2010

(54) SUBSTRATE PROCESSING SEQUENCE IN A CARTESIAN ROBOT CLUSTER TOOL

(75) Inventors: Mike Rice, Pleasanton, CA (US); Jeffrey Hudgens, San Francisco, CA (US); Charles Carlson, Cedar Park, TX (US); William Tyler Weaver, Austin, TX (US); Robert Lowrance, Los Gatos, CA (US); Eric Englhardt, Palo Alto, CA (US); Dean C. Hruzek, Austin, TX (US); Dave Silvetti, Morgan Hill, CA (US); Michael Kuchar, Austin, TX (US); Kirk Van Katwyk, Tracy, CA (US); Van Hoskins, Round Rock, TX (US); Vinay Shah, San Mateo, CA (US)

(73) Assignee: Applied Materials, Inc., Santa Clara, CA (US)

( * ) Notice: Subject to any disclaimer, the term of this patent is extended or adjusted under 35 U.S.C. 154(b) by 71 days.

(21) Appl. No.: 11/553,820

(22) Filed: Oct. 27, 2006

(65) Prior Publication Data
US 2007/0147976 A1   Jun. 28, 2007

Related U.S. Application Data

(63) Continuation of application No. 11/315,984, filed on Dec. 22, 2005, now Pat. No. 7,651,306.

(51) Int. Cl.
*H01L 21/67* (2006.01)
(52) U.S. Cl. .................................................. 414/805
(58) Field of Classification Search ............... 414/217, 414/805, 935, 217.1, 937, 806
See application file for complete search history.

(56) References Cited

U.S. PATENT DOCUMENTS 1,383,093 A   6/1921   Finch
(Continued)

FOREIGN PATENT DOCUMENTS

DE   3790259 C2   11/1986
(Continued)

OTHER PUBLICATIONS

Klaus Eberhardt, "Advanced Photoresist Wafer Processing System for Deep UV (DUV)", Fairchild Technologies GMBH, Vaihingen/Enz, Germany, Nov. 2004, pp. 1-9.
(Continued)

*Primary Examiner*—Charles A Fox
(74) *Attorney, Agent, or Firm*—Patterson & Sheridan, LLP

(57) ABSTRACT

A method and apparatus for processing substrates using a cluster tool that has an increased system throughput, increased system reliability, improved device yield performance, and a reduced footprint. The various embodiments of the cluster tool may utilize two or more robot assemblies that are configured in a parallel processing configuration and adapted to move in a vertical and a horizontal direction to transfer substrates between the various processing chambers retained in the processing racks so that a desired processing sequence can be performed on the substrates. Generally, the various embodiments described herein are advantageous since each row or group of substrate processing chambers are serviced by two or more robots to allow for increased throughput and increased system reliability. Also, the various embodiments described herein are generally configured to minimize and control the particles generated by the substrate transferring mechanisms.

19 Claims, 45 Drawing Sheets

U.S. PATENT DOCUMENTS

| | | |
|---|---|---|
| 1,927,677 A | 9/1933 | Bennington |
| 2,578,220 A | 12/1951 | Billner |
| 3,193,080 A | 7/1965 | Speaker et al. |
| 3,206,041 A | 9/1965 | McGrath |
| 3,279,625 A | 10/1966 | McConnell et al. |
| 3,351,219 A | 11/1967 | Ruderfer et al. |
| 3,402,835 A | 9/1968 | Saul |
| 3,428,195 A | 2/1969 | Pamer |
| 3,610,159 A | 10/1971 | Fickenacher |
| 3,669,206 A | 6/1972 | Tax et al. |
| 3,750,804 A | 8/1973 | Lemelson |
| 3,782,564 A | 1/1974 | Burt |
| 3,796,327 A | 3/1974 | Meyer et al. |
| 3,876,085 A | 4/1975 | Bright |
| 4,027,246 A | 5/1977 | Caccoma et al. |
| 4,197,000 A | 4/1980 | Blackwood |
| 4,319,689 A | 3/1982 | Clapp |
| 4,609,575 A | 9/1986 | Burkman |
| 4,634,655 A | 1/1987 | Yanagimoto et al. |
| 4,664,133 A | 5/1987 | Silvernail |
| 4,682,614 A | 7/1987 | Silvernail |
| 4,750,505 A | 6/1988 | Inuta et al. |
| 4,755,257 A | 7/1988 | Yamamoto et al. |
| 4,756,047 A | 7/1988 | Hayashi et al. |
| 4,774,552 A | 9/1988 | Nishihama et al. |
| 4,788,994 A | 12/1988 | Shinbara |
| 4,803,734 A | 2/1989 | Onishi et al. |
| 4,830,888 A | 5/1989 | Kobayashi et al. |
| 4,838,979 A | 6/1989 | Nishida et al. |
| 4,844,746 A | 7/1989 | Hormann et al. |
| 4,846,623 A | 7/1989 | Otani et al. |
| 4,855,775 A | 8/1989 | Matsuoka |
| 4,856,641 A | 8/1989 | Matsumura et al. |
| 4,857,949 A | 8/1989 | Masuda et al. |
| 4,870,923 A | 10/1989 | Sugimoto |
| 4,871,417 A | 10/1989 | Nishizawa et al. |
| 4,892,761 A | 1/1990 | Yamada |
| 4,895,604 A | 1/1990 | Hayashi |
| 4,899,686 A | 2/1990 | Toshima et al. |
| 4,911,761 A | 3/1990 | McConnell et al. |
| 4,917,123 A | 4/1990 | McConnell et al. |
| 4,919,073 A | 4/1990 | Kobayashi et al. |
| 4,922,278 A | 5/1990 | Takeda et al. |
| 4,923,054 A | 5/1990 | Ohtani et al. |
| 4,924,073 A | 5/1990 | Chiba |
| 4,924,800 A | 5/1990 | Tanaka |
| 4,966,094 A | 10/1990 | Yamada |
| 4,982,694 A | 1/1991 | Moriyama |
| 4,984,597 A | 1/1991 | McConnell et al. |
| 4,985,720 A | 1/1991 | Masuda et al. |
| 4,987,687 A | 1/1991 | Sugimoto |
| 4,998,021 A | 3/1991 | Mimasaka |
| 5,002,008 A | 3/1991 | Ushijima et al. |
| 5,020,200 A | 6/1991 | Mimasaka et al. |
| 5,031,474 A | 7/1991 | Keppler et al. |
| 5,032,217 A | 7/1991 | Tanaka |
| 5,035,200 A | 7/1991 | Moriyama |
| 5,054,332 A | 10/1991 | Terauchi et al. |
| 5,061,144 A | 10/1991 | Akimoto et al. |
| 5,065,178 A | 11/1991 | Awazu et al. |
| 5,070,813 A | 12/1991 | Sakai et al. |
| 5,078,832 A | 1/1992 | Tanaka |
| 5,089,305 A | 2/1992 | Ushijima et al. |
| 5,127,362 A | 7/1992 | Iwatsu et al. |
| 5,151,871 A | 9/1992 | Matsumura et al. |
| 5,169,408 A | 12/1992 | Biggerstaff |
| 5,174,855 A | 12/1992 | Tanaka |
| 5,180,431 A | 1/1993 | Sugimoto et al. |
| 5,197,846 A | 3/1993 | Uno et al. |
| 5,201,653 A | 4/1993 | Hasegawa et al. |
| 5,209,180 A | 5/1993 | Shoda et al. |
| 5,234,499 A | 8/1993 | Sasaki et al. |
| 5,240,556 A | 8/1993 | Ishikawa et al. |
| 5,250,114 A | 10/1993 | Konishi et al. |
| 5,252,137 A | 10/1993 | Tateyama et al. |
| 5,254,367 A | 10/1993 | Matsumura et al. |
| D341,418 S | 11/1993 | Akimoto et al. |
| 5,275,658 A | 1/1994 | Kimura |
| 5,307,109 A | 4/1994 | Miyasaka et al. |
| 5,308,210 A | 5/1994 | Ohtani et al. |
| 5,312,487 A | 5/1994 | Akimoto et al. |
| 5,322,079 A | 6/1994 | Fukutomi et al. |
| 5,331,987 A | 7/1994 | Hayashi et al. |
| 5,339,128 A | 8/1994 | Tateyama et al. |
| 5,349,412 A | 9/1994 | Miyasaka |
| 5,359,785 A | 11/1994 | Fukutomi et al. |
| 5,374,312 A | 12/1994 | Hasebe et al. |
| 5,376,216 A | 12/1994 | Yoshioka et al. |
| 5,401,316 A | 3/1995 | Shiraishi et al. |
| 5,405,443 A | 4/1995 | Akimoto et al. |
| 5,411,076 A | 5/1995 | Matsunaga et al. |
| 5,415,890 A | 5/1995 | Kloiber et al. |
| 5,416,047 A | 5/1995 | Konishi et al. |
| 5,418,382 A | 5/1995 | Blackwood et al. |
| 5,427,820 A | 6/1995 | Biche et al. |
| 5,430,271 A | 7/1995 | Orgami et al. |
| 5,431,700 A | 7/1995 | Sloan |
| 5,436,848 A | 7/1995 | Nishida et al. |
| 5,438,209 A | 8/1995 | Yamamoto et al. |
| 5,443,348 A | 8/1995 | Biche et al. |
| 5,485,644 A | 1/1996 | Shinbara et al. |
| 5,501,870 A | 3/1996 | Shiraishi et al. |
| 5,505,781 A | 4/1996 | Omori et al. |
| 5,514,215 A | 5/1996 | Takamatsu et al. |
| 5,514,852 A | 5/1996 | Takamori et al. |
| 5,520,744 A | 5/1996 | Fujikawa et al. |
| 5,522,215 A | 6/1996 | Matsunaga et al. |
| 5,536,918 A | 7/1996 | Ohkase et al. |
| 5,553,994 A | 9/1996 | Biche et al. |
| 5,555,234 A | 9/1996 | Sugimoto |
| 5,571,325 A | 11/1996 | Ueyama et al. |
| 5,580,607 A | 12/1996 | Takekuma et al. |
| 5,599,394 A | 2/1997 | Yabe et al. |
| 5,601,645 A | 2/1997 | Nonomura et al. |
| 5,608,943 A | 3/1997 | Konishi et al. |
| 5,611,685 A | 3/1997 | Nakajima et al. |
| 5,618,348 A | 4/1997 | Tran |
| 5,620,560 A | 4/1997 | Akimoto et al. |
| 5,625,433 A | 4/1997 | Inada et al. |
| 5,626,913 A | 5/1997 | Tomoeda et al. |
| 5,633,040 A | 5/1997 | Toshima et al. |
| 5,634,377 A | 6/1997 | Kimura et al. |
| 5,638,687 A | 6/1997 | Mizohata et al. |
| 5,639,301 A | 6/1997 | Sasada et al. |
| 5,651,823 A | 7/1997 | Parodi et al. |
| 5,658,615 A | 8/1997 | Hasebe et al. |
| 5,665,200 A | 9/1997 | Fujimoto et al. |
| 5,668,733 A | 9/1997 | Morimoto et al. |
| 5,670,210 A | 9/1997 | Mandal et al. |
| 5,672,205 A | 9/1997 | Fujimoto et al. |
| 5,674,410 A | 10/1997 | Nakajima et al. |
| 5,677,000 A | 10/1997 | Yoshioka et al. |
| 5,681,614 A | 10/1997 | Omori et al. |
| 5,687,085 A | 11/1997 | Morimoto et al. |
| 5,688,322 A | 11/1997 | Motoda et al. |
| 5,688,324 A | 11/1997 | Umaba |
| 5,688,326 A | 11/1997 | Kandori et al. |
| 5,689,749 A | 11/1997 | Tanaka et al. |
| 5,695,817 A | 12/1997 | Tateyama et al. |
| 5,700,046 A | 12/1997 | Van Doren et al. |
| 5,701,627 A | 12/1997 | Matsumura et al. |
| 5,704,493 A | 1/1998 | Fujikawa et al. |
| 5,711,809 A | 1/1998 | Kimura et al. |
| 5,715,173 A | 2/1998 | Nakajima et al. |

| | | | | | |
|---|---|---|---|---|---|
| 5,730,574 A | 3/1998 | Adachi et al. | 5,984,540 A | 11/1999 | Mimasaka et al. |
| 5,733,024 A | 3/1998 | Slocum et al. | 5,985,357 A | 11/1999 | Sanada |
| 5,762,684 A | 6/1998 | Hayashi et al. | 5,989,342 A | 11/1999 | Ikeda et al. |
| 5,762,708 A | 6/1998 | Motoda et al. | 5,989,346 A | 11/1999 | Hiroki |
| 5,762,709 A | 6/1998 | Sugimoto et al. | 5,989,632 A | 11/1999 | Sanada et al. |
| 5,762,745 A | 6/1998 | Hirose | 5,992,431 A | 11/1999 | Weber et al. |
| 5,763,892 A | 6/1998 | Kizaki et al. | 5,993,518 A | 11/1999 | Tateyama |
| 5,765,072 A | 6/1998 | Ohtani et al. | 6,000,862 A | 12/1999 | Okuda |
| 5,766,671 A | 6/1998 | Matsui | 6,002,108 A | 12/1999 | Yoshioka |
| 5,766,824 A | 6/1998 | Batchelder et al. | 6,004,047 A | 12/1999 | Akimoto et al. |
| 5,772,764 A | 6/1998 | Akimoto | 6,007,629 A | 12/1999 | Ohtani et al. |
| 5,779,796 A | 7/1998 | Tomoeda et al. | 6,010,570 A | 1/2000 | Motoda et al. |
| 5,788,742 A | 8/1998 | Sugimoto et al. | 6,012,192 A | 1/2000 | Sawada et al. |
| 5,788,773 A | 8/1998 | Okuda et al. | 6,012,858 A | 1/2000 | Konishi et al. |
| 5,788,868 A | 8/1998 | Itaba et al. | 6,013,317 A | 1/2000 | Motoda et al. |
| 5,792,259 A | 8/1998 | Yoshioka et al. | 6,015,066 A | 1/2000 | Kimura et al. |
| 5,803,932 A | 9/1998 | Akimoto et al. | 6,017,663 A | 1/2000 | Yaegashiy et al. |
| 5,803,970 A * | 9/1998 | Tateyama et al. ........... 118/319 | 6,018,616 A | 1/2000 | Schaper |
| 5,817,156 A | 10/1998 | Tateyama et al. | 6,021,790 A | 2/2000 | Yoshitani et al. |
| 5,823,736 A | 10/1998 | Matsumura | 6,033,475 A | 3/2000 | Hasebe et al. |
| 5,826,130 A | 10/1998 | Tanaka et al. | 6,040,120 A | 3/2000 | Matsushita et al. |
| 5,834,737 A | 11/1998 | Hirose et al. | 6,048,400 A | 4/2000 | Ohtani |
| 5,838,121 A | 11/1998 | Fairbairn et al. | 6,051,101 A | 4/2000 | Ohtani et al. |
| 5,839,011 A | 11/1998 | Urasaki et al. | 6,051,349 A | 4/2000 | Yoshioka |
| 5,841,515 A | 11/1998 | Ohtani | 6,053,058 A | 4/2000 | Hayashi et al. |
| 5,843,527 A | 12/1998 | Sanada | 6,053,977 A | 4/2000 | Konishi |
| 5,845,170 A | 12/1998 | Ogata | 6,056,998 A | 5/2000 | Fujimoto |
| 5,846,327 A | 12/1998 | Kawamoto et al. | 6,059,880 A | 5/2000 | Kitano et al. |
| 5,853,483 A | 12/1998 | Morita et al. | 6,060,697 A | 5/2000 | Morita et al. |
| 5,853,812 A | 12/1998 | Kawasaki et al. | 6,062,240 A | 5/2000 | Sada et al. |
| 5,854,953 A | 12/1998 | Semba | 6,062,288 A | 5/2000 | Tateyama |
| 5,866,307 A | 2/1999 | Kiba et al. | 6,062,852 A | 5/2000 | Kawamoto et al. |
| 5,867,389 A | 2/1999 | Hamada et al. | 6,063,190 A | 5/2000 | Hasebe et al. |
| 5,871,584 A | 2/1999 | Tateyama et al. | 6,063,439 A | 5/2000 | Semba et al. |
| 5,875,804 A | 3/1999 | Tanaka et al. | 6,067,727 A | 5/2000 | Muraoka |
| 5,881,750 A | 3/1999 | Yoshitani | 6,074,515 A | 6/2000 | Iseki et al. |
| 5,887,214 A | 3/1999 | Kuriu et al. | 6,076,652 A | 6/2000 | Head |
| 5,888,344 A | 3/1999 | Ogami et al. | 6,076,979 A | 6/2000 | Mimasaka et al. |
| 5,898,588 A | 4/1999 | Morimoto | 6,077,321 A | 6/2000 | Adachi et al. |
| 5,904,169 A | 5/1999 | Yoshitani | 6,087,632 A | 7/2000 | Mizosaki et al. |
| 5,906,469 A | 5/1999 | Oka et al. | 6,089,762 A | 7/2000 | Mimasaka et al. |
| 5,906,860 A | 5/1999 | Motoda et al. | 6,097,005 A | 8/2000 | Akimoto |
| 5,908,657 A | 6/1999 | Kimura et al. | 6,099,643 A | 8/2000 | Ohtani et al. |
| 5,912,054 A | 6/1999 | Tateyama | 6,104,002 A | 8/2000 | Hirose et al. |
| 5,915,396 A | 6/1999 | Kinose | 6,108,932 A | 8/2000 | Chai |
| 5,916,366 A | 6/1999 | Ueyama et al. | 6,109,677 A | 8/2000 | Anthony |
| 5,919,520 A | 7/1999 | Tateyama et al. | 6,113,695 A | 9/2000 | Fujimoto |
| 5,919,529 A | 7/1999 | Matsumura | 6,117,486 A | 9/2000 | Yoshihara |
| 5,921,257 A | 7/1999 | Weber et al. | 6,120,834 A | 9/2000 | Terauchi |
| 5,923,915 A | 7/1999 | Akimoto et al. | 6,126,725 A | 10/2000 | Tateyama |
| 5,927,077 A | 7/1999 | Hisai et al. | 6,128,829 A | 10/2000 | Wolke et al. |
| 5,927,303 A | 7/1999 | Miya et al. | 6,129,546 A | 10/2000 | Sada |
| 5,932,380 A | 8/1999 | Yaegashi et al. | 6,138,695 A | 10/2000 | Shibao et al. |
| 5,935,768 A | 8/1999 | Biche et al. | 6,142,722 A | 11/2000 | Genov et al. |
| 5,938,847 A | 8/1999 | Akimoto et al. | 6,143,087 A | 11/2000 | Walter |
| 5,939,130 A | 8/1999 | Shiraishi et al. | 6,143,478 A | 11/2000 | Toshima et al. |
| 5,941,083 A | 8/1999 | Sada et al. | 6,147,329 A | 11/2000 | Okamura et al. |
| 5,942,035 A | 8/1999 | Hasebe et al. | 6,149,727 A | 11/2000 | Yoshioka et al. |
| 5,943,726 A | 8/1999 | Eitoku et al. | 6,155,275 A | 12/2000 | Shinbara |
| 5,943,880 A | 8/1999 | Tateyama et al. | 6,156,125 A | 12/2000 | Harada |
| 5,945,161 A | 8/1999 | Hashimoto et al. | 6,158,446 A | 12/2000 | Mohindra |
| 5,960,225 A | 9/1999 | Fujimoto | 6,159,291 A | 12/2000 | Morita et al. |
| 5,961,269 A | 10/1999 | Kroeker | 6,159,541 A | 12/2000 | Sakai et al. |
| 5,962,070 A | 10/1999 | Mitsuhashi et al. | 6,165,273 A | 12/2000 | Fayefield |
| 5,963,753 A | 10/1999 | Ohtani et al. | 6,168,665 B1 | 1/2001 | Sakai et al. |
| 5,965,200 A | 10/1999 | Tateyama et al. | 6,169,274 B1 | 1/2001 | Kulp |
| 5,968,268 A | 10/1999 | Kitano et al. | 6,174,371 B1 | 1/2001 | Iseki et al. |
| 5,968,691 A | 10/1999 | Yoshioka et al. | 6,176,667 B1 | 1/2001 | Fairbairn et al. |
| 5,970,717 A | 10/1999 | Tateyama et al. | 6,177,133 B1 | 1/2001 | Gurer et al. |
| 5,972,110 A * | 10/1999 | Akimoto ................ 118/52 | 6,179,982 B1 | 1/2001 | Ting et al. |
| 5,974,682 A | 11/1999 | Akimoto et al. | 6,183,147 B1 | 2/2001 | Kimura et al. |
| 5,976,256 A | 11/1999 | Kawano | 6,185,370 B1 | 2/2001 | Sekimoto et al. |
| 5,976,620 A | 11/1999 | Sanada et al. | 6,190,063 B1 | 2/2001 | Akimoto |

| Patent | Type | Date | Inventor |
|---|---|---|---|
| 6,191,394 | B1 | 2/2001 | Shirakawa et al. |
| 6,193,783 | B1 | 2/2001 | Sakamoto et al. |
| 6,199,568 | B1 | 3/2001 | Arai et al. |
| 6,200,633 | B1 | 3/2001 | Kitano et al. |
| 6,202,653 | B1 | 3/2001 | Harada et al. |
| 6,203,969 | B1 | 3/2001 | Ueda |
| 6,207,231 | B1 | 3/2001 | Tateyama |
| 6,210,481 | B1 | 4/2001 | Sakai et al. |
| 6,216,475 | B1 | 4/2001 | Sada et al. |
| 6,217,657 | B1 | 4/2001 | Kiba et al. |
| 6,221,787 | B1 | 4/2001 | Ogata |
| 6,222,161 | B1 | 4/2001 | Shirakawa et al. |
| 6,227,786 | B1 | 5/2001 | Tateyama |
| 6,228,171 | B1 | 5/2001 | Shirakawa et al. |
| 6,228,561 | B1 | 5/2001 | Hasebe |
| 6,229,116 | B1 | 5/2001 | Shirakawa et al. |
| 6,235,641 | B1 | 5/2001 | Christenson |
| 6,238,107 | B1 | 5/2001 | Inada |
| 6,238,109 | B1 | 5/2001 | Minami |
| 6,238,735 | B1 | 5/2001 | Mandal et al. |
| 6,238,848 | B1 | 5/2001 | Konishi et al. |
| 6,241,402 | B1 | 6/2001 | Sakamoto et al. |
| 6,241,403 | B1 | 6/2001 | Sakamoto et al. |
| 6,246,030 | B1 | 6/2001 | Matsuyama |
| 6,248,398 | B1 | 6/2001 | Talieh et al. |
| 6,251,195 | B1 | 6/2001 | Wagoner |
| 6,253,118 | B1 | 6/2001 | Koyama |
| 6,254,936 | B1 | 7/2001 | Gurer et al. |
| 6,257,778 | B1 | 7/2001 | Toshima et al. |
| 6,258,167 | B1 | 7/2001 | Kawano et al. |
| 6,260,562 | B1 | 7/2001 | Morinishi et al. |
| 6,261,007 | B1 | 7/2001 | Takamori et al. |
| 6,261,365 | B1 | 7/2001 | Matsuyama et al. |
| 6,261,744 | B1 | 7/2001 | Yoshioka |
| 6,266,125 | B1 | 7/2001 | Fukuda et al. |
| 6,267,516 | B1 | 7/2001 | Nagamine et al. |
| 6,268,013 | B1 | 7/2001 | Akimoto et al. |
| 6,273,104 | B1 | 8/2001 | Shinbara et al. |
| 6,278,089 | B1 | 8/2001 | Young et al. |
| 6,281,145 | B1 | 8/2001 | Deguchi et al. |
| 6,283,701 | B1 | 9/2001 | Sundar et al. |
| 6,284,043 | B1 | 9/2001 | Takekuma |
| 6,284,616 | B1 | 9/2001 | Smith |
| 6,287,390 | B2 | 9/2001 | Sakai et al. |
| 6,291,800 | B1 | 9/2001 | Shirakawa et al. |
| 6,292,250 | B1 | 9/2001 | Matsuyama |
| 6,293,713 | B1 | 9/2001 | Ueda |
| 6,299,938 | B1 | 10/2001 | Tateyama |
| 6,300,043 | B1 | 10/2001 | Konishi et al. |
| 6,302,960 | B1 | 10/2001 | Baroudi et al. |
| 6,306,455 | B1 | 10/2001 | Takamori et al. |
| 6,312,177 | B1 | 11/2001 | Nureki |
| 6,313,441 | B1 | 11/2001 | Schaper et al. |
| 6,313,903 | B1 | 11/2001 | Ogata |
| 6,318,948 | B1 | 11/2001 | Ueda et al. |
| 6,318,951 | B1 | 11/2001 | Schmidt et al. |
| 6,319,317 | B1 | 11/2001 | Takamori |
| 6,327,793 | B1 | 12/2001 | Gurer et al. |
| 6,332,723 | B1 | 12/2001 | Matsuyama et al. |
| 6,336,204 | B1 | 1/2002 | Jevtic |
| 6,340,643 | B2 | 1/2002 | Ueda |
| 6,348,101 | B1 | 2/2002 | Walter |
| 6,352,083 | B1 | 3/2002 | Araki et al. |
| 6,354,311 | B1 | 3/2002 | Kimura et al. |
| 6,359,264 | B1 | 3/2002 | Schaper et al. |
| 6,361,600 | B1 | 3/2002 | Tateyama et al. |
| 6,364,547 | B1 | 4/2002 | Matsuyama et al. |
| 6,368,776 | B1 | 4/2002 | Harada et al. |
| 6,371,667 | B1 | 4/2002 | Kitano et al. |
| 6,371,713 | B1 | 4/2002 | Nishimura et al. |
| 6,379,056 | B1 | 4/2002 | Ueda et al. |
| 6,380,518 | B2 | 4/2002 | Shirakawa et al. |
| 6,382,849 | B1 | 5/2002 | Sakamoto et al. |
| 6,383,948 | B1 | 5/2002 | Kitano et al. |
| 6,384,894 | B2 | 5/2002 | Matsuyama et al. |
| 6,391,111 | B1 | 5/2002 | Fujimoto et al. |
| 6,398,429 | B1 | 6/2002 | Toshima et al. |
| 6,401,353 | B2 | 6/2002 | Kimura |
| 6,402,399 | B2 | 6/2002 | Sakamoto et al. |
| 6,402,400 | B1 | 6/2002 | Ueda et al. |
| 6,402,508 | B2 | 6/2002 | Harada et al. |
| 6,402,509 | B1 | 6/2002 | Ookura et al. |
| 6,402,844 | B1 | 6/2002 | Harada et al. |
| 6,403,924 | B1 | 6/2002 | Hayashi |
| 6,410,194 | B1 | 6/2002 | Yoshihara |
| 6,416,583 | B1 | 7/2002 | Kitano et al. |
| 6,418,356 | B1 | 7/2002 | Oh |
| 6,419,408 | B1 | 7/2002 | Inada |
| 6,431,769 | B1 | 8/2002 | Fukuda et al. |
| 6,432,199 | B1 | 8/2002 | Takekuma |
| 6,438,449 | B2 | 8/2002 | Kawamatsu et al. |
| 6,440,218 | B1 | 8/2002 | Sanada et al. |
| 6,443,641 | B2 | 9/2002 | Takamori et al. |
| 6,444,029 | B1 | 9/2002 | Kimura et al. |
| 6,446,646 | B1 | 9/2002 | Izumi |
| 6,447,608 | B1 | 9/2002 | Sakai et al. |
| 6,450,803 | B2 | 9/2002 | Shirakawa et al. |
| 6,450,805 | B1 | 9/2002 | Oda et al. |
| 6,451,515 | B2 | 9/2002 | Takamori et al. |
| 6,454,332 | B1 | 9/2002 | Govzman et al. |
| 6,458,208 | B1 | 10/2002 | Anai et al. |
| 6,461,438 | B1 | 10/2002 | Ookura et al. |
| 6,464,789 | B1 | 10/2002 | Akimoto et al. |
| 6,465,765 | B2 | 10/2002 | Katayama et al. |
| 6,468,586 | B1 | 10/2002 | Gurer et al. |
| 6,471,421 | B2 | 10/2002 | Kitamura |
| 6,471,422 | B1 | 10/2002 | Ueda et al. |
| 6,474,986 | B2 | 11/2002 | Oda et al. |
| 6,475,279 | B1 | 11/2002 | Akimoto et al. |
| 6,485,782 | B2 | 11/2002 | Takamori |
| 6,485,893 | B1 | 11/2002 | Matsuyama |
| 6,491,452 | B2 | 12/2002 | Konishi et al. |
| 6,491,491 | B1 | 12/2002 | Tsuneda et al. |
| 6,496,245 | B2 | 12/2002 | Kosugi et al. |
| 6,501,191 | B2 | 12/2002 | Tanaka et al. |
| 6,503,003 | B2 | 1/2003 | Hasebe et al. |
| 6,507,770 | B2 | 1/2003 | Tateyama et al. |
| 6,511,315 | B2 | 1/2003 | Hashimoto |
| 6,514,073 | B1 | 2/2003 | Toshima et al. |
| 6,514,343 | B1 | 2/2003 | Motoda et al. |
| 6,514,344 | B2 | 2/2003 | Kitano et al. |
| 6,514,570 | B1 | 2/2003 | Matsuyama et al. |
| 6,518,199 | B2 | 2/2003 | Kitano et al. |
| 6,526,329 | B2 | 2/2003 | Tateyama et al. |
| 6,527,860 | B1 | 3/2003 | Yoshihara et al. |
| 6,527,861 | B2 | 3/2003 | Takekuma |
| 6,533,531 | B1 | 3/2003 | Nguyen et al. |
| 6,533,864 | B1 | 3/2003 | Matsuyama et al. |
| 6,534,750 | B1 | 3/2003 | Tanoue et al. |
| 6,536,964 | B1 | 3/2003 | Kitano et al. |
| 6,537,373 | B1 | 3/2003 | Kitano et al. |
| 6,539,956 | B1 | 4/2003 | Wolke et al. |
| 6,541,170 | B2 | 4/2003 | Fukuda et al. |
| 6,541,376 | B2 | 4/2003 | Inada et al. |
| 6,550,988 | B2 | 4/2003 | Sugimoto et al. |
| 6,551,400 | B2 | 4/2003 | Hasebe et al. |
| 6,551,448 | B2 | 4/2003 | Kuga et al. |
| 6,556,893 | B2 | 4/2003 | Kumar et al. |
| 6,558,053 | B2 | 5/2003 | Shigemori et al. |
| 6,568,847 | B2 | 5/2003 | Nishijima et al. |
| 6,571,147 | B1 | 5/2003 | Kashihara |
| 6,573,031 | B2 | 6/2003 | Shinya et al. |
| 6,578,772 | B2 | 6/2003 | Fujimoto et al. |
| 6,579,370 | B2 | 6/2003 | Kimura et al. |
| 6,579,733 | B1 | 6/2003 | Rangarajan et al. |
| 6,589,339 | B2 | 7/2003 | Takeshita et al. |

| | | |
|---|---|---|
| 6,598,805 B2 | 7/2003 | Hirae et al. |
| 6,599,366 B1 | 7/2003 | Kitano et al. |
| 6,602,382 B1 | 8/2003 | Matsuyama et al. |
| 6,605,153 B2 | 8/2003 | Kitano et al. |
| 6,616,394 B1 | 9/2003 | Park |
| 6,616,760 B2 | 9/2003 | Kitano et al. |
| 6,616,762 B2 | 9/2003 | Inada et al. |
| 6,617,095 B2 | 9/2003 | Kitano et al. |
| 6,620,244 B2 | 9/2003 | Yoshihara |
| 6,620,245 B2 | 9/2003 | Ishida et al. |
| 6,620,251 B2 | 9/2003 | Kitano et al. |
| 6,627,263 B2 | 9/2003 | Kitano et al. |
| 6,633,022 B2 | 10/2003 | Kitano et al. |
| 6,634,806 B2 | 10/2003 | Toshima et al. |
| 6,635,113 B2 | 10/2003 | Takamori et al. |
| 6,644,965 B2 | 11/2003 | Ookura et al. |
| 6,645,880 B1 | 11/2003 | Shigemori et al. |
| 6,654,668 B1 | 11/2003 | Harada et al. |
| 6,656,277 B2 | 12/2003 | Sanada et al. |
| 6,656,281 B1 | 12/2003 | Ueda et al. |
| 6,659,661 B2 | 12/2003 | Deguchi et al. |
| 6,662,466 B2 | 12/2003 | Gurer et al. |
| 6,669,782 B1 | 12/2003 | Thakur |
| 6,669,808 B2 | 12/2003 | Adachi et al. |
| 6,672,779 B2 | 1/2004 | Ueda et al. |
| 6,672,820 B1 * | 1/2004 | Hanson et al. ......... 414/222.06 |
| 6,673,151 B2 | 1/2004 | Yoshihara et al. |
| 6,676,757 B2 | 1/2004 | Kitano et al. |
| 6,678,572 B1 | 1/2004 | Oh |
| 6,683,006 B2 | 1/2004 | Konishi et al. |
| 6,686,571 B2 | 2/2004 | Ookura et al. |
| 6,691,430 B2 | 2/2004 | Saito et al. |
| 6,692,165 B2 | 2/2004 | Tanaka et al. |
| 6,694,218 B2 | 2/2004 | Oh |
| 6,694,224 B2 | 2/2004 | Ramanan |
| 6,695,922 B2 | 2/2004 | Kitano et al. |
| 6,703,316 B2 | 3/2004 | Inoue et al. |
| 6,706,321 B2 | 3/2004 | Nishiya et al. |
| 6,709,174 B2 | 3/2004 | Yamamoto et al. |
| 6,709,523 B1 | 3/2004 | Toshima et al. |
| 6,712,579 B2 | 3/2004 | Fujii et al. |
| 6,713,120 B2 | 3/2004 | Fukuda et al. |
| 6,713,239 B2 | 3/2004 | Toshima et al. |
| 6,715,943 B2 | 4/2004 | Nagamine |
| 6,716,478 B2 | 4/2004 | Kitano et al. |
| 6,726,771 B2 | 4/2004 | Ueda |
| 6,730,599 B2 | 5/2004 | Inada et al. |
| 6,736,556 B2 | 5/2004 | Kanagawa et al. |
| 6,744,020 B2 | 6/2004 | Shirakawa et al. |
| 6,749,351 B2 | 6/2004 | Sanada et al. |
| 6,749,688 B2 | 6/2004 | Tateyama et al. |
| 6,752,543 B2 | 6/2004 | Fukutomi et al. |
| 6,752,544 B2 | 6/2004 | Sanada et al. |
| 6,752,585 B2 | 6/2004 | Reimer et al. |
| 6,752,872 B2 | 6/2004 | Inada et al. |
| 6,753,508 B2 | 6/2004 | Shirakawa |
| 6,761,125 B2 | 7/2004 | Kitano et al. |
| 6,768,930 B2 | 7/2004 | Oh |
| 6,770,424 B2 | 8/2004 | Mandal et al. |
| 6,773,510 B2 | 8/2004 | Kitano et al. |
| 6,775,456 B2 | 8/2004 | Matsuura |
| 6,780,461 B2 | 8/2004 | Gurer et al. |
| 6,780,795 B2 | 8/2004 | Suzuki et al. |
| 6,790,283 B2 | 9/2004 | Hayashi et al. |
| 6,790,286 B2 | 9/2004 | Nishimura et al. |
| 6,790,287 B2 | 9/2004 | Shiga et al. |
| 6,790,291 B2 | 9/2004 | Kimura |
| 6,793,769 B2 | 9/2004 | Kajino et al. |
| 6,796,054 B2 | 9/2004 | Minami et al. |
| 6,805,769 B2 | 10/2004 | Okuda et al. |
| 6,807,452 B2 | 10/2004 | Mukuta et al. |
| 6,807,455 B2 | 10/2004 | Yoshida et al. |
| 6,808,566 B2 | 10/2004 | Kitano et al. |
| 6,809,036 B2 | 10/2004 | Liu |
| 6,811,613 B2 | 11/2004 | Kitano et al. |
| 6,811,962 B2 | 11/2004 | Yoshihara et al. |
| 6,814,507 B2 | 11/2004 | Inagaki |
| 6,814,809 B2 | 11/2004 | Matsushita et al. |
| 6,815,647 B2 | 11/2004 | Tanoue et al. |
| 6,817,790 B2 | 11/2004 | Toshima et al. |
| 6,821,550 B2 | 11/2004 | Deguchi et al. |
| 6,822,413 B2 | 11/2004 | Simondet et al. |
| 6,823,880 B2 | 11/2004 | Sakashita et al. |
| 6,824,616 B2 | 11/2004 | Kitano et al. |
| 6,826,214 B2 | 11/2004 | Nomoto |
| 6,827,782 B2 | 12/2004 | Goto et al. |
| 6,830,774 B2 | 12/2004 | Hayashi et al. |
| 6,832,863 B2 | 12/2004 | Sugimoto et al. |
| 6,834,210 B2 | 12/2004 | Tateyama et al. |
| 6,837,631 B2 | 1/2005 | Nakano et al. |
| 6,837,632 B2 | 1/2005 | Koyama et al. |
| 6,841,031 B2 | 1/2005 | Iwata et al. |
| 6,841,342 B2 | 1/2005 | Nishi et al. |
| 6,843,259 B2 | 1/2005 | Nagamine |
| 6,846,149 B2 | 1/2005 | Savage et al. |
| 6,848,625 B2 | 2/2005 | Takekuma et al. |
| 6,851,872 B1 | 2/2005 | Okubo et al. |
| 6,852,194 B2 * | 2/2005 | Matsushita et al. ..... 156/345.32 |
| 6,860,945 B2 | 3/2005 | Kobayashi et al. |
| 6,868,888 B2 | 3/2005 | Adachi |
| 6,869,234 B2 | 3/2005 | Sanada et al. |
| 6,869,640 B2 | 3/2005 | Yoshihara et al. |
| 6,872,256 B2 | 3/2005 | Kitano et al. |
| 6,874,513 B2 | 4/2005 | Yamagata et al. |
| 6,878,216 B2 | 4/2005 | Fujishima |
| 6,878,303 B2 | 4/2005 | Okamoto |
| 6,878,401 B2 | 4/2005 | Nishijima et al. |
| 6,878,501 B2 | 4/2005 | Hatakeyama et al. |
| 6,884,294 B2 | 4/2005 | Minami et al. |
| 6,885,467 B2 | 4/2005 | Du-Nour et al. |
| 6,889,105 B2 | 5/2005 | Mukuta et al. |
| 6,893,171 B2 | 5/2005 | Fukutomi et al. |
| 6,893,513 B2 | 5/2005 | Michaluk et al. |
| 6,893,805 B2 | 5/2005 | Iseki et al. |
| 6,896,466 B2 | 5/2005 | Nishimura et al. |
| 7,270,510 B2 * | 9/2007 | Putzi ..................... 414/226.05 |
| 7,279,067 B2 | 10/2007 | Yoshida et al. |
| 2001/0024691 A1 | 9/2001 | Kimura et al. |
| 2002/0098072 A1 | 7/2002 | Sundar |
| 2003/0044261 A1 | 3/2003 | Bonora et al. |
| 2003/0052497 A1 | 3/2003 | Holbrooks |
| 2004/0020601 A1 | 2/2004 | Zhao et al. |
| 2004/0091349 A1 | 5/2004 | Tabrizie et al. |
| 2005/0095088 A1 | 5/2005 | Kurita et al. |
| 2006/0165408 A1 | 7/2006 | Akimoto et al. |

FOREIGN PATENT DOCUMENTS

| | | |
|---|---|---|
| EP | 1 114 882 A | 7/2001 |
| JP | 51004311 | 1/1976 |
| JP | 07235473 | 9/1995 |
| JP | 10006757 | 1/1998 |
| JP | 11279797 | 10/1999 |
| TW | 501169 | 9/2002 |
| TW | 516072 | 1/2003 |
| WO | WO 00/12958 | 3/2000 |

OTHER PUBLICATIONS

First Office Action for Chinese Patent Application No. 200680013355.8 dated Apr. 24, 2009.

First Office Action dated Aug. 24, 2009, in Korean Patent Application No. 10-2007-7025316.

USPTO Office Action dated Feb. 3, 2009, in U.S. Appl. No. 11/315,778.

Response to Office Action filed Jun. 3, 2009, in U.S. Appl. No. 11/315,778.

USPTO Final Office Action dated Aug. 5, 2009, in U.S. Appl. No. 11/315,778.
USPTO Office Action dated Jul. 22, 2009, in U.S. Appl. No. 11/458,664.
Response to Office Action filed Oct. 14, 2008, in U.S. Appl. No. 11/458,664.
USPTO Final Office Action dated Jan. 27, 2009, in U.S. Appl. No. 11/458,664.
Response to Final Office Action filed Mar. 31, 2009, in U.S. Appl. No. 11/458,664.
USPTO Office Action dated Jun. 23, 2009, in U.S. Appl. No. 11/458,664.
Reaponse to Office Action filed Aug. 27, 2009, in U.S. Appl. No. 11/553,820.
USPTO Office Action dated May 15, 2008, in U.S. Appl. No. 11/315,984.
Response to Office Action filed Jul. 10, 2008, in U.S. Appl. No. 11/315,984.
USPTO Final Office Action dated Jul. 6, 2009, in U.S. Appl. No. 11/315,984.
Official Letter dated Apr. 21, 2010 and Search Report for Taiwan Patent Application No. 95114022.

* cited by examiner

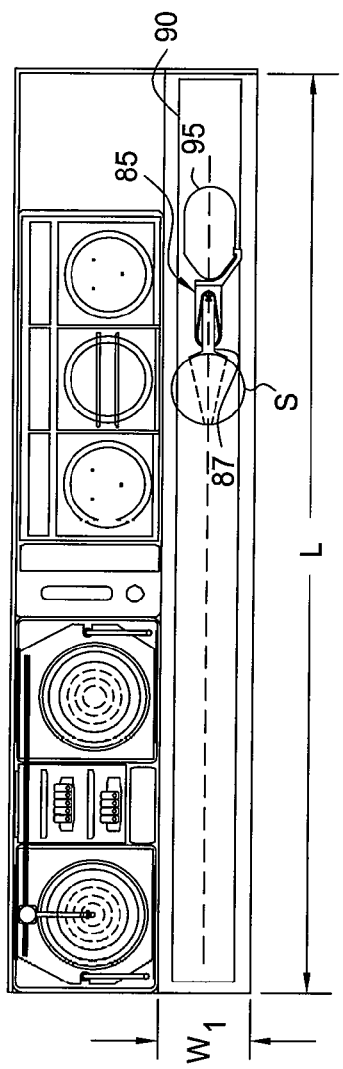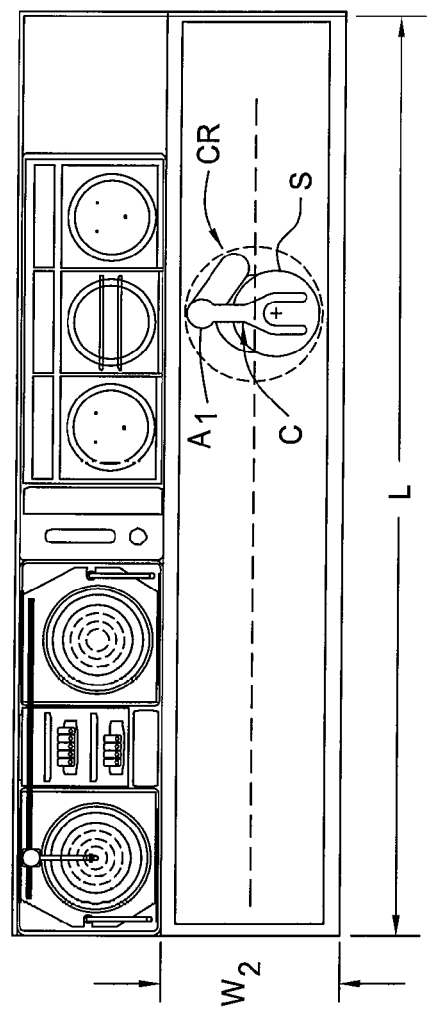
FIG. 11J
FIG. 11K

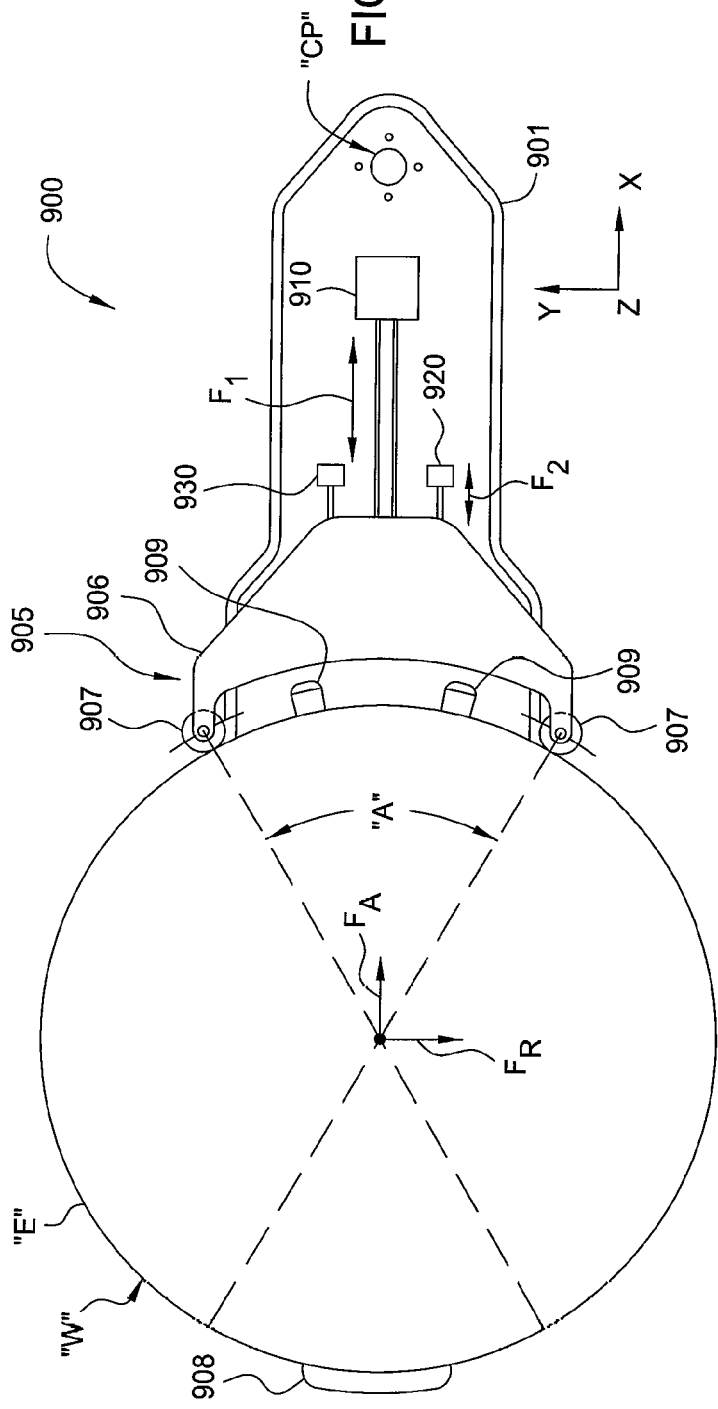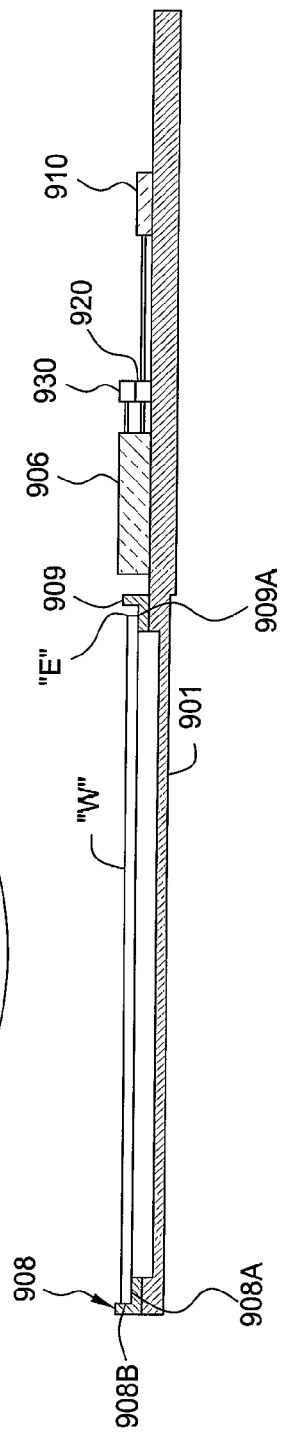

SUBSTRATE PROCESSING SEQUENCE IN A CARTESIAN ROBOT CLUSTER TOOL

CROSS-REFERENCE TO RELATED APPLICATIONS

This application is a continuation of the U.S. patent application Ser. No. 11/315,984, filed Dec. 22, 2005 now U. S. Pat. No. 7,651,306, which is herein incorporated by reference.

This application is also related to U.S. patent application Ser. No. 11/458,667, filed Aug. 19, 2006, U.S. patent application Ser. No. 11/112,281, filed Apr. 22, 2005, U.S. patent application Ser. No. 11/112,932, filed Apr. 22, 2005, U.S. Provisional Patent Application Ser. No. 60/673,848, filed Apr. 22, 2005, and U.S. Provisional Patent Application Ser. No. 60/639,109, filed Dec. 22, 2004.

BACKGROUND OF THE INVENTION

1. Field of the Invention

Embodiments of the invention generally relate to an integrated processing system containing multiple processing stations and robots that are capable of processing multiple substrates in parallel.

2. Description of the Related Art

The process of forming electronic devices is commonly done in a multi-chamber processing system (e.g., a cluster tool) that has the capability to sequentially process substrates, (e.g., semiconductor wafers) in a controlled processing environment. Typical cluster tools used to deposit (i.e., coat) and develop a photoresist material, commonly known as a track lithography tool, or used to perform semiconductor cleaning processes, commonly described as a wet/clean tool, will include a mainframe that houses at least one substrate transfer robot which transports substrates between a pod/cassette mounting device and multiple processing chambers that are connected to the mainframe. Cluster tools are often used so that substrates can be processed in a repeatable way in a controlled processing environment. A controlled processing environment has many benefits which include minimizing contamination of the substrate surfaces during transfer and during completion of the various substrate processing steps. Processing in a controlled environment thus reduces the number of generated defects and improves device yield.

The effectiveness of a substrate fabrication process is often measured by two related and important factors, which are device yield and the cost of ownership (CoO). These factors are important since they directly affect the cost to produce an electronic device and thus a device manufacturer's competitiveness in the market place. The CoO, while affected by a number of factors, is greatly affected by the system and chamber throughput, or simply the number of substrates per hour processed using a desired processing sequence. A process sequence is generally defined as the sequence of device fabrication steps, or process recipe steps, completed in one or more processing chambers in the cluster tool. A process sequence may generally contain various substrate (or wafer) electronic device fabrication processing steps. In an effort to reduce CoO, electronic device manufacturers often spend a large amount of time trying to optimize the process sequence and chamber processing time to achieve the greatest substrate throughput possible given the cluster tool architecture limitations and the chamber processing times. In track lithography type cluster tools, since the chamber processing times tend to be rather short, (e.g., about a minute to complete the process) and the number of processing steps required to complete a typical process sequence is large, a significant portion of the time it takes to complete the processing sequence is taken up transferring the substrates between the various processing chambers. A typical track lithography process sequence will generally include the following steps: depositing one or more uniform photoresist (or resist) layers on the surface of a substrate, then transferring the substrate out of the cluster tool to a separate stepper or scanner tool to pattern the substrate surface by exposing the photoresist layer to a photoresist modifying electromagnetic radiation, and then developing the patterned photoresist layer. If the substrate throughput in a cluster tool is not robot limited, the longest process recipe step will generally limit the throughput of the processing sequence. This is usually not the case in track lithography process sequences, due to the short processing times and large number of processing steps. Typical system throughput for the conventional fabrication processes, such as a track lithography tool running a typical process, will generally be between 100-120 substrates per hour.

Other important factors in the CoO calculation are the system reliability and system uptime. These factors are very important to a cluster tool's profitability and/or usefulness, since the longer the system is unable to process substrates the more money is lost by the user due to the lost opportunity to process substrates in the cluster tool. Therefore, cluster tool users and manufacturers spend a large amount of time trying to develop reliable processes, reliable hardware and reliable systems that have increased uptime.

The push in the industry to shrink the size of semiconductor devices to improve device processing speed and reduce the generation of heat by the device, has reduced the industry's tolerance for process variability. To minimize process variability an important factor in the track lithography processing sequences is the issue of assuring that every substrate run through a cluster tool has the same "wafer history." A substrate's wafer history is generally monitored and controlled by process engineers to assure that all of the device fabrication processing variables that may later affect a device's performance are controlled, so that all substrates in the same batch are always processed the same way. To assure that each substrate has the same "wafer history" requires that each substrate experiences the same repeatable substrate processing steps (e.g., consistent coating process, consistent hard bake process, consistent chill process, etc.) and the timing between the various processing steps is the same for each substrate. Lithography type device fabrication processes can be especially sensitive to variations in process recipe variables and the timing between the recipe steps, which directly affects process variability and ultimately device performance. Therefore, a cluster tool and supporting apparatus capable of performing a process sequence that minimizes process variability and the variability in the timing between process steps is needed. Also, a cluster tool and supporting apparatus that is capable of performing a device fabrication process that delivers a uniform and repeatable process result, while achieving a desired substrate throughput is also needed.

Therefore, there is a need for a system, a method and an apparatus that can process a substrate so that it can meet the required device performance goals and increase the system throughput and thus reduce the process sequence CoO.

SUMMARY OF THE INVENTION

The present invention generally provide a method of transferring a substrate in a cluster tool, comprising: transferring a substrate to a first array of processing chambers positioned along a first direction using a first robot assembly which is adapted to position the substrate at a desired position in the first direction and at a desired position in a second direction, wherein the second direction is generally orthogonal to the first direction, transferring a substrate to a second array of processing chambers positioned along the first direction using a second robot assembly which is adapted to position the substrate at a desired position in the first direction and at a desired position in the second direction, and transferring a substrate to the first and second array of processing chambers positioned along the first direction using a third robot assembly which is adapted to position the substrate at a desired position in the first direction and at a desired position in the second direction.

Embodiments of the invention further provide a method of transferring a substrate in a cluster tool, comprising: transferring a substrate from a first passthru chamber to a first array of processing chambers positioned along a first direction using a first robot assembly which is adapted to position the substrate at a desired position in the first direction and at a desired position in a second direction, wherein the second direction is generally orthogonal to the first direction, transferring a substrate from the first passthru chamber to the first array of processing chambers using a second robot assembly which is adapted to position the substrate at a desired position in the first direction and at a desired position in a second direction, and transferring a substrate from a substrate cassette to the first passthru chamber using a front end robot that is positioned in a front end assembly, wherein the front end assembly is substantially adjacent to a transferring region that contains the first array of processing chambers, the first robot assembly and the second robot assembly.

Embodiments of the invention further provide a method of transferring a substrate in a cluster tool, comprising: positioning a first robot assembly having a first robot and a second robot near a first processing chamber contained in a first array of processing chambers which are positioned along a first direction, removing a first substrate from the first processing chamber using the first robot, transferring a second substrate to the first processing chamber using the second robot, positioning a second robot assembly having a third robot and a fourth robot near the first processing chamber, removing the second substrate from the first processing chamber using the third robot, transferring a third substrate to the first processing chamber using the fourth robot, positioning the first robot assembly near a second processing chamber contained in the first array of processing chambers, removing fourth substrate from the second processing chamber using the second robot, and transferring a first substrate to the second processing chamber using the first robot.

Embodiments of the invention further provide a method of transferring a substrate in a cluster tool, comprising: positioning a substrate outside a processing chamber using a first robot assembly that has a first actuator that can position the substrate in a first direction, a second actuator that can position the substrate in a second direction and a third actuator in positional communication with a robot blade that is adapted to position the substrate in the first direction and a third direction, wherein the first and third directions are both generally orthogonal to the second direction, transferring the substrate positioned on a robot blade attached to the first robot assembly to a substrate receiving surface inside the processing chamber by generally simultaneously adjusting the position of the substrate along the first direction using the first actuator and the position of the substrate in the third direction and the first direction using the third actuator, removing a substrate from the processing chamber using a second robot assembly that has an first actuator that can position the substrate in a first direction, a second actuator that can position the substrate in a second direction and a third actuator in positional communication with a robot blade that is adapted to position the substrate in the first direction and a third direction, wherein the first and third directions are both generally orthogonal to the second direction, transferring the substrate positioned on a robot blade attached to the second robot assembly to a substrate receiving surface inside a second processing chamber by generally simultaneously adjusting the position of the substrate along the first direction using the first actuator, the second direction using the second actuator and/or the position of the substrate in the third direction and/or the first direction using the third actuator, and removing a substrate from the second processing chamber using a third robot assembly that has an first actuator that can position the substrate in a first direction, a second actuator that can position the substrate in a second direction and a third actuator in positional communication with a robot blade that is adapted to position the substrate in the first direction and a third direction, wherein the first and third directions are both generally orthogonal to the second direction.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 11J is a plan view of one embodiment of robot assembly according to the present invention;

FIG. 11K is a plan view of a conventional SCARA robot of robot assembly positioned near a processing rack;

FIG. 16A is a plan view illustrating one embodiment of a robot blade assembly that may be adapted to transfer substrates in various embodiments of the cluster tool;

FIG. 16B is an side cross-section view illustrating one embodiment of the robot blade assembly shown in FIG. 16A that may be adapted to transfer substrates in various embodiments of the cluster tool;

DETAILED DESCRIPTION

Figure 1A:
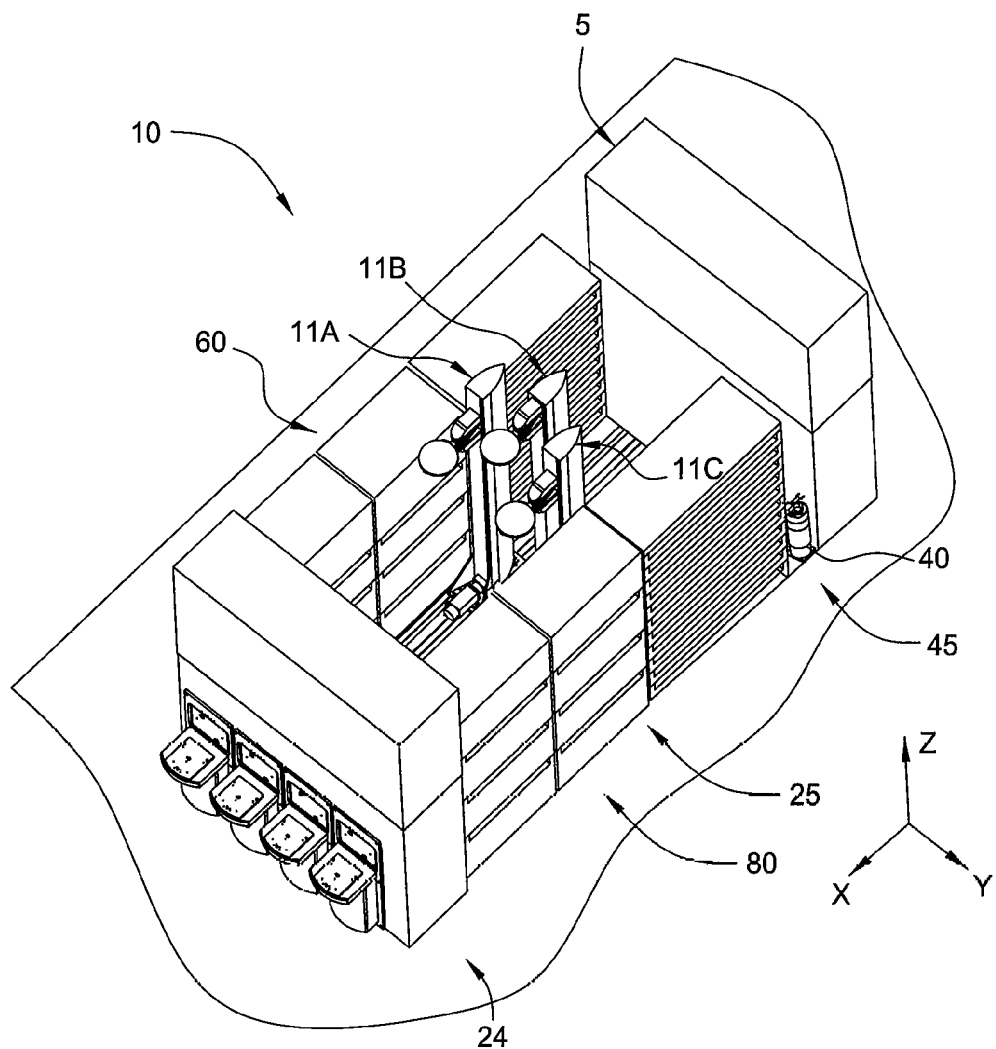
FIG. 1A is an isometric view illustrating one embodiment of a cluster tool of the invention.

The present invention generally provides an apparatus and method for processing substrates using a multi-chamber processing system (e.g., a cluster tool) that has an increased system throughput, increased system reliability, improved device yield performance, a more repeatable wafer processing history (or wafer history), and a reduced footprint. In one embodiment, the cluster tool is adapted to perform a track lithography process in which a substrate is coated with a photosensitive material, is then transferred to a stepper/scanner, which exposes the photosensitive material to some form of radiation to form a pattern in the photosensitive material, and then certain portions of the photosensitive material are removed in a developing process completed in the cluster tool. In another embodiment, the cluster tool is adapted to perform a wet/clean process sequence in which various substrate cleaning processes are performed on a substrate in the cluster tool.

FIGS. 1-6 illustrate some of the various robot and process chamber configurations that may be used in conjunction with various embodiments of this invention. The various embodiments of the cluster tool 10 generally utilize two or more robots that are configured in a parallel processing configuration to transfer substrates between the various processing chambers retained in the processing racks (e.g., elements 60, 80, etc.) so that a desired processing sequence can be performed on the substrates. In one embodiment, the parallel processing configuration contains two or more robot assemblies 11 (elements 11A, 11B and 11C in FIGS. 1A and 1B) that are adapted to move a substrate in a vertical (hereafter the z-direction) and horizontal directions, i.e., transfer direction (x-direction) and a direction orthogonal to the transfer direction (y-direction), so that the substrates can be processed in various processing chambers retained in the processing racks (e.g., elements 60 and 80) which are aligned along the transfer direction. One advantage of the parallel processing configuration is that if one of the robots becomes inoperable, or is taken down for servicing, the system can still continue to process substrates using the other robots retained in the system. Generally, the various embodiments described herein are advantageous since each row or group of substrate processing chambers are serviced by two or more robots to allow for increased throughput and increased system reliability. Also, the various embodiments described herein are generally configured to minimize and control the particles generated by the substrate transferring mechanisms, to prevent device yield and substrate scrap problems that can affect the CoO of the cluster tool. Another advantage of this configuration is the flexible and modular architecture allows the user to configure the number of processing chambers, processing racks, and processing robots required to meet the throughput needs of the user. While FIGS. 1-6 illustrate one embodiment of a robot assembly 11 that can be used to carryout various aspects of the invention, other types of robot assemblies 11 may be adapted to perform the same substrate transferring and positioning function(s) without varying from the basic scope of the invention.

First Cluster Tool Configuration

A. System Configuration

FIG. 1A is an isometric view of one embodiment of a cluster tool 10 that illustrates a number of the aspects of the present invention that may be used to advantage. FIG. 1A illustrates an embodiment of the cluster tool 10 which contains three robots that are adapted to access the various process chambers that are stacked vertically in a first processing rack 60 and a second processing rack 80 and an external module 5. In one aspect, when the cluster tool 10 is used to complete a photolithography processing sequence the external module 5, may be a stepper/scanner tool, that is attached to the rear region 45 (not shown in FIG. 1A) to perform some additional exposure type processing step(s). One embodiment of the cluster tool 10, as illustrated in FIG. 1A, contains a front end module 24 and a central module 25.

Figure 1B:
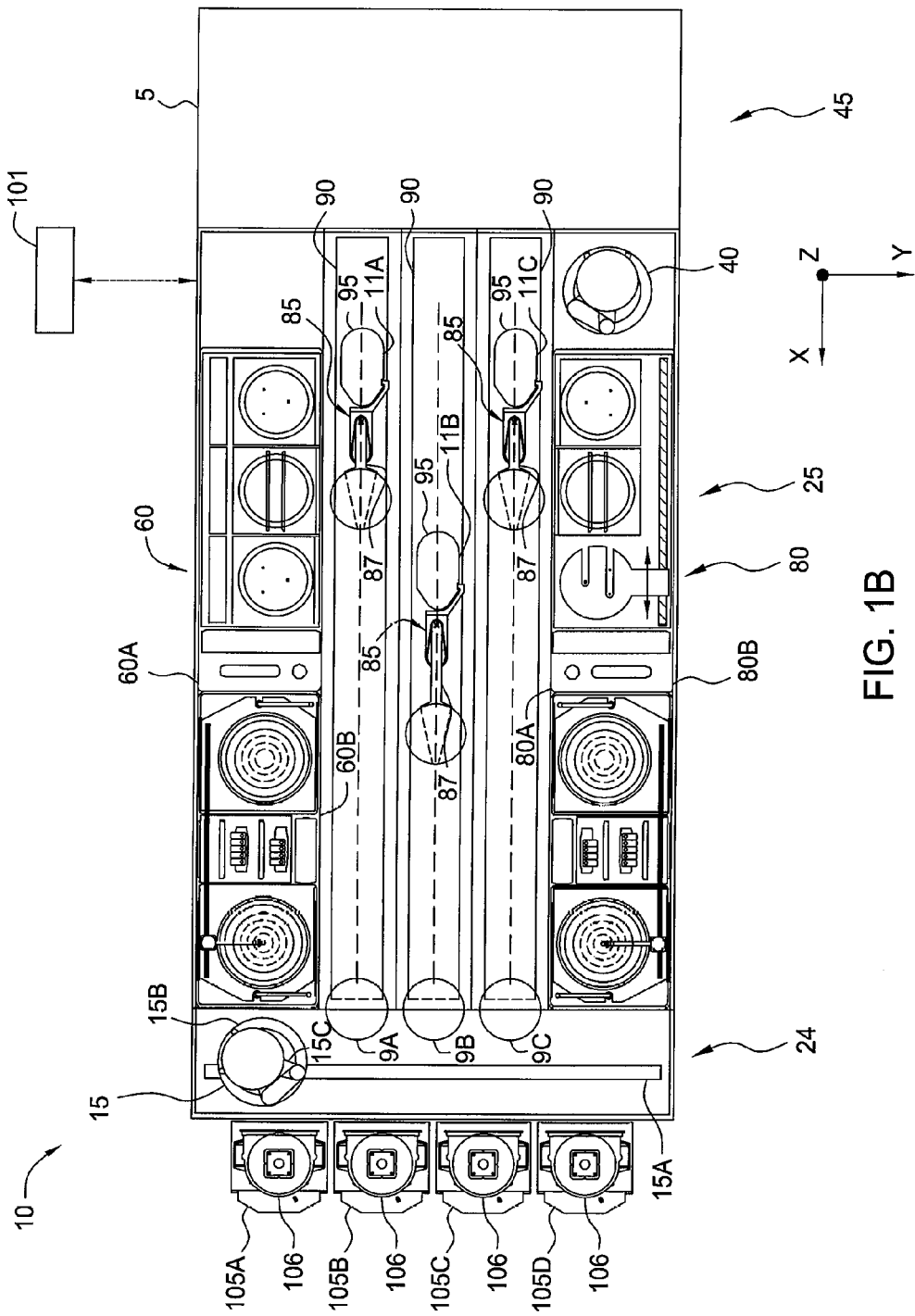
FIG. 1B is a plan view of the processing system illustrated in FIG. 1A, according to the present invention.

FIG. 1B is a plan view of the embodiment of the cluster tool 10 shown in FIG. 1A. The front end module 24 generally contains one or more pod assemblies 105 (e.g., items 105A-D) and a front end robot assembly 15 (FIG. 1B). The one or more pod assemblies 105, or front-end opening unified pods (FOUPs), are generally adapted to accept one or more cassettes 106 that may contain one or more substrates "W", or wafers, that are to be processed in the cluster tool 10. In one aspect, the front end module 24 also contains one or more pass-through positions 9 (e.g., elements 9A-C FIG. 1B).

In one aspect, the central module 25 has a first robot assembly 11A, a second robot assembly 11B, a third robot assembly 11C, a rear robot assembly 40, a first processing rack 60 and a second processing rack 80. The first processing rack 60 and a second processing rack 80 contain various processing chambers (e.g., coater/developer chamber, bake chamber, chill chamber, wet clean chambers, etc. which are discussed below (FIGS. 1C-D) that are adapted to perform the various processing steps found in a substrate processing sequence.

Figure 1C:
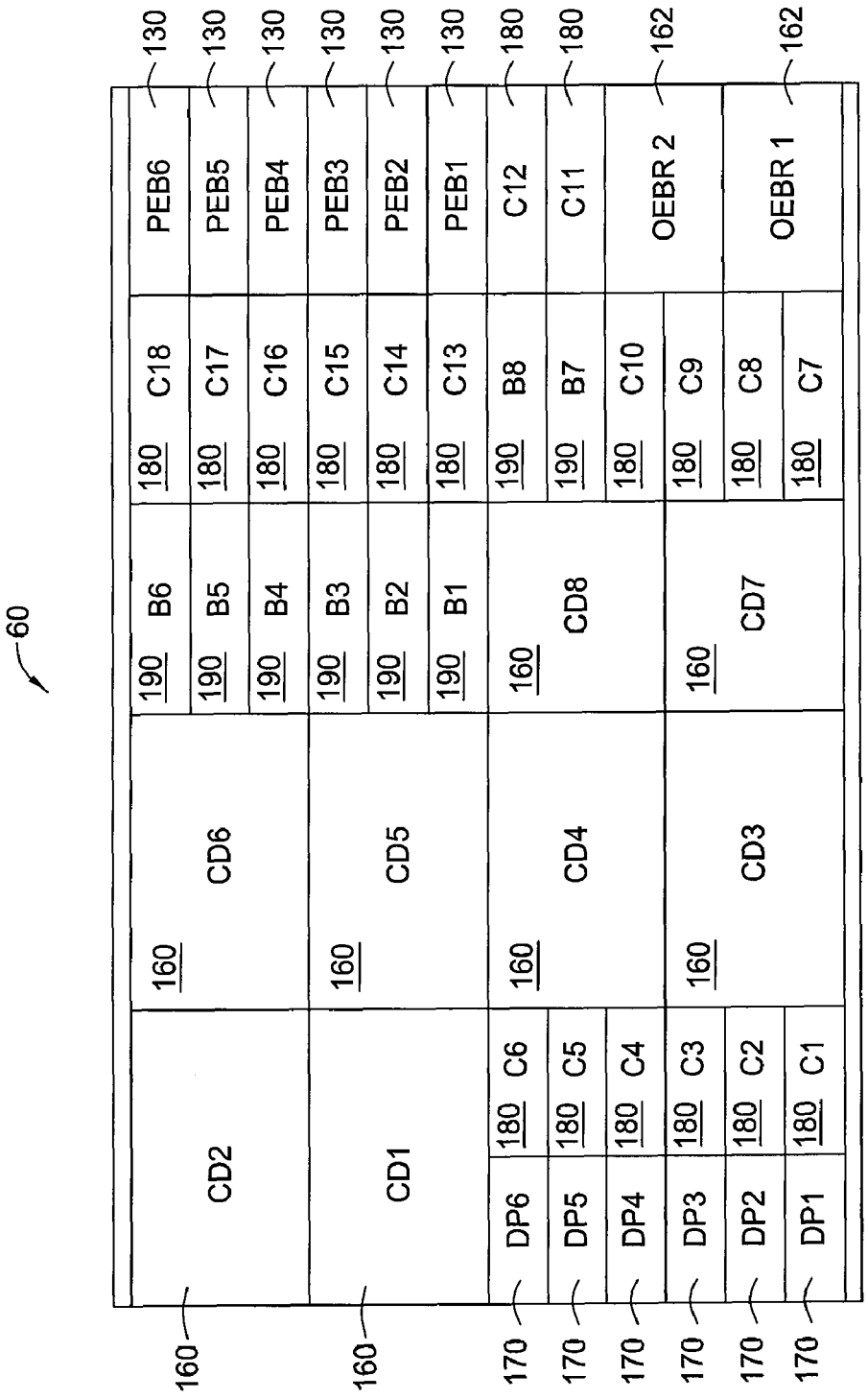
FIG. 1C is a side view that illustrates one embodiment of the first processing rack 60 according to the present invention.
Figure 1D:
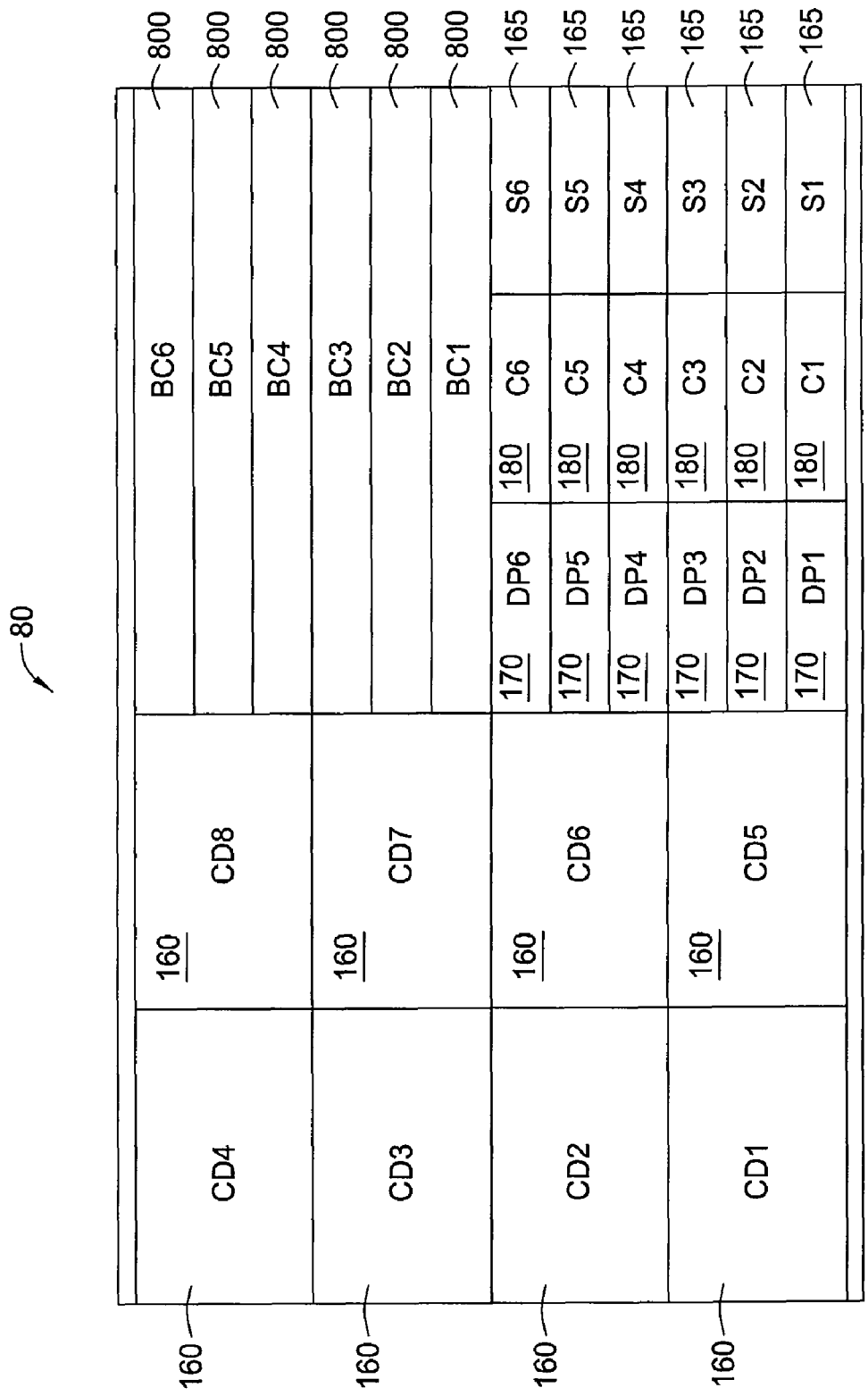
FIG. 1D is a side view that illustrates one embodiment of the second processing rack 80 according to the present invention.

FIGS. 1C and 1D illustrate side views of one embodiment of the first processing rack 60 and second processing rack 80 as viewed when facing the first processing rack 60 and second processing racks 80 while standing on the side closest to side 60A, and thus will coincide with the views shown in FIGS. 1-6. The first processing rack 60 and second processing rack 80 generally contain one or more groups of vertically stacked processing chambers that are adapted to perform some desired semiconductor or flat panel display device fabrication processing steps on a substrate. For example, in FIG. 1C the first process rack 60 has five groups, or columns, of vertically stacked processing chambers. In general these device fabrication processing steps may include depositing a material on a surface of the substrate, cleaning a surface of the substrate, etching a surface of the substrate, or exposing the substrate to some form of radiation to cause a physical or chemical change to one or more regions on the substrate. In one embodiment, the first processing rack 60 and second processing rack 80 have one or more processing chambers contained in them that can be adapted to perform one or more photolithography processing sequence steps. In one aspect, processing racks 60 and 80 may contain one or more coater/developer chambers 160, one or more chill chambers 180, one or more bake chambers 190, one or more optical edge bead removal (OEBR) chambers 162, one or more post exposure bake (PEB) chambers 130, one or more support chambers 165, an integrated bake/chill chamber 800, and/or one or more hexamethyldisilazane (HMDS) processing chambers 170. Exemplary coater/developer chambers, chill chambers, bake chambers, OEBR chambers, PEB chambers, support chambers, integrated bake/chill chambers and/or HMDS processing chambers that may be adapted to benefit one or more aspects of the invention are further described in the commonly assigned U.S. patent application Ser. No. 11/112,281, filed Apr. 22, 2005, which is hereby incorporated by reference in its entirety to the extent not inconsistent with the claimed invention. Examples of an integrated bake/chill chamber that may be adapted to benefit one or more aspects of the invention are further described in the commonly assigned U.S. patent application Ser. No. 11/111,154, filed Apr. 11, 2005 and U.S. patent application Ser. No. 11/111,353, filed Apr. 11, 2005, which are hereby incorporated by reference in its entirety to the extent not inconsistent with the claimed invention. Examples of a processing chambers and or systems that may be adapted to perform one or more cleaning processes on a substrate and may be adapted to benefit one or more aspects of the invention is further described in the commonly assigned U.S. patent application Ser. No. 09/891,849, filed Jun. 25, 2001 and U.S. patent application Ser. No. 09/945,454, filed Aug. 31, 2001 and, which are hereby incorporated by reference in its entirety to the extent not inconsistent with the claimed invention.

In one embodiment, as shown in FIG. 1C, where the cluster tool 10 is adapted to perform a photolithography type process, the first processing rack 60 may have eight coater/developer chambers 160 (labeled CD1-8), eighteen chill chambers 180 (labeled C1-18), eight bake chambers 190 (labeled B1-8), six PEB chambers 130 (labeled PEB1-6), two OEBR chambers 162 (labeled 162) and/or six HMDS process chambers 170 (labeled DP1-6). In one embodiment, as shown in FIG. 1D, where the cluster tool 10 is adapted to perform a photolithography type process, the second process rack 80 may have eight coater/developer chambers 160 (labeled CD1-8), six integrated bake/chill chambers 800 (labeled BC1-6), six HMDS process chambers 170 (labeled DP1-6) and/or six support chambers 165 (labeled S1-6). The orientation, positioning, type and number of process chambers shown in the FIGS. 1C-D are not intended to be limiting as to the scope of the invention, but are intended to illustrate an embodiment of the invention.

Referring to FIG. 1B, in one embodiment, the front end robot assembly 15 is adapted to transfer substrates between a cassette 106 mounted in a pod assembly 105 (see elements 105A-D) and the one or more of the pass-through positions 9 (see pass-through positions 9A-C in FIG. 1B). In another embodiment, the front end robot assembly 15 is adapted to transfer substrates between a cassette mounted in a pod assembly 105 and the one or more processing chambers in the first processing racks 60 or a second processing rack 80 that abuts the front end module 24. The front end robot assembly 15 generally contains a horizontal motion assembly 15A and a robot 15B, which in combination are able to position a substrate in a desired horizontal and/or vertical position in the front end module 24 or the adjoining positions in the central module 25. The front end robot assembly 15 is adapted to transfer one or more substrates using one or more robot blades 15C, by use commands sent from a system controller 101 (discussed below). In one sequence the front end robot assembly 15 is adapted to transfer a substrate from the cassette 106 to one of the pass-through positions 9 (e.g., elements 9A-C in FIG. 1B). Generally, a pass-through position is a substrate staging area that may contain a pass-through processing chamber that has features similar to an exchange chamber 533 (FIG. 7A), or a conventional substrate cassette 106, and is able to accept a substrate from a first robot so that it can be removed and repositioned by a second robot. In one aspect, the pass-through processing chamber mounted in a pass-through position may be adapted to perform one or more processing steps in a desired processing sequence, for example, a HMDS process step or a chill/cooldown processing step or substrate notch align. In one aspect, each of the pass-through positions (elements 9A-C in FIG. 1B) may be accessed by each of the central robot assemblies (i.e., first robot assembly 11A, second robot assembly 11B, and third robot assembly 11C).

Referring to FIGS. 1A-B, the first robot assembly 11A, the second robot assembly 11B, and the third robot assembly 11C are adapted to transfer substrates to the various processing chambers contained in the first processing rack 60 and the second processing rack 80. In one embodiment, to perform the process of transferring substrates in the cluster tool 10 the first robot assembly 11A, the second robot assembly 11B, and the third robot assembly 11C have similarly configured robot assemblies 11 which each have at least one horizontal motion assembly 90, a vertical motion assembly 95, and a robot hardware assembly 85 which are in communication with a system controller 101. In one aspect, the side 60B of the first processing rack 60, and the side 80A of the second processing rack 80 are both aligned along a direction parallel to the horizontal motion assembly 90 (described below) of each of the various robot assemblies (i.e., first robot assembly 11A, second robot assembly 11B, third robot assembly 11C).

The system controller 101 is adapted to control the position and motion of the various components used to complete the transferring process. The system controller 101 is generally designed to facilitate the control and automation of the overall system and typically includes a central processing unit (CPU) (not shown), memory (not shown), and support circuits (or I/O) (not shown). The CPU may be one of any form of computer processors that are used in industrial settings for controlling various system functions, chamber processes and support hardware (e.g., detectors, robots, motors, gas sources hardware, etc.) and monitor the system and chamber processes (e.g., chamber temperature, process sequence throughput, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 101 determines which tasks are performable on a substrate. Preferably, the program is software readable by the system controller 101, that includes code to perform tasks relating to monitoring and execution of the processing sequence tasks and various chamber process recipe steps.

Figure 1E:
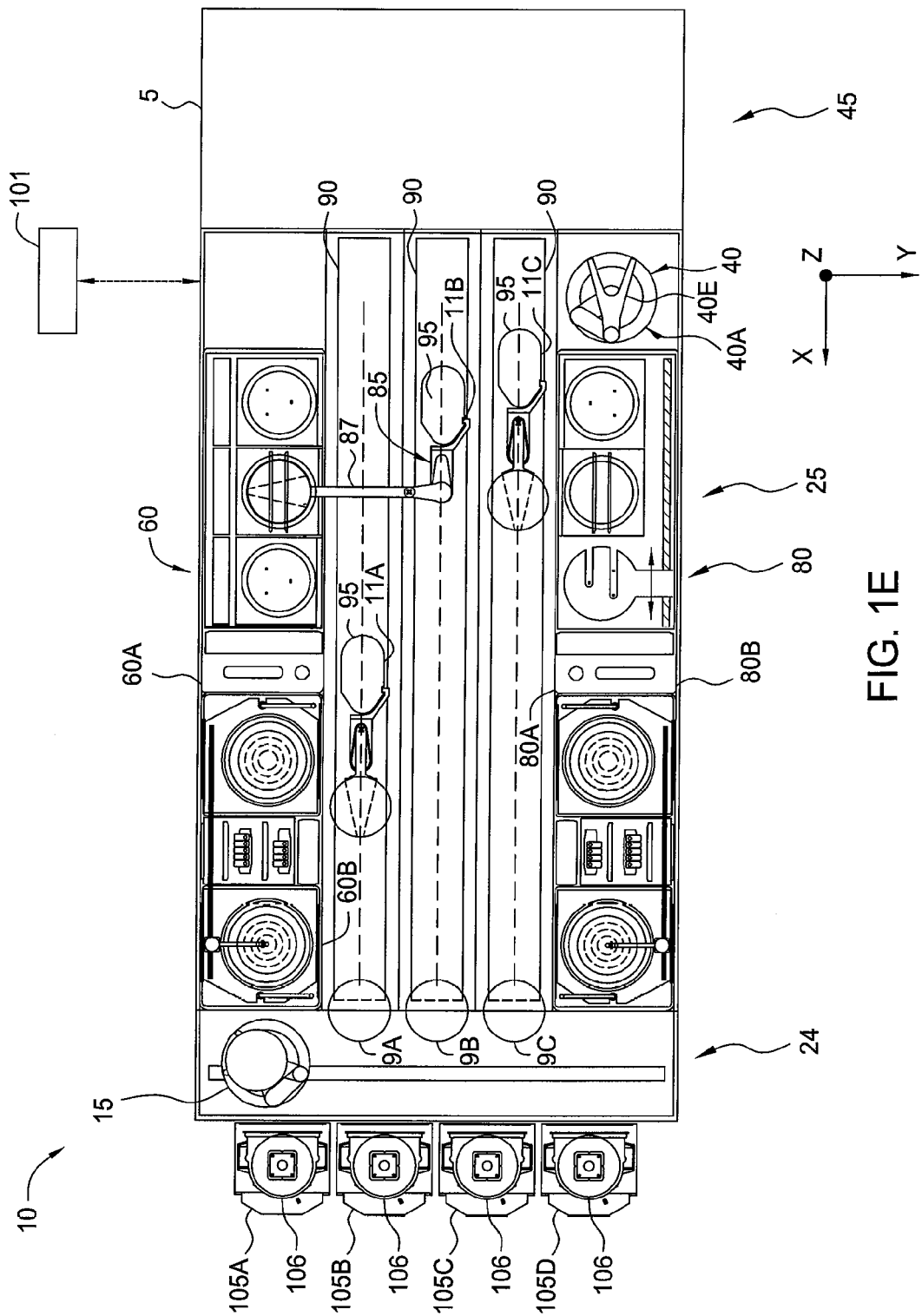
FIG. 1E is a plan view of the processing system illustrated in FIG. 1B, according to the present invention.

Referring to FIG. 1B, in one aspect of the invention the first robot assembly 11A is adapted to access and transfer substrates between the processing chambers in the first processing rack 60 from at least one side, e.g., the side 60B. In one aspect, the third robot assembly 11C is adapted to access and transfer substrates between the processing chambers in the second processing rack 80 from at least one side, e.g., the side 80A. In one aspect, the second robot assembly 11B is adapted to access and transfer substrates between the processing chambers in the first processing rack 60 from side 60B and the second processing rack 80 from side 80A. FIG. 1E illustrates a plan view of the embodiment of the cluster tool 10 shown in FIG. 1B, in which a robot blade 87 from the second robot assembly 11B has been extended into a processing chamber in the first processing rack 60 through side 60B. The ability to extend the robot blade 87 into a processing chamber and retract the robot blade 87 from the processing chamber is generally completed by cooperative movement of the components contained in the horizontal motion assembly 90, vertical motion assembly 95, and robot hardware assembly 85, and by use of commands sent from the system controller 101. The ability of two or more robots to "overlap" with one another, such as the first robot assembly 11A and the second robot assembly 11B or the second robot assembly 11B and the third robot assembly 11C, is advantageous since it allows substrate transfer redundancy which can improve the cluster reliability, uptime, and also increase the substrate throughput. Robot "overlap" is generally the ability of two or more robots to access and/or independently transfer substrates between the same processing chambers in the processing rack. The ability of two or more robots to redundantly access processing chambers can be an important aspect in preventing system robot transfer bottlenecks, since it allows an under utilized robot to help out a robot that is limiting the system throughput. Therefore, the substrate throughput can be increased, a substrate's wafer history can be made more repeatable, and the system reliability can be improved through the act of balancing the load that each robot takes, during the processing sequence.

In one aspect of the invention, the various overlapping robot assemblies (e.g., elements 11A, 11B, 11C, 11D, 11E, etc. in FIGS. 1-6) are able to simultaneously access processing chambers that are horizontally adjacent (x-direction) or vertically adjacent (z-direction) to each other. For example, when using the cluster tool configurations illustrated in FIGS. 1B and 1C, the first robot assembly 11A is able to access processing chamber CD6 in the first processing rack 60 and the second robot assembly 11B is able to access processing chamber CD5 simultaneously without colliding or interfering with each other. In another example, when using the cluster tool configurations illustrated in FIGS. 1B and 1D, the third robot assembly 11C is able to access processing chamber C6 in the second processing rack 80 and the second robot assembly 11B is able to access processing chamber P6 simultaneously without colliding or interfering with each other.

In one aspect, the system controller 101 is adapted to adjust the substrate transfer sequence through the cluster tool based on a calculated optimized throughput or to work around processing chambers that have become inoperable. The feature of the system controller 101 which allows it to optimize throughput is known as the logical scheduler. The logical scheduler prioritizes tasks and substrate movements based on inputs from the user and various sensors distributed throughout the cluster tool. The logical scheduler may be adapted to review the list of future tasks requested of each of the various robots (e.g., front end robot assembly 15, first robot assembly 11A, second robot assembly 11B, third robot assembly 11C, etc.), which are retained in the memory of the system controller 101, to help balance the load placed on each of the various robots. The use of a system controller 101 to maximize the utilization of the cluster tool will improve the cluster tool's CoO, makes the wafer history more repeatable, and can improve the cluster tool's reliability.

In one aspect, the system controller 101 is also adapted to prevent collisions between the various overlapping robots and optimize the substrate throughput. In one aspect, the system controller 101 is further programmed to monitor and control the motion of the horizontal motion assembly 90, a vertical motion assembly 95, and a robot hardware assembly 85 of all the robots in the cluster tool to avoid a collision between the robots and improve system throughput by allowing all of the robots to be in motion at the same time. This so called "collision avoidance system," may be implemented in multiple ways, but in general the system controller 101 monitors the position of each of the robots by use of various sensors positioned on the robot(s) or in the cluster tool during the transferring process to avoid a collision. In one aspect, the system controller is adapted to actively alter the motion and/or trajectory of each of the robots during the transferring process to avoid a collision and minimize the transfer path length.

B. Transfer Sequence Example

Figure 1F:
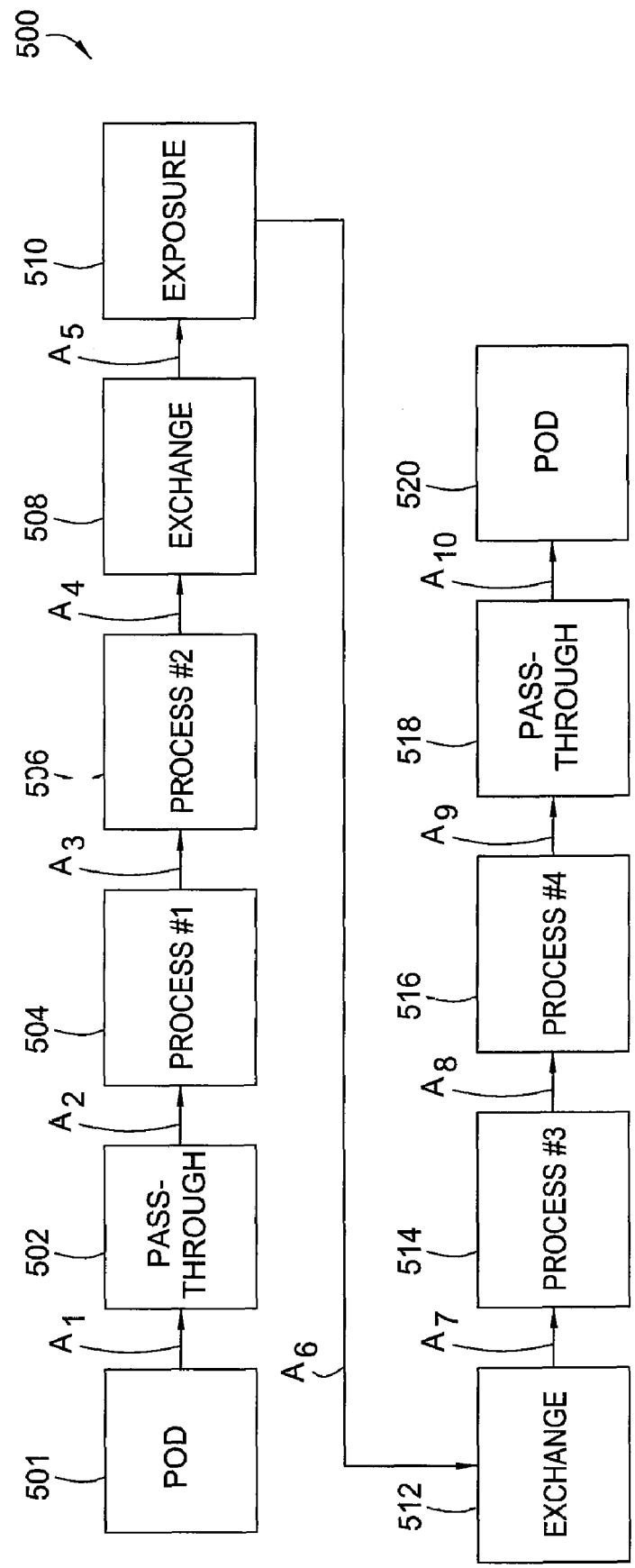
FIG. 1F illustrates one embodiment of a process sequence containing various process recipe steps that may be used in conjunction with the various embodiments of the cluster tool described herein.
Figure 1G:
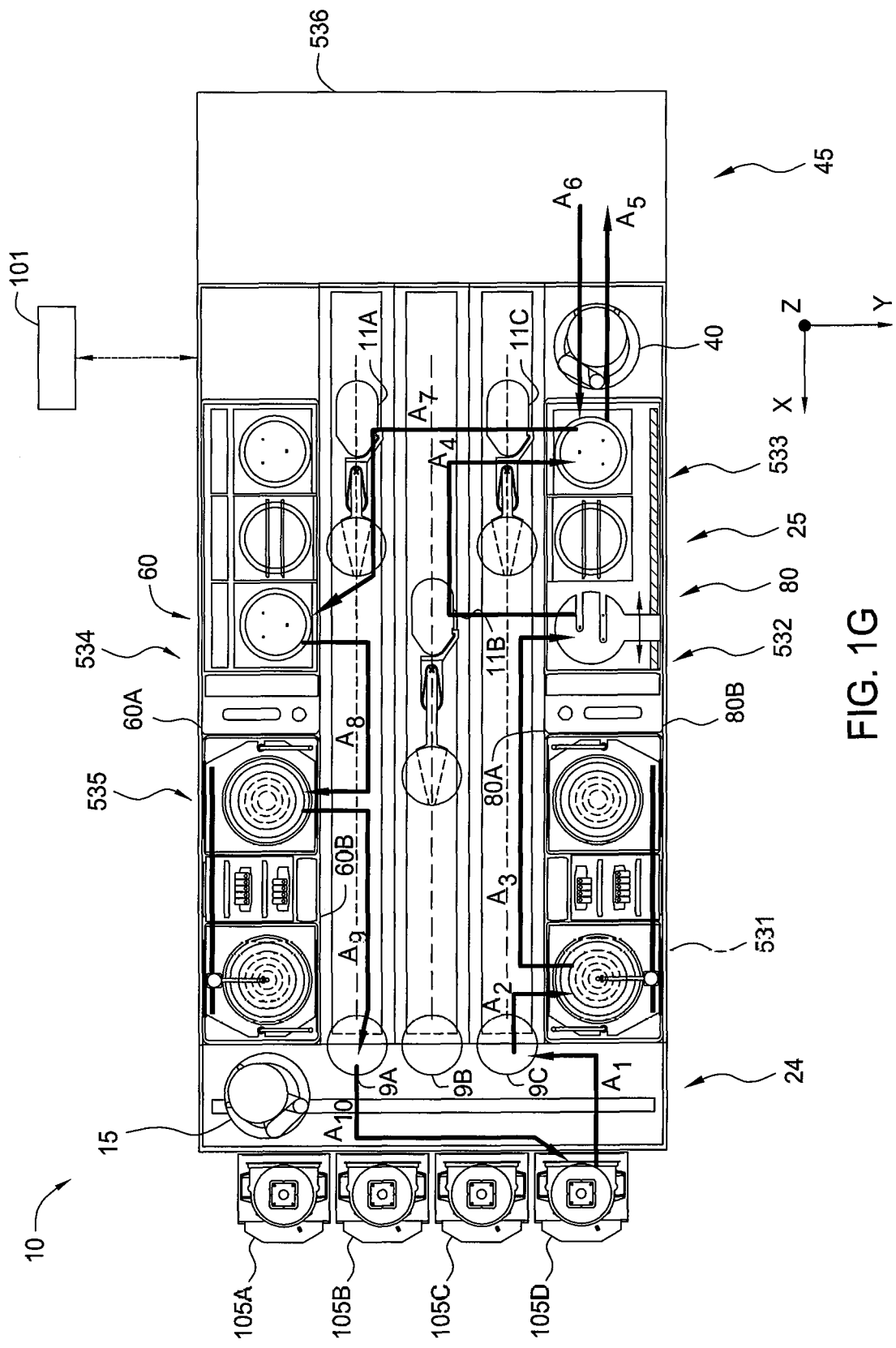
FIG. 1G is a plan view of a processing system illustrated in FIG. 1B that illustrates a transfer path of a substrate through the cluster tool following the process sequence illustrated in FIG. 1F.
Figure 7A:
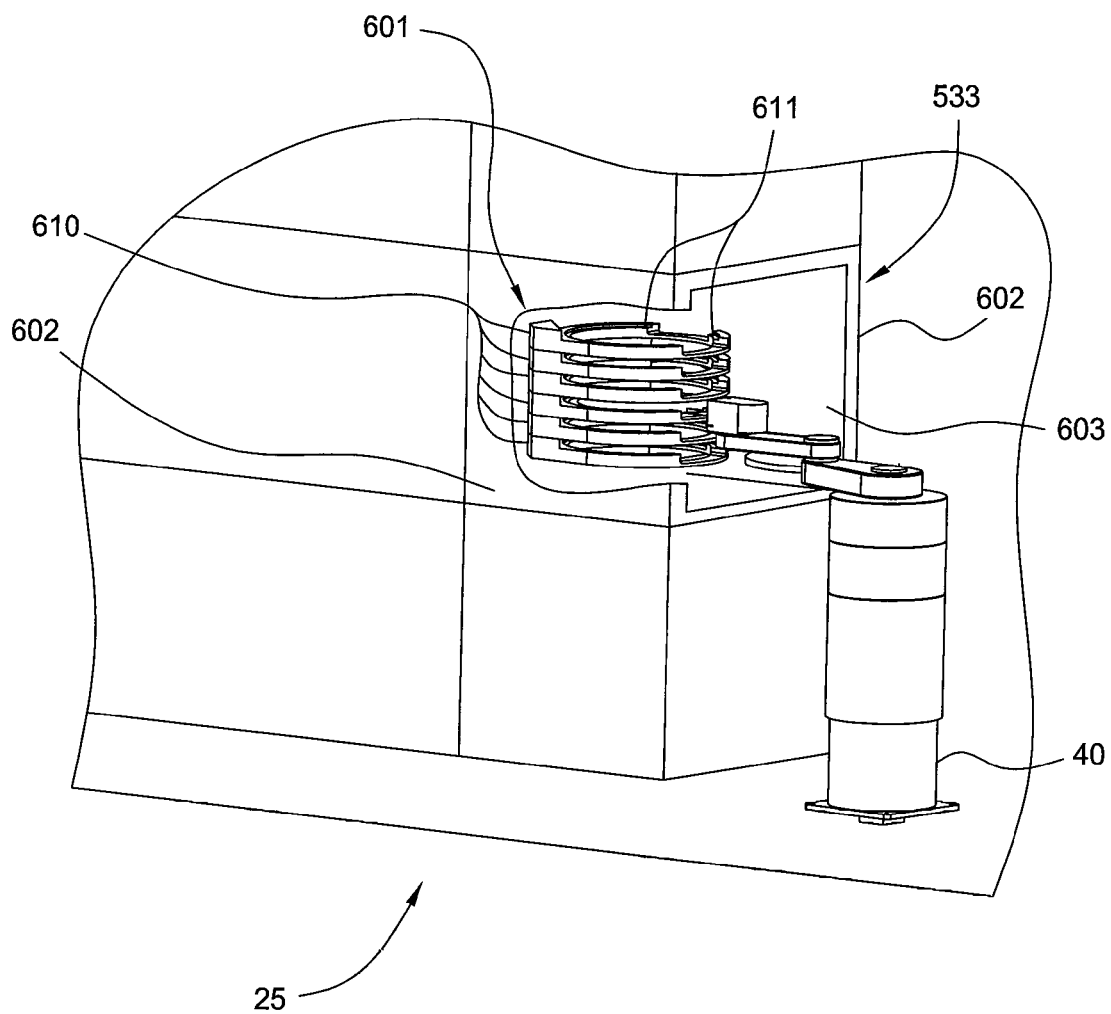
FIG. 7A is a side view of one embodiment of an exchange chamber, according to the present invention.

FIG. 1F illustrates one example of a substrate processing sequence 500 through the cluster tool 10, where a number of process steps (e.g., elements 501-520) may be performed after each of the transferring steps $A_1$-$A_{10}$ have been completed. One or more of the process steps 501-520 may entail performing vacuum and/or fluid processing steps on a substrate, to deposit a material on a surface of the substrate, to clean a surface of the substrate, to etch a surface of the substrate, or to exposing the substrate to some form of radiation to cause a physical or chemical change to one or more regions on the substrate. Examples of typical processes that may be performed are photolithography processing steps, substrate clean process steps, CVD deposition steps, ALD deposition steps, electroplating process steps, or electroless plating process steps. FIG. 1G illustrates an example of the transfer steps that a substrate may follow as it is transferred through a cluster tool that is configured as the cluster tool shown in FIG. 1B following the processing sequence 500 described in FIG. 1F. In this embodiment, the substrate is removed from a pod assembly 105 (item # 105D) by the front end robot assembly 15 and is delivered to a chamber positioned at the pass-through position 9C following the transfer path $A_1$, so that the pass-through step 502 can be completed on the substrate. In one embodiment, the pass-through step 502 entails positioning or retaining the substrate so that another robot could pickup the substrate from the pass-through position 9C. Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the third robot assembly 11C following the transfer path $A_3$. After performing the process step 506 the substrate is then transferred by the second robot assembly 11B, following the transfer path $A_4$, to the exchange chamber 533 (FIG. 7A). After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 where the process step 512 is performed. In one embodiment, the process steps 508 and 512 entail positioning or retaining the substrate so that another robot could pickup the substrate from the exchange chamber 533. After performing the process step 512 the substrate is then transferred by the second robot assembly 11B, following the transfer path $A_7$, to the process chamber 534 where the process step 514 is performed. The substrate is then transferred to process chamber 535 following the transfer path $A_8$ using the first robot assembly 11A. After the process step 516 is complete, the first robot assembly 11A transfers the substrate to a pass-through chamber positioned at the pass-through position 9A following the transfer path $A_9$. In one embodiment, the pass-through step 518 entails positioning or retaining the substrate so that another robot could pickup the substrate from the pass-through position 9A. After performing the pass-through step 518 the substrate is then transferred by the front end robot assembly 15, following the transfer path $A_{10}$, to the pod assembly 105D.

In one embodiment, process steps 504, 506, 510, 514, and 516 are a photoresist coat step, a bake/chill step, an exposure step performed in a stepper/scanner module, a post exposure bake/chill step, and a develop step, respectively, which are further described in the commonly assigned U.S. patent application Ser. No. 11/112,281, filed Apr. 22, 2005, which is incorporated by reference herein. The bake/chill step and the post exposure bake/chill steps may be performed in a single process chamber or they may also be transferred between a bake section and a chill section of an integrated bake/chill chamber by use of an internal robot (not shown). While FIGS. 1F-G illustrate one example of a process sequence that may be used to process a substrate in a cluster tool 10, process sequences and/or transfer sequences that are more or less complex may be performed without varying from the basic scope of the invention.

Also, in one embodiment, the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed between positions or processing chambers within in the cluster tool 10.

Second Cluster Tool Configuration

A. System Configuration

Figure 2A:
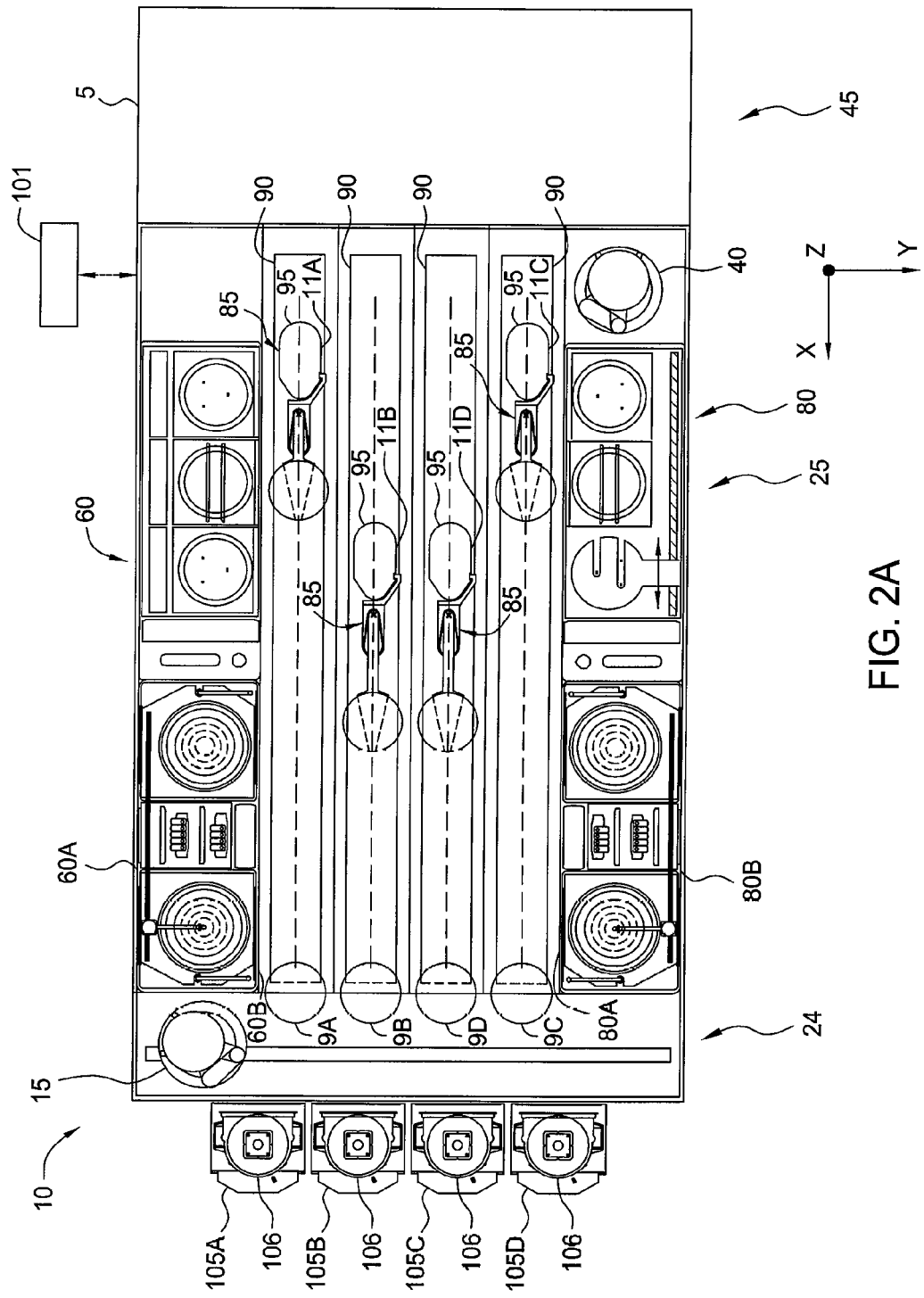
FIG. 2A is a plan view of a processing system, according to the present invention.

FIG. 2A is a plan view of one embodiment of cluster tool 10 that has a front end robot assembly 15, a rear robot assembly 40, a system controller 101 and four robot assemblies 11 (FIGS. 9-11; elements 11A, 11B, 11C, and 11D in FIG. 2A) positioned between two processing racks (elements 60 and 80), which are all adapted to perform at least one aspect of a desired substrate processing sequence using the various processing chambers found in the processing racks. The embodiment illustrated in FIG. 2A is similar to the configurations illustrated in FIGS. 1A-F except for the addition of the fourth robot assembly 11D and pass-through position 9D, thus like element numbers have been used where appropriate. The cluster tool configuration illustrated in FIG. 2A may be advantageous where the substrate throughput is robot limited, because the addition of the fourth robot assembly 11D will help to remove the burden on the other robots and also builds in some redundancy that allows the system to process substrates when one or more of the central robots become inoperable. In one aspect, the side 60B of the first processing rack 60, and the side 80A of the second processing rack 80 are both aligned along a direction parallel to the horizontal motion assembly 90 (FIGS. 9A and 12A-C) of each of the various robot assemblies (e.g., first robot assembly 11A, second robot assembly 11B, etc.).

In one aspect, the first robot assembly 11A is adapted to access and transfer substrates between the processing chambers in the first processing rack 60 from side 60B. In one aspect, the third robot assembly 11C is adapted to access and transfer substrates between the processing chambers in the second processing rack 80 from side 80A. In one aspect, the second robot assembly 11B is adapted to access and transfer substrates between the processing chambers in the first processing rack 60 from side 60B. In one aspect, the fourth robot assembly 11D is adapted to access and transfer substrates between the processing chambers in the second processing rack 80 from side 80A. In one aspect, the second robot assembly 11B and fourth robot assembly 11D are further adapted to access the processing chambers in first processing rack 60 from side 60B and the second processing rack 80 from side 80A.

Figure 2B:
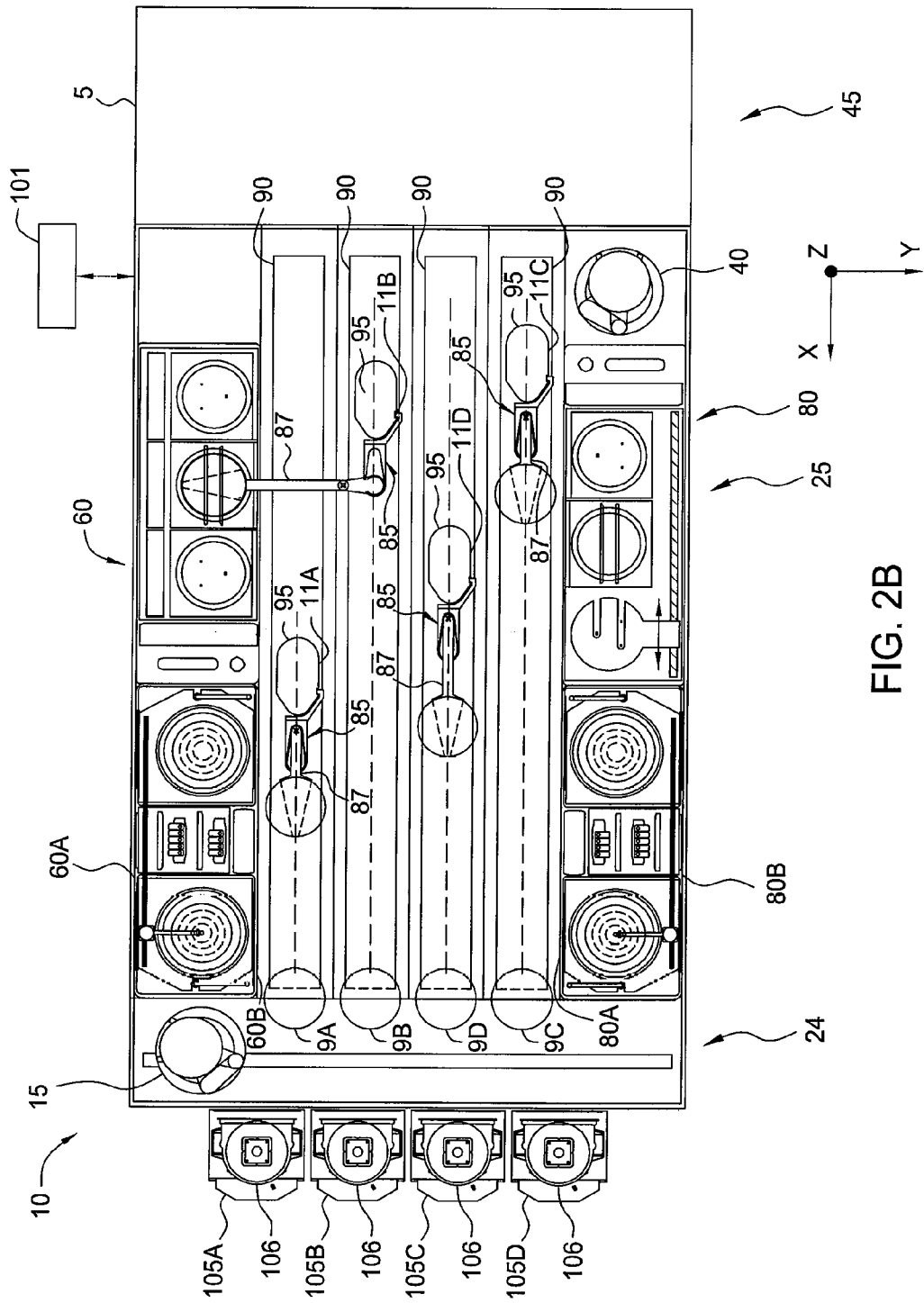
FIG. 2B is a plan view of a processing system illustrated in FIG. 2A, according to the present invention.

FIG. 2B illustrates a plan view of the embodiment of the cluster tool 10 shown in FIG. 2A, in which a robot blade 87 from the second robot assembly 11B has been extended into the a processing chamber in the first processing rack 60 through side 60B. The ability to extend the robot blade 87 into a processing chamber and/or retract the robot blade 87 into a processing chamber is generally completed by cooperative movement of the robot assembly 11 components, which are contained in the horizontal motion assembly 90, a vertical motion assembly 95, and a robot hardware assembly 85, and by use of commands sent from the system controller 101. As discussed above the second robot assembly 11B and the fourth robot assembly 11D along with the system controller 101 may be adapted to allow "overlap" between each of the robots in the cluster tool, may allow the system controller's logical scheduler to prioritizes tasks and substrate movements based on inputs from the user and various sensors distributed throughout the cluster tool, and may also use a collision avoidance system to allow robots to optimally transfer substrates through the system. Use of the system controller 101 to maximize the utilization of the cluster tool can improve the cluster tool's CoO, makes the wafer history more repeatable, and improves the system reliability.

B. Transfer Sequence Example

Figure 2C:
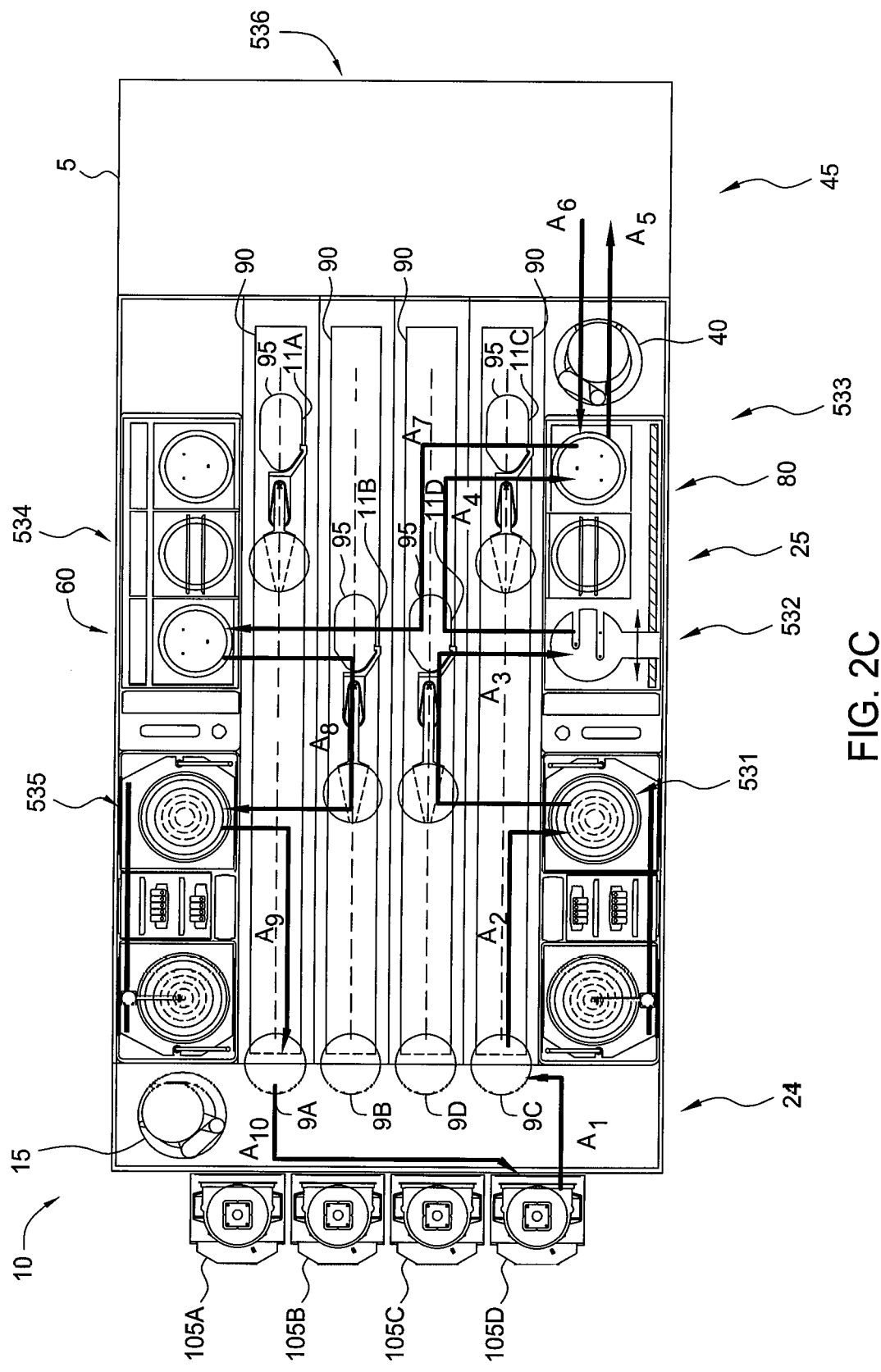
FIG. 2C is a plan view of a processing system illustrated in FIG. 2B that illustrates a transfer path of a substrate through the cluster tool following the process sequence illustrated in FIG. 1F.

FIG. 2C illustrates an example of a sequence of transfer steps that may be used to complete the processing sequence described in FIG. 1F through the cluster tool configuration illustrated in FIG. 2A. In this embodiment, the substrate is removed from a pod assembly 105 (item # 105D) by the front end robot assembly 15 and is delivered to a chamber positioned at the pass-through position 9C following the transfer path $A_1$, so that the pass-through step 502 can be completed on the substrate. Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the fourth robot assembly 11D following the transfer path $A_3$. After performing the process step 506 the substrate is then transferred by the fourth robot assembly 11D, following the transfer path $A_4$, to the exchange chamber 533. After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the fourth robot assembly 11D, following the transfer path $A_7$, to the process chamber 534 where the process step 514 is performed. The substrate is then transferred to process chamber 535 following the transfer path $A_8$ using the second robot assembly 11B. After the process step 516 is complete, the first robot assembly 11A transfers the substrate to a pass-through chamber positioned at the pass-through position 9A following the transfer path $A_9$. After performing the pass-through step 518 the substrate is then transferred by the front end robot assembly 15, following the transfer path $A_{10}$, to the pod assembly 105D.

In one aspect, the transfer path $A_7$ may be divided into two transfer steps which may require the fourth robot assembly 11D to pickup the substrate from the exchange chamber 533 and transfer it to the fourth pass-through position 9D where it is then picked up and transferred by the second robot assembly 11B to the process chamber 534. In one aspect, each of the pass-through chambers may be accessed by any of the central robot assemblies (i.e., first robot assembly 11A, second robot assembly 11B, third robot assembly 11C and the fourth robot assembly 11D). In another aspect, the second robot assembly 11B is able to pickup the substrate from the exchange chamber 533 and transfer it to the process chamber 534.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Third Cluster Tool Configuration

A. System Configuration

Figure 3A:
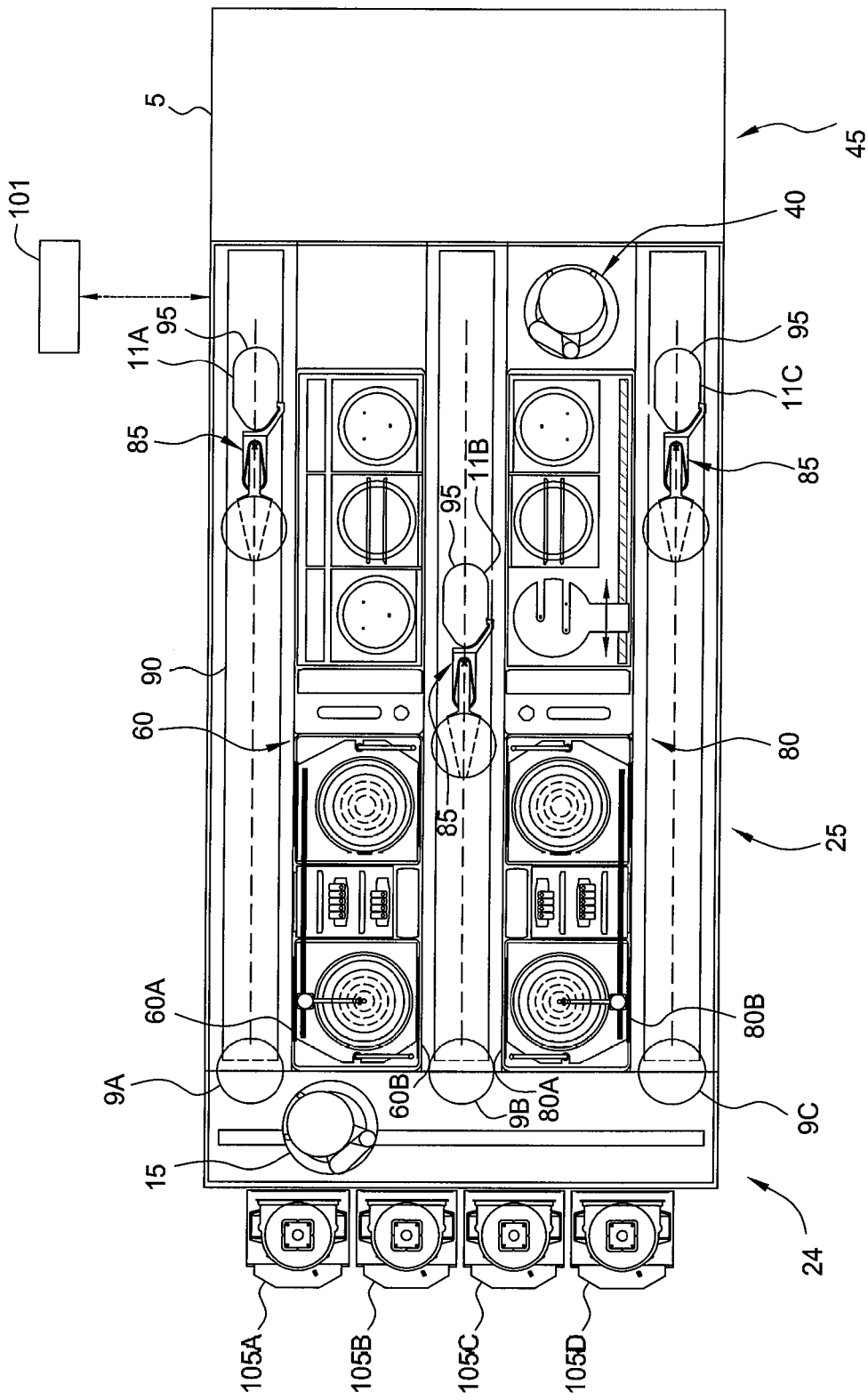
FIG. 3A is a plan view of a processing system, according to the present invention.

FIG. 3A is a plan view of one embodiment of cluster tool 10 that has a front end robot assembly 15, a rear robot assembly 40, a system controller 101 and three robot assemblies 11 (FIGS. 9-11; elements 11A, 11B, and 11C in FIG. 3A) positioned around two processing racks (elements 60 and 80), which are all adapted to perform at least one aspect of a desired substrate processing sequence using the various processing chambers found in the processing racks. The embodiment illustrated in FIG. 3A is similar to the configurations illustrated in FIGS. 1A-F except for the positioning of the first robot assembly 11A and pass-through position 9A on side 60A of the first processing rack 60 and positioning the third robot assembly 11C and pass-through position 9C on the side 80B of the second processing rack 80, and thus like element numbers have been used where appropriate. One advantage of this cluster tool configuration is that if one of the robots in the central module 25 becomes inoperable the system can still continue to process substrates using the other two robots. This configuration also removes, or minimizes, the need for collision avoidance type control features when the robots are transferring the substrates between processing chambers mounted in a various processing racks, since the physical overlap of robots that are positioned next to each other is eliminated. Another advantage of this configuration is the flexible and modular architecture allows the user to configure the number of processing chambers, processing racks, and processing robots required to meet the throughput needs of the user.

In this configuration the first robot assembly 11A is adapted to access the processing chambers in the first processing rack 60 from side 60A, the third robot assembly 11C is adapted to access the processing chambers in the second processing rack 80 from side 80B, and the second robot assembly 11B is adapted to access the processing chambers in the first processing rack 60 from side 60B and the second processing rack 80 from side 80A. In one aspect, the side 60B of the first processing rack 60, and the side 80A of the second processing rack 80 are both aligned along a direction parallel to the horizontal motion assembly 90 (described below) of each of the various robot assemblies (i.e., first robot assembly 11A, second robot assembly 11B, third robot assembly 11C).

The first robot assembly 11A, the second robot assembly 11B and the third robot assembly 11C along with the system controller 101 may be adapted to allow "overlap" between the various robots and allow the system controller's logical scheduler to prioritizes tasks and substrate movements based on inputs from the user and various sensors distributed throughout the cluster tool. Use of a cluster tool architecture and system controller 101 to work together to maximize the utilization of the cluster tool to improve CoO makes the wafer history more repeatable and improves the system reliability.

B. Transfer Sequence Example

Figure 3B:
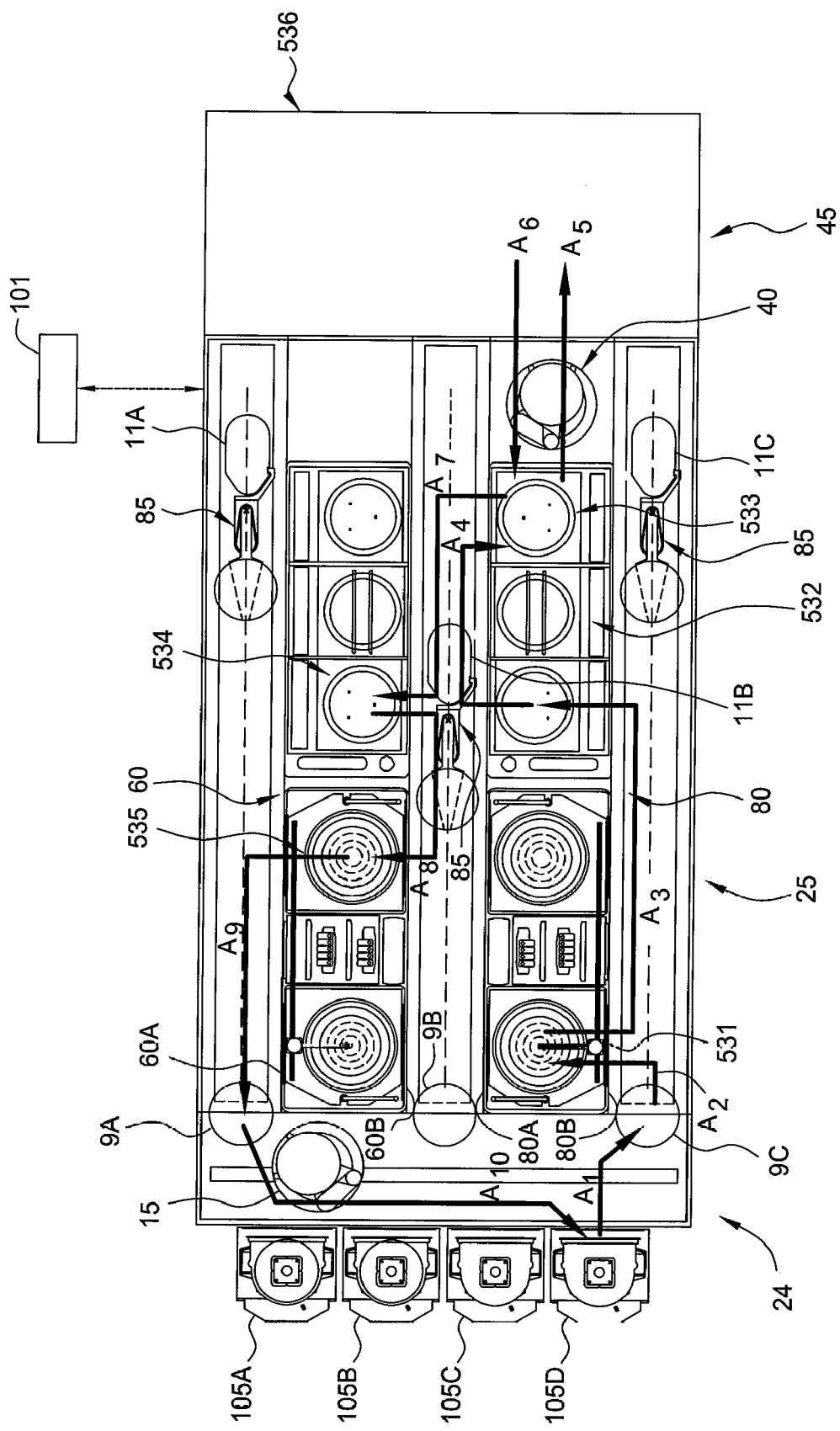
FIG. 3B is a plan view of a processing system illustrated in FIG. 3A that illustrates a transfer path of a substrate through the cluster tool following the process sequence illustrated in FIG. 1F.

FIG. 3B illustrates an example of a sequence of transfer steps that may be used to complete the processing sequence described in FIG. 1F through the cluster tool shown in FIG. 3A. In this embodiment, the substrate is removed from a pod assembly 105 (item # 105D) by the front end robot assembly 15 and is delivered to a chamber positioned at the pass-through position 9C following the transfer path $A_1$, so that the pass-through step 502 can be completed on the substrate. Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the third robot assembly 11C following the transfer path $A_3$. After performing the process step 506 the substrate is then transferred by the second robot assembly 11B, following the transfer path $A_4$, to the exchange chamber 533 (FIG. 7A). After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the second robot assembly 11C, following the transfer path $A_7$, to the process chamber 534 where the process step 514 is performed. The substrate is then transferred to process chamber 535 following the transfer path $A_8$ using the second robot assembly 11B. After the process step 516 is complete, the first robot assembly 11A transfers the substrate to a pass-through chamber positioned at the pass-through position 9A following the transfer path $A_9$. After performing the pass-through step 518 the substrate is then transferred by the front end robot assembly 15, following the transfer path $A_{10}$, to the pod assembly 105D.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Fourth Cluster Tool Configuration

A. System Configuration

Figure 4A:
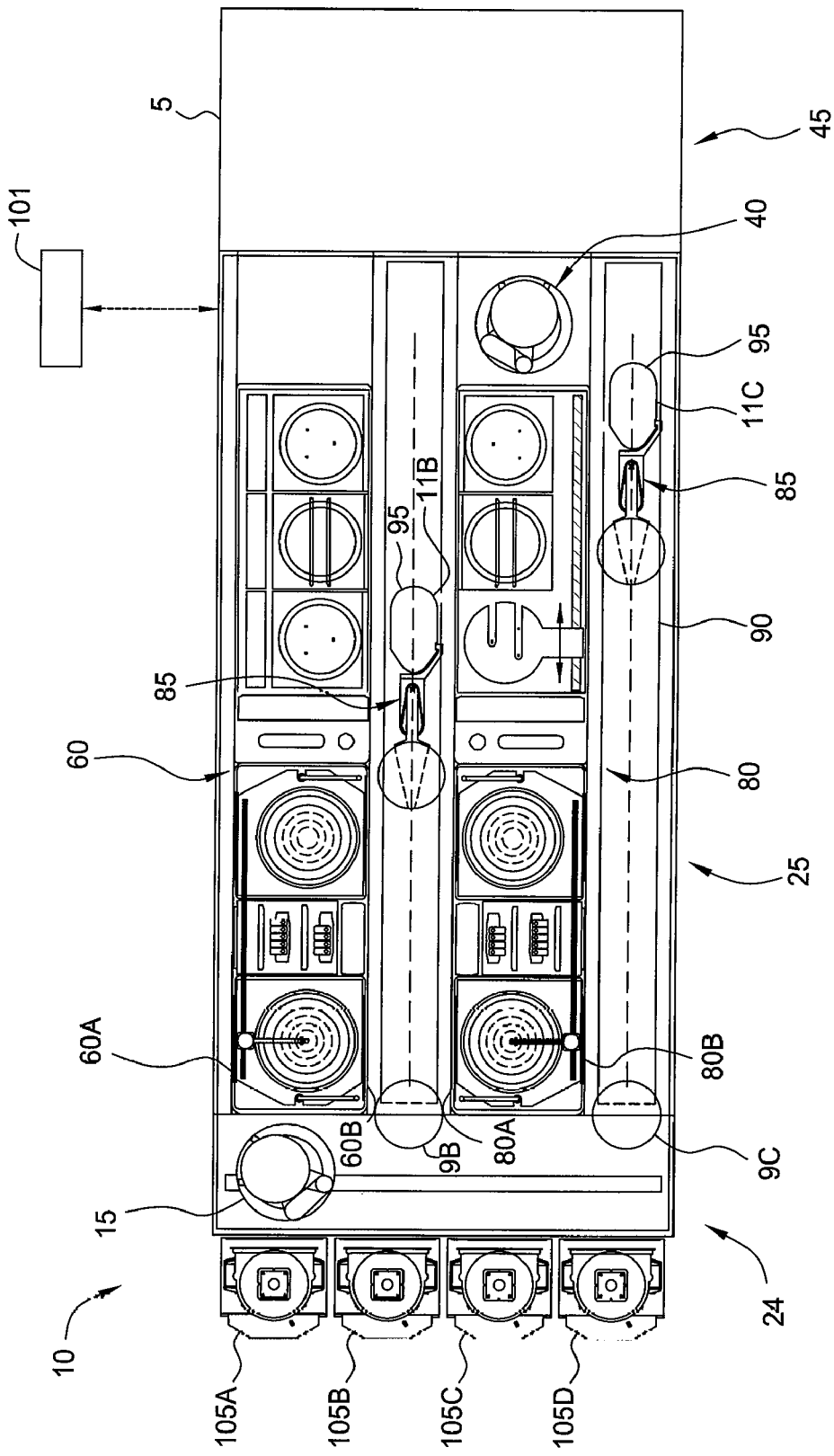
FIG. 4A is a plan view of a processing system, according to the present invention.

FIG. 4A is a plan view of one embodiment of cluster tool 10 that has a front end robot assembly 15, a rear robot assembly 40, a system controller 101 and two robot assemblies 11 (FIGS. 9-11; elements 11B, and 11C in FIG. 4A) positioned around two processing racks (elements 60 and 80), which are all adapted to perform at least one aspect of a desired substrate processing sequence using the various processing chambers found in the processing racks. The embodiment illustrated in FIG. 4A is similar to the configurations illustrated in FIGS. 3A except for the removal of the first robot assembly 11A and pass-through position 9A on side 60A of the first processing rack 60, thus like element numbers have been used where appropriate. One advantage of this system configuration is that it allows easy access to chambers mounted in the first processing rack 60 and thus allows one or more processing chambers mounted in the first processing rack 60 to be taken down and worked on while the cluster tool is still processing substrates. Another advantage is that the third robot assembly 11C and/or second processing rack 80 can be worked on, while substrates are being processed using the second robot assembly 11B. This configuration may also allow the frequently used processing chambers in a process sequence that have a short chamber processing time to be positioned in the second processing rack 80 so that they can be serviced by the two central robots (i.e., elements 11B and 11C) to reduce robot transfer limited bottlenecks and thus improve system throughput. This configuration also removes or minimizes the need for collision avoidance type control features when the robots are transferring the substrates between processing chambers mounted in a processing rack, since the physical encroachment of each robot into the other's space is eliminated. Another advantage of this configuration is the flexible and modular architecture allows the user to configure the number of processing chambers, processing racks, and processing robots required to meet the throughput needs of the user.

In this configuration the third robot assembly 11C is adapted to access and transfer substrates between the processing chambers in the second processing rack 80 from side 80B, and the second robot assembly 11B is adapted to access and transfer substrates between the processing chambers in the first processing rack 60 from side 60B and the second processing rack 80 from side 80A. In one aspect, the side 60B of the first processing rack 60, and the side 80A of the second processing rack 80 are both aligned along a direction parallel to the horizontal motion assembly 90 (described below) of each of the various robot assemblies (i.e., first robot assembly 11A, second robot assembly 11B, third robot assembly 11C).

As discussed above the second robot assembly 11B and the fourth robot assembly 11C along with the system controller 101 may be adapted to allow the system controller's logical scheduler to prioritize tasks and substrate movements based on inputs from the user and various sensors distributed throughout the cluster tool. Use of a cluster tool architecture and system controller 101 to work together to maximize the utilization of the cluster tool to improve CoO makes the wafer history more repeatable and improves the system reliability.

B. Transfer Sequence Example

Figure 4B:
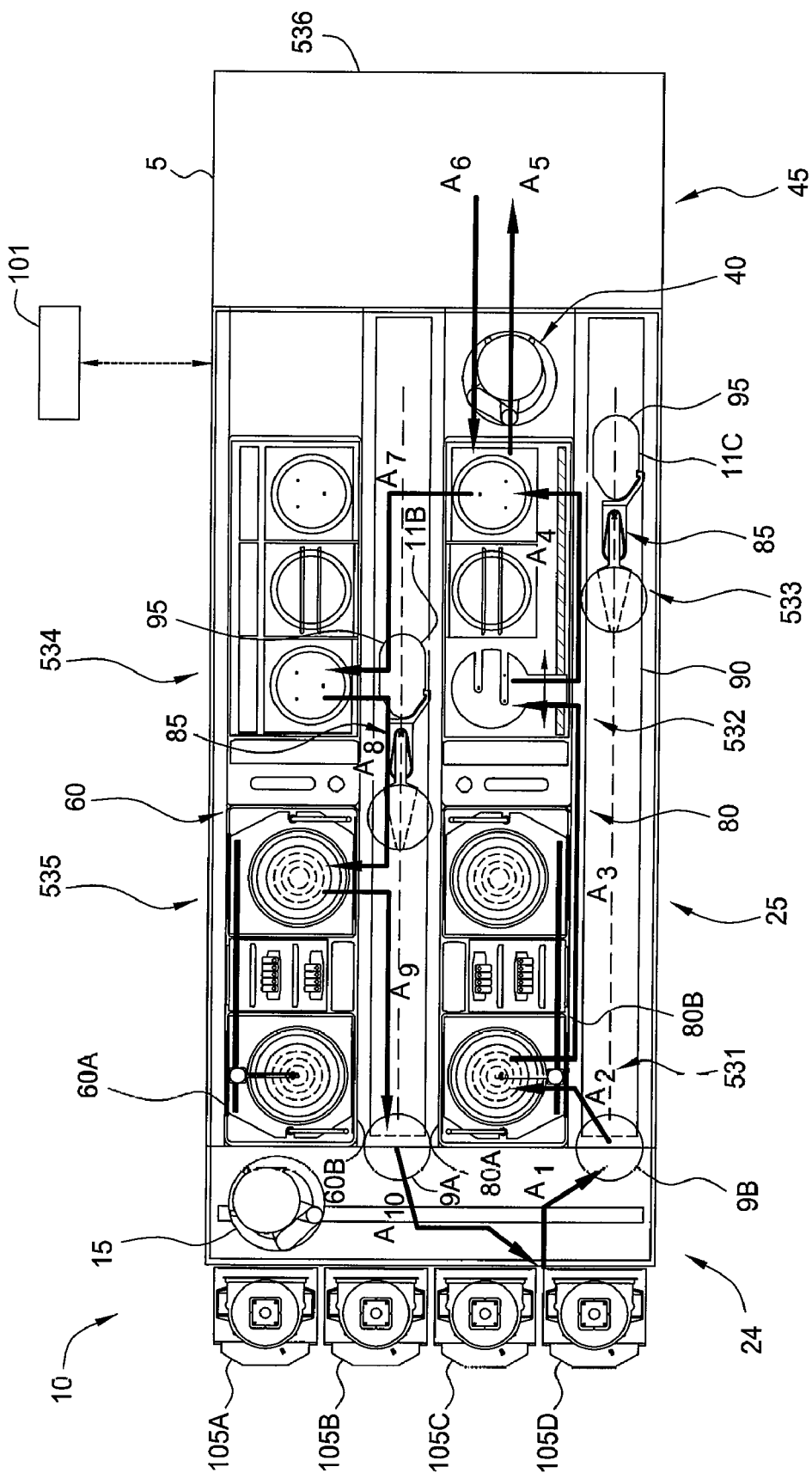
FIG. 4B is a plan view of a processing system illustrated in FIG. 4A that illustrates a transfer path of a substrate through the cluster tool following the process sequence illustrated in FIG. 1F.

FIG. 4B illustrates an example of a sequence of transfer steps that may be used to complete the processing sequence described in FIG. 1F through the cluster tool shown in FIG. 4A. In this embodiment, the substrate is removed from a pod assembly 105 (item # 105D) by the front end robot assembly 15 and is delivered to a chamber positioned at the pass-through position 9C following the transfer path $A_1$, so that the pass-through step 502 can be completed on the substrate. Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the third robot assembly 11C following the transfer path $A_3$. After performing the process step 506 the substrate is then transferred by the third robot assembly 11C, following the transfer path $A_4$, to the exchange chamber 533 (FIG. 7A). After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the second robot assembly 11C, following the transfer path $A_7$, to the process chamber 534 where the process step 514 is performed. The substrate is then transferred to process chamber 535 following the transfer path $A_8$ using the second robot assembly 11B. After the process step 516 is complete, the second robot assembly 11B transfers the substrate to a pass-through chamber positioned at the pass-through position 9B following the transfer path $A_9$. After performing the pass-through step 518 the substrate is then transferred by the front end robot assembly 15, following the transfer path $A_{10}$, to the pod assembly 105D.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Fifth Cluster Tool Configuration

A. System Configuration

Figure 5A:
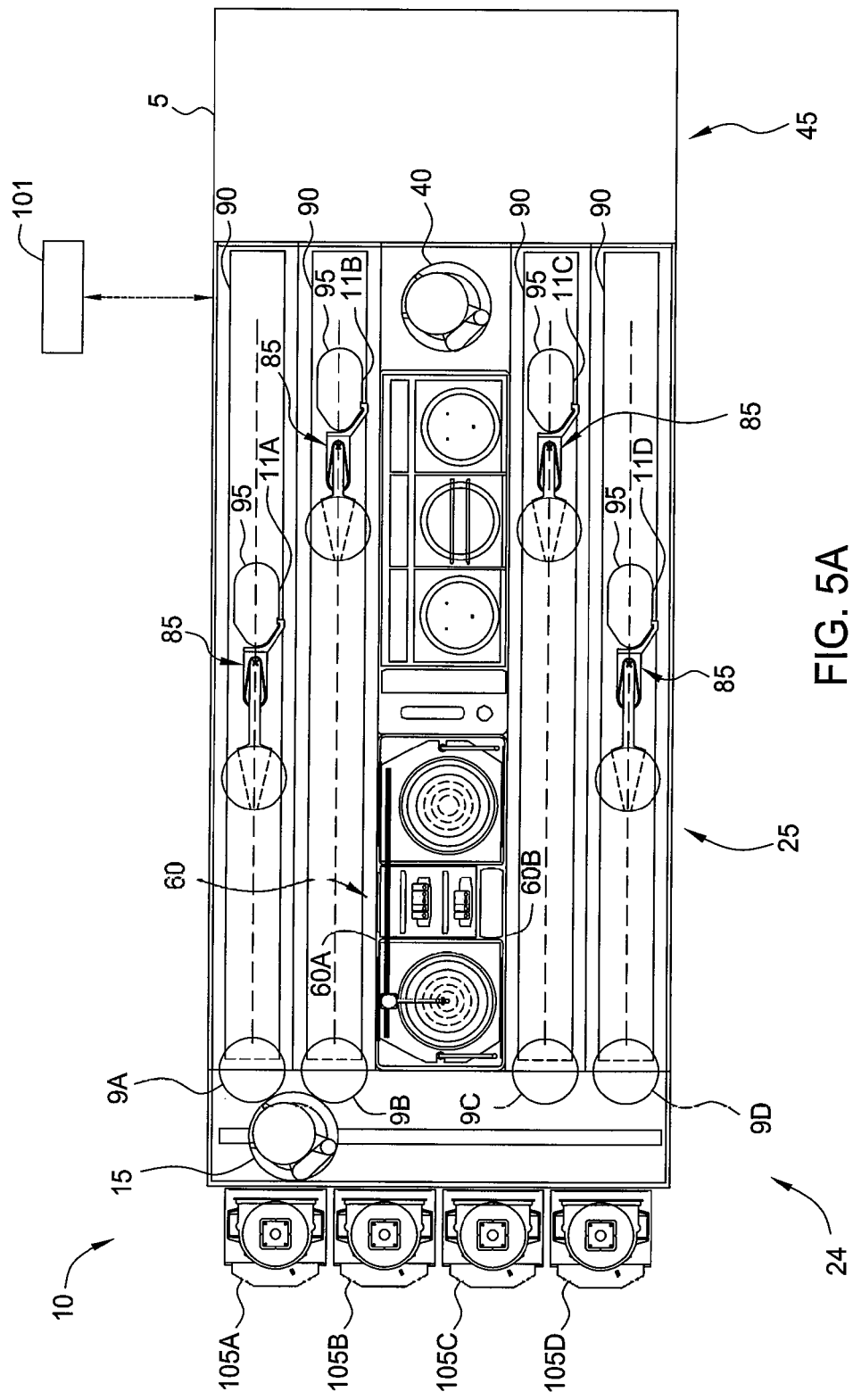
FIG. 5A is a plan view of a processing system, according to the present invention.

FIG. 5A is a plan view of one embodiment of cluster tool 10 that has a front end robot assembly 15, a rear robot assembly 40, a system controller 101 and four robot assemblies 11 (FIGS. 9-11; elements 11A, 11B, 11C and 11D in FIG. 5A) positioned around a single processing rack (elements 60), which are all adapted to perform at least one aspect of a desired substrate processing sequence using the various processing chambers found in processing rack 60. The embodiment illustrated in FIG. 5A is similar to the configurations illustrated above and thus like element numbers have been used where appropriate. This configuration will reduce the substrate transfer bottleneck experienced by systems that have three or fewer robots, due to the use of four robots that can redundantly access the process chambers mounted in the first processing rack 60. This configuration may be especially useful to remove robot limited type bottlenecks often found when the number of processing steps in a process sequence is large and the chamber processing time is short.

In this configuration the first robot assembly 11A and the second robot assembly 11B are adapted to access and transfer substrates between the processing chambers in the first processing rack 60 from side 60A, and the third robot assembly 11C and the fourth robot assembly 11D are adapted to access and transfer substrates between the processing chambers in the first processing rack 60 from side 60B.

The first robot assembly 11A and the second robot assembly 11B, and the third robot assembly 11C and the fourth robot assembly 11D along with the system controller 101 may be adapted to allow "overlap" between the various robots, may allow the system controller's logical scheduler to prioritizes tasks and substrate movements based on inputs from the user and various sensors distributed throughout the cluster tool, and may also use a collision avoidance system to allow robots optimally transfer substrates through the system. Use of a cluster tool architecture and system controller 101 to work together to maximize the utilization of the cluster tool to improve CoO makes the wafer history more repeatable and improves the system reliability.

B. Transfer Sequence Example

Figure 5B:
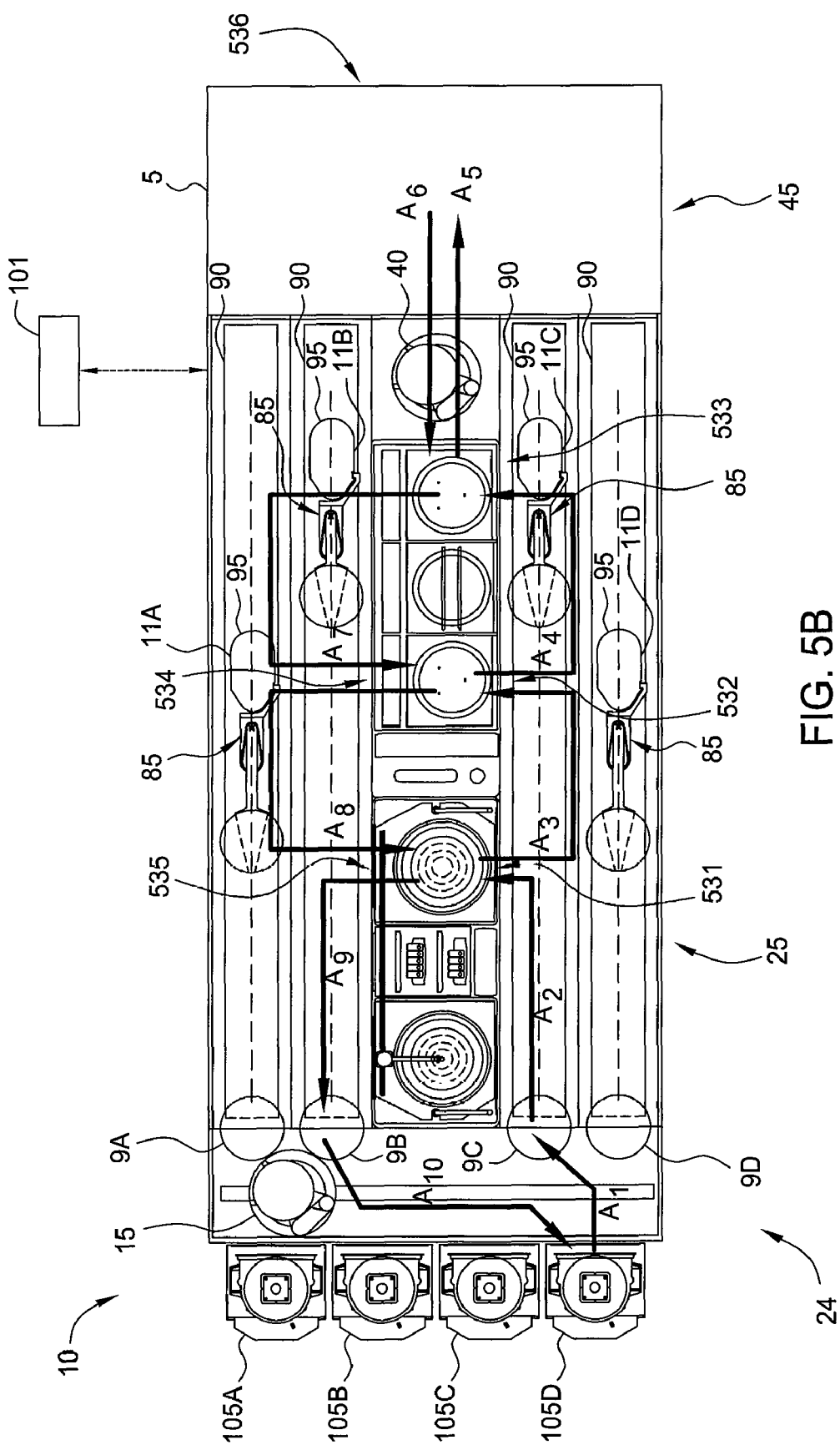
FIG. 5B is a plan view of a processing system illustrated in FIG. 5A that illustrates a transfer path of a substrate through the cluster tool following the process sequence illustrated in FIG. 1F.

FIG. 5B illustrates an example of a sequence of transfer steps that may be used to complete the processing sequence described in FIG. 1F through the cluster tool shown in FIG. 5A. In this embodiment, the substrate is removed from a pod assembly 105 (item # 105D) by the front end robot assembly 15 and is delivered to a chamber positioned at the pass-through position 9C following the transfer path $A_1$, so that the pass-through step 502 can be completed on the substrate.

Once the pass-through step 502 has been completed, the substrate is then transferred to a first process chamber 531 by the third robot assembly 11C following the transfer path $A_2$, where process step 504 is completed on the substrate. After completing the process step 504 the substrate is then transferred to the second process chamber 532 by the fourth robot assembly 11D following the transfer path $A_3$. After performing the process step 506 the substrate is then transferred by the fourth robot assembly 11D, following the transfer path $A_4$, to the exchange chamber 533 (FIG. 7A). After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the first robot assembly 11A, following the transfer path $A_7$, to the process chamber 534 where the process step 514 is performed. The substrate is then transferred to process chamber 535 following the transfer path $A_8$ using the first robot assembly 11A. After the process step 516 is complete, the second robot assembly 11B transfers the substrate to a pass-through chamber positioned at the pass-through position 9B following the transfer path $A_9$. After performing the pass-through step 518 the substrate is then transferred by the front end robot assembly 15, following the transfer path $A_{10}$, to the pod assembly 105D.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Sixth Cluster Tool Configuration

A. System Configuration

Figure 6A:
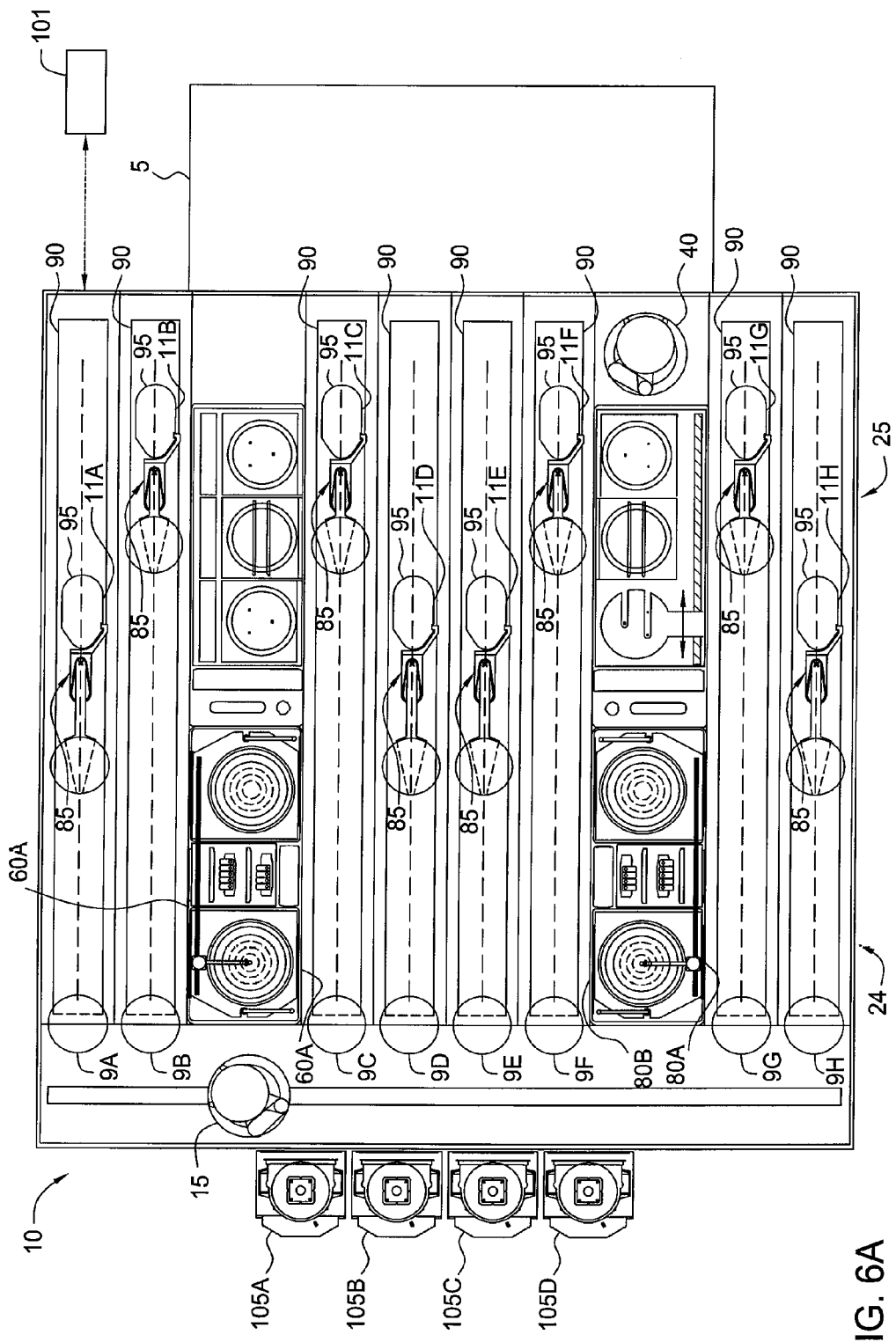
FIG. 6A is a plan view of a processing system, according to the present invention.

FIG. 6A is a plan view of one embodiment of cluster tool 10 that has a front end robot assembly 15, a rear robot assembly 40, a system controller 101 and eight robot assemblies 11 (FIGS. 9-11; elements 11A, 11B, 11C, and 11D-11H in FIG. 6A) positioned around a two processing racks (elements 60 and 80), which are all adapted to perform at least one aspect of a desired substrate processing sequence using the various processing chambers found in the processing rack. The embodiment illustrated in FIG. 6A is similar to the configurations illustrated above and thus like element numbers have been used where appropriate. This configuration will reduce the substrate transfer bottleneck experienced by systems that have fewer robots, due to the use of the eight robots that can redundantly access the process chambers mounted in the processing racks 60 and 80. This configuration may be especially useful to remove robot limited type bottlenecks often found when the number of processing steps in a process sequence is large and the chamber processing time is short.

In this configuration the first robot assembly 11A and the second robot assembly 11B are adapted to access the processing chambers in the first processing rack 60 from side 60A and the seventh robot assembly 11G and the eighth robot assembly 11H are adapted to access the processing chambers in the second processing rack 80 from side 80B. In one aspect, the third robot assembly 11C and the fourth robot assembly 11D are adapted to access the processing chambers in the first processing rack 60 from side 60B. In one aspect, the fifth robot assembly 11E and the sixth robot assembly 11F are adapted to access the processing chambers in the second processing rack 80 from side 80A. In one aspect, the fourth robot assembly 11D are further adapted to access the processing chambers in the second processing rack 80 from side 80A and the and the fifth robot assembly 11E is further adapted to access the processing chambers in the first processing rack 60 from side 60B.

The robot assemblies 11A-H along with the system controller 101 may be adapted to allow "overlap" between the various robots, may allow the system controller's logical scheduler to prioritizes tasks and substrate movements based on inputs from the user and various sensors distributed throughout the cluster tool, and may also use a collision avoidance system to allow robots optimally transfer substrates through the system. Use of a cluster tool architecture and system controller 101 to work together to maximize the utilization of the cluster tool to improve CoO makes the wafer history more repeatable and improves the system reliability.

B. Transfer Sequence Example

Figure 6B:
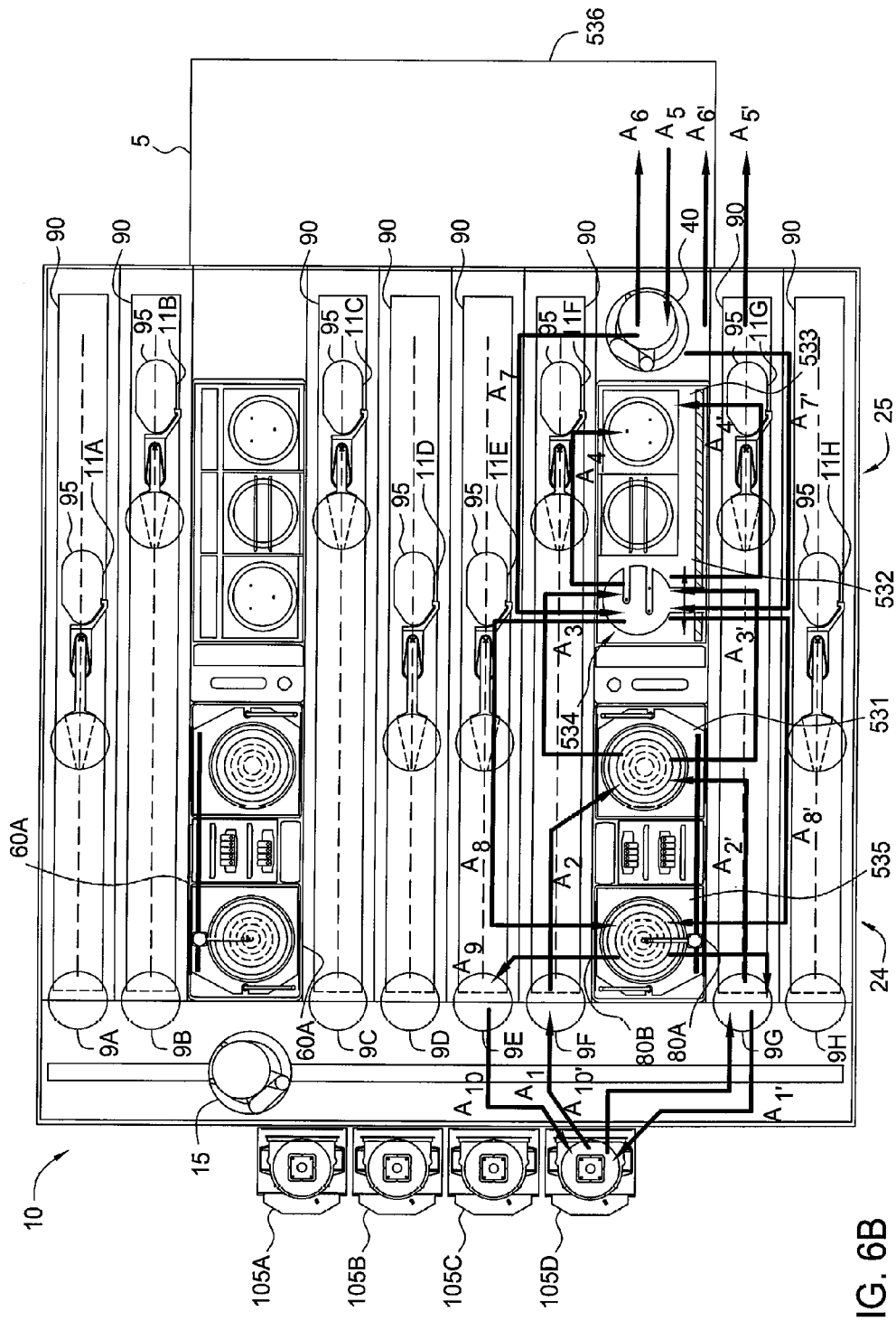
FIG. 6B is a plan view of a processing system illustrated in FIG. 6A that illustrates two possible transfer paths of a substrate through the cluster tool following the process sequence illustrated in FIG. 1F.

FIG. 6B illustrates an example of a first processing sequence of transfer steps that may be used to complete the processing sequence described in FIG. 1F through the cluster tool shown in FIG. 6A. In this embodiment, the substrate is removed from a pod assembly 105 (item # 105D) by the front end robot assembly 15 and is delivered to a pass-through chamber 9F following the transfer path $A_1$, so that the pass-through step 502 can be completed on the substrate. Once the pass-through step 502 has been completed, the substrate is then transferred to a first process chamber 531 by the sixth robot assembly 11F following the transfer path $A_2$, where process step 504 is completed on the substrate. After completing the process step 504 the substrate is then transferred to the second process chamber 532 by the sixth robot assembly 11F following the transfer path $A_3$. After performing the process step 506 the substrate is then transferred by the sixth robot assembly 11F, following the transfer path $A_4$, to the exchange chamber 533 (FIG. 7A). After performing the process step 508 the substrate is then transferred by the rear robot assembly 40, following the transfer path A5, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the fifth robot assembly 11E, following the transfer path $A_7$, to the process chamber 534 where the process step 514 is performed. The substrate is then transferred to process chamber 535 following the transfer path $A_8$ using the fifth robot assembly 11E. After the process step 516 is complete, the fifth robot assembly 11E transfers the substrate to a pass-through chamber positioned at the pass-through position 9E following the transfer path $A_9$. After performing the pass-through step 518 the substrate is then transferred by the front end robot assembly 15, following the transfer path $A_{10}$, to the pod assembly 105D.

FIG. 6B also illustrates an example of a second processing sequence having transfer steps that are completed simultaneously with the first sequence using different processing chambers found in the second processing rack 80. As illustrated in FIGS. 1C-D the first processing rack and second processing rack generally contain a number of processing chambers that are adapted to perform the same process step(s) (e.g., CD1-8 in FIG. 1C, BC1-6 in FIG. 1D) that are used to perform a desired processing sequence. Therefore, in this configuration each processing sequence may be performed using any of the processing chambers mounted in the processing racks. In one example, the second process sequence is the same process sequence as the first processing sequence (discussed above), which contains the same transferring steps $A_1$-$A_{10}$, depicted here as $A_1'$-$A_{10}'$, using the seventh and eighth central robots (i.e., elements 11G-11H) instead of the fifth and sixth central robot assemblies (i.e., elements 11E-11F), respectively, as described above.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Seventh Cluster Tool Configuration

A. System Configuration

Figure 6C:
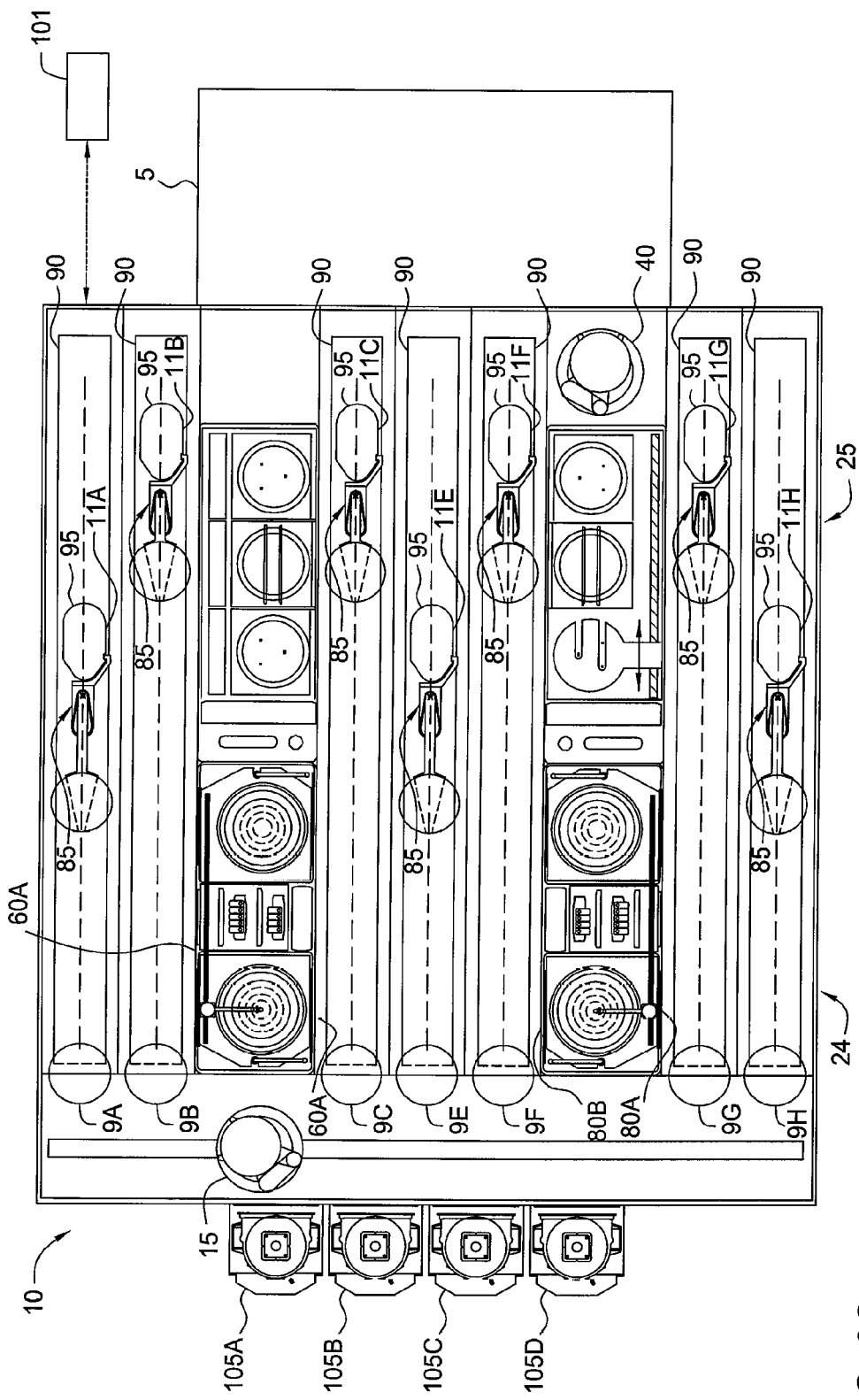
FIG. 6C is a plan view of a processing system, according to the present invention.

FIG. 6C is a plan view of one embodiment of cluster tool 10 that is similar to the configuration shown in FIG. 6A except one of the robot assemblies (i.e. robot assembly 11D) has been removed to reduce the system width while still providing a high system throughput. Therefore, in this configuration the cluster tool 10 has a front end robot assembly 15, a rear robot assembly 40, a system controller 101 and seven robot assemblies 11 (FIGS. 9-11; elements 11A-11C, and 11E-11H in FIG. 6C) positioned around a two processing racks (elements 60 and 80), which are all adapted to perform at least one aspect of a desired substrate processing sequence using the various processing chambers found in the processing rack. The embodiment illustrated in FIG. 6C is similar to the configurations illustrated above and thus like element numbers have been used where appropriate. This configuration will reduce the substrate transfer bottleneck experienced by systems that have fewer robots, due to the use of the seven robots that can redundantly access the process chambers mounted in the processing racks 60 and 80. This configuration may be especially useful to remove robot limited type bottlenecks often found when the number of processing steps in a process sequence is large and the chamber processing time is short.

In this configuration the first robot assembly 11A and the second robot assembly 11B are adapted to access the processing chambers in the first processing rack 60 from side 60A and the seventh robot assembly 11G and the eighth robot assembly 11H are adapted to access the processing chambers in the second processing rack 80 from side 80B. In one aspect, the third robot assembly 11C and the fifth robot assembly 11E are adapted to access the processing chambers in the first processing rack 60 from side 60B. In one aspect, the fifth robot assembly 11E and the sixth robot assembly 11F are adapted to access the processing chambers in the second processing rack 80 from side 80A.

The robot assemblies 11A-11C and 11E-11H along with the system controller 101 may be adapted to allow "overlap" between the various robots, may allow the system controller's logical scheduler to prioritizes tasks and substrate movements based on inputs from the user and various sensors distributed throughout the cluster tool, and may also use a collision avoidance system to allow robots to optimally transfer substrates through the system. Use of a cluster tool architecture and system controller 101 to work together to maximize the utilization of the cluster tool to improve CoO makes the wafer history more repeatable and improves the system reliability.

B. Transfer Sequence Example

Figure 6D:
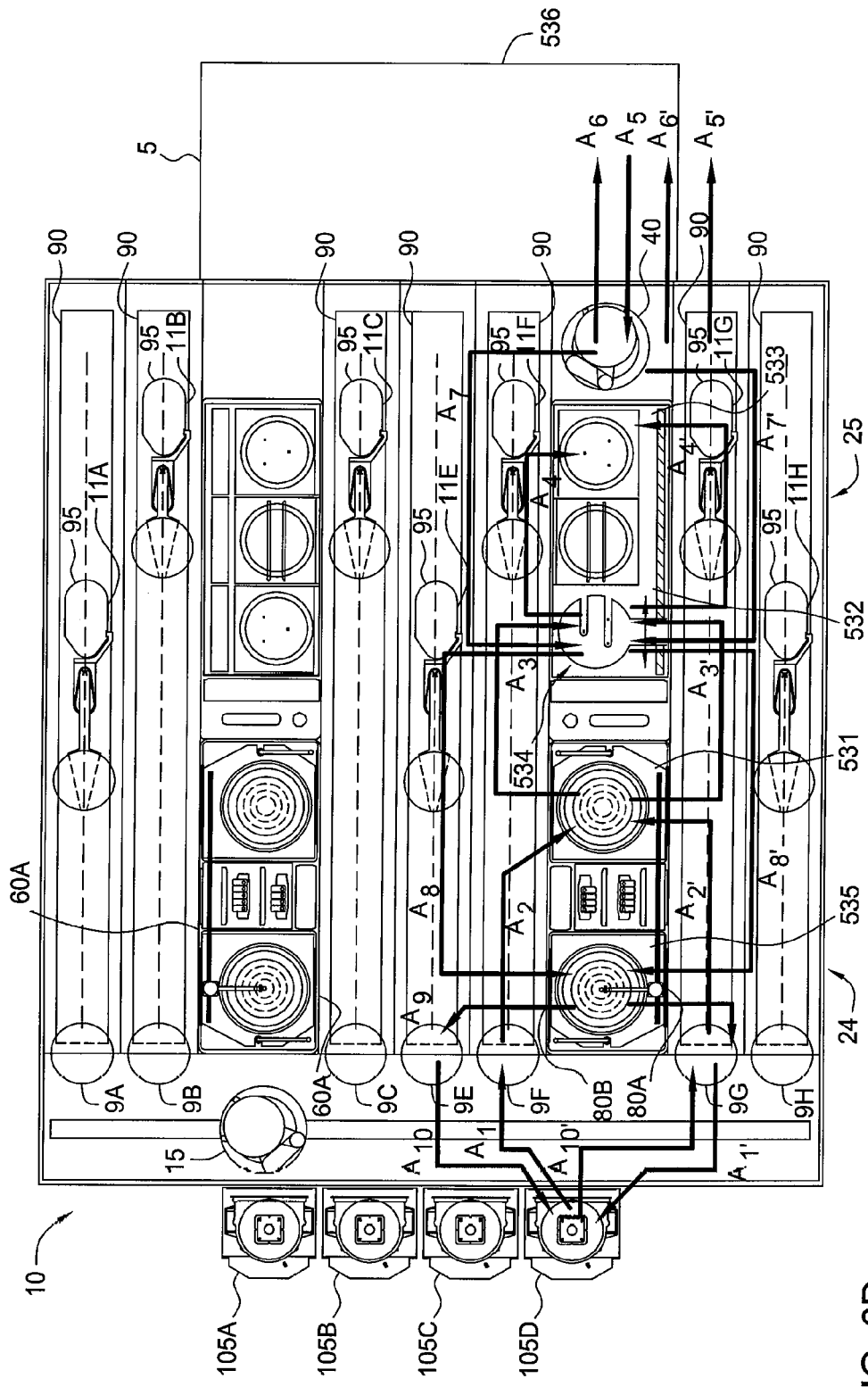
FIG. 6D is a plan view of a processing system illustrated in FIG. 6C that illustrates two possible transfer paths of a substrate through the cluster tool following the process sequence illustrated in FIG. 1F.

FIG. 6D illustrates an example of a first processing sequence of transfer steps that may be used to complete the processing sequence described in FIG. 1F through the cluster tool shown in FIG. 6C. In this embodiment, the substrate is removed from a pod assembly 105 (item # 105D) by the front end robot assembly 15 and is delivered to a pass-through chamber 9F following the transfer path $A_1$, so that the pass-through step 502 can be completed on the substrate. Once the pass-through step 502 has been completed, the substrate is then transferred to a first process chamber 531 by the sixth robot assembly 11F following the transfer path $A_2$, where process step 504 is completed on the substrate. After completing the process step 504 the substrate is then transferred to the second process chamber 532 by the sixth robot assembly 11F following the transfer path $A_3$. After performing the process step 506 the substrate is then transferred by the sixth robot assembly 11F, following the transfer path $A_4$, to the exchange chamber 533 (FIG. 7A). After performing the process step 508 the substrate is then transferred by the rear robot assembly 40, following the transfer path $A_5$, to the external processing system 536 where the process step 510 is performed. After performing process step 510 the substrate is then transferred by a rear robot assembly 40, following the transfer path $A_6$, to the exchange chamber 533 (FIG. 7A) where the process step 512 is performed. After performing the process step 512 the substrate is then transferred by the fifth robot assembly 11E, following the transfer path $A_7$, to the process chamber 534 where the process step 514 is performed. The substrate is then transferred to process chamber 535 following the transfer path $A_8$ using the fifth robot assembly 11E. After the process step 516 is complete, the fifth robot assembly 11E transfers the substrate to a pass-through chamber positioned at the pass-through position 9E following the transfer path $A_9$. After performing the pass-through step 518 the substrate is then transferred by the front end robot assembly 15, following the transfer path $A_{10}$, to the pod assembly 105D.

FIG. 6D also illustrates an example of a second processing sequence having transfer steps that are completed simultaneously with the first sequence using different processing chambers found in the second processing rack 80. As illustrated in FIGS. 1C-D the first processing rack and second processing rack generally contain a number of processing chambers that are adapted to perform the same process step(s) (e.g., CD1-8 in FIG. 1C, BC1-6 in FIG. 1D) that are used to perform a desired processing sequence. Therefore, in this configuration each processing sequence may be performed using any of the processing chambers mounted in the processing racks. In one example, the second process sequence is the same process sequence as the first processing sequence (discussed above), which contains the same transferring steps $A_1$-$A_{10}$, depicted here as $A_1'$-$A_{10}'$, using the seventh and eighth central robots (i.e., elements 11G-11H) instead of the fifth and sixth central robot assemblies (i.e., elements 11E-11F), respectively, as described above.

Also, in one embodiment the cluster tool 10 is not connected to or in communication with an external processing system 536 and thus the rear robot assembly 40 is not part of the cluster tool configuration and the transfer steps A5-A6 and process step 510 are not performed on the substrate. In this configuration all of the processing steps and transferring steps are performed within in the cluster tool 10.

Rear Robot Assembly

In one embodiment, as shown in FIGS. 1-6, the central module 25 contains a rear robot assembly 40 which is adapted to transfer substrates between an external module 5 and the processing chambers retained in the second processing rack 80, such as an exchange chamber 533. Referring to FIG. 1E, in one aspect, the rear robot assembly 40 generally contains a conventional selectively compliant articulated robot arm (SCARA) robot having a single arm/blade 40E. In another embodiment, the rear robot assembly 40 may be a SCARA type of robot that has two independently controllable arms/blades (not shown) to exchange substrates and/or transfer substrates in groups of two. The two independently controllable arms/blade type robot may be advantageous, for example, where the robot has to remove a substrate from a desired position prior to placing the next substrate in the same position. An exemplary two independently controllable arms/blade type robot may be purchased from Asyst Technologies in Fremont, Calif. While FIGS. 1-6 illustrate configurations that contain a rear robot assembly 40, one embodiment of the cluster tool 10 does not contain a rear robot assembly 40.

FIG. 7A illustrates one embodiment of an exchange chamber 533 that may be positioned in a support chamber 165 (FIG. 1D) in a processing rack (e.g., elements 60, 80). In one embodiment, the exchange chamber 533 is adapted to receive and retain a substrate so that at least two robots in the cluster tool 10 can deposit or pickup a substrate. In one aspect, the rear robot assembly 40 and at least one robot in the central module 25 are adapted to deposit and/or receive a substrate from the exchange chamber 533. The exchange chamber 533 generally contains a substrate support assembly 601, an enclosure 602, and at least one access port 603 formed in a wall of the enclosure 602. The substrate support assembly 601 generally has a plurality of support fingers 610 (six shown in FIG. 7A) which have a substrate receiving surface 611 to support and retain a substrate positioned thereon. The enclosure 602 is generally a structure having one or more walls that enclose the substrate support assembly 601 to control the environment around the substrates while they are retained in the exchange chamber 533. The access port 603 is generally an opening in a wall of the enclosure 602 that allows an external robot access to pickup and drop off substrates to the support fingers 610. In one aspect, the substrate support assembly 601 is adapted to allow substrates to be positioned on and removed from the substrate receiving surface 611 by two or more robots that are adapted to access the enclosure 602 at angles of at least 90 degrees apart.

Figure 7B:
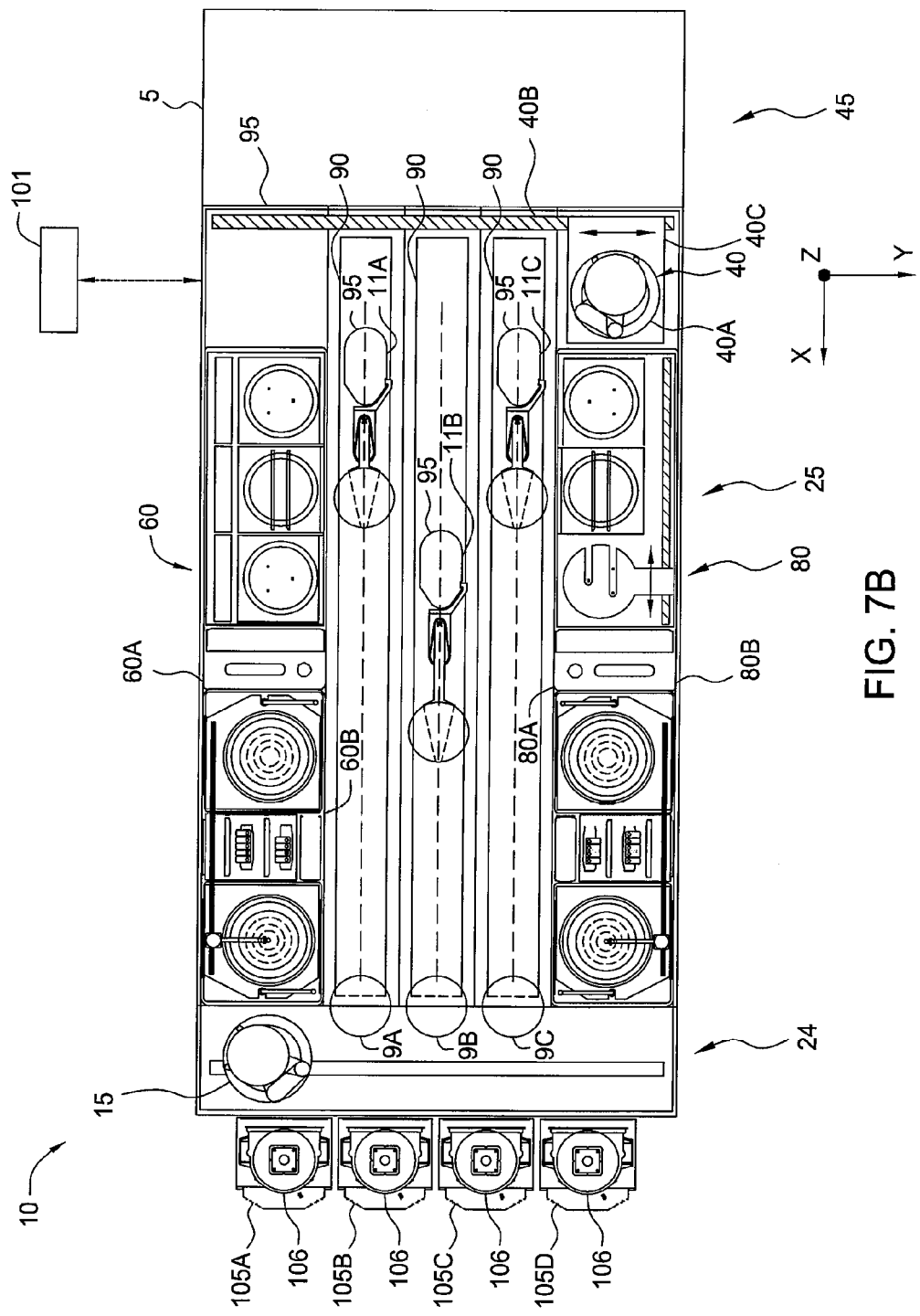
FIG. 7B is a plan view of the processing system illustrated in FIG. 1B, according to the present invention.

In one embodiment of the cluster tool 10, illustrated in FIG. 7B, the base 40A of the rear robot assembly 40 is mounted on a supporting bracket 40C which is connected to a slide assembly 40B, so that the base 40A can be positioned at any point along the length of slide assembly 40B. In this configuration the rear robot assembly 40 may be adapted to transfer substrates from processing chambers in the first processing rack 60, the second processing rack 80 and/or the external module 5. The slide assembly 40B may generally contain a linear ball bearing slide (not shown) and linear actuator (not shown), which are well known in the art, to position the support bracket 40C and the rear robot assembly 40 retained thereon. The linear actuator may be a drive linear brushless servomotor that may be purchased from Danaher Motion of Wood Dale, Ill. As illustrated in FIG. 7B, the slide assembly 40B may be oriented in the y-direction. In this configuration to prevent a collision with the robot assemblies 11A, 11B or 11C the controller will be adapted to only move the rear robot assembly 40 when the slide assembly 40B can move without colliding with the other central robot assemblies (e.g., elements 11A, 11B, etc.). In one embodiment, the rear robot assembly 40 is mounted on a slide assembly 40B that is positioned so that it will not interfere with the other central robot assemblies.

Environmental Control

Figure 8A:
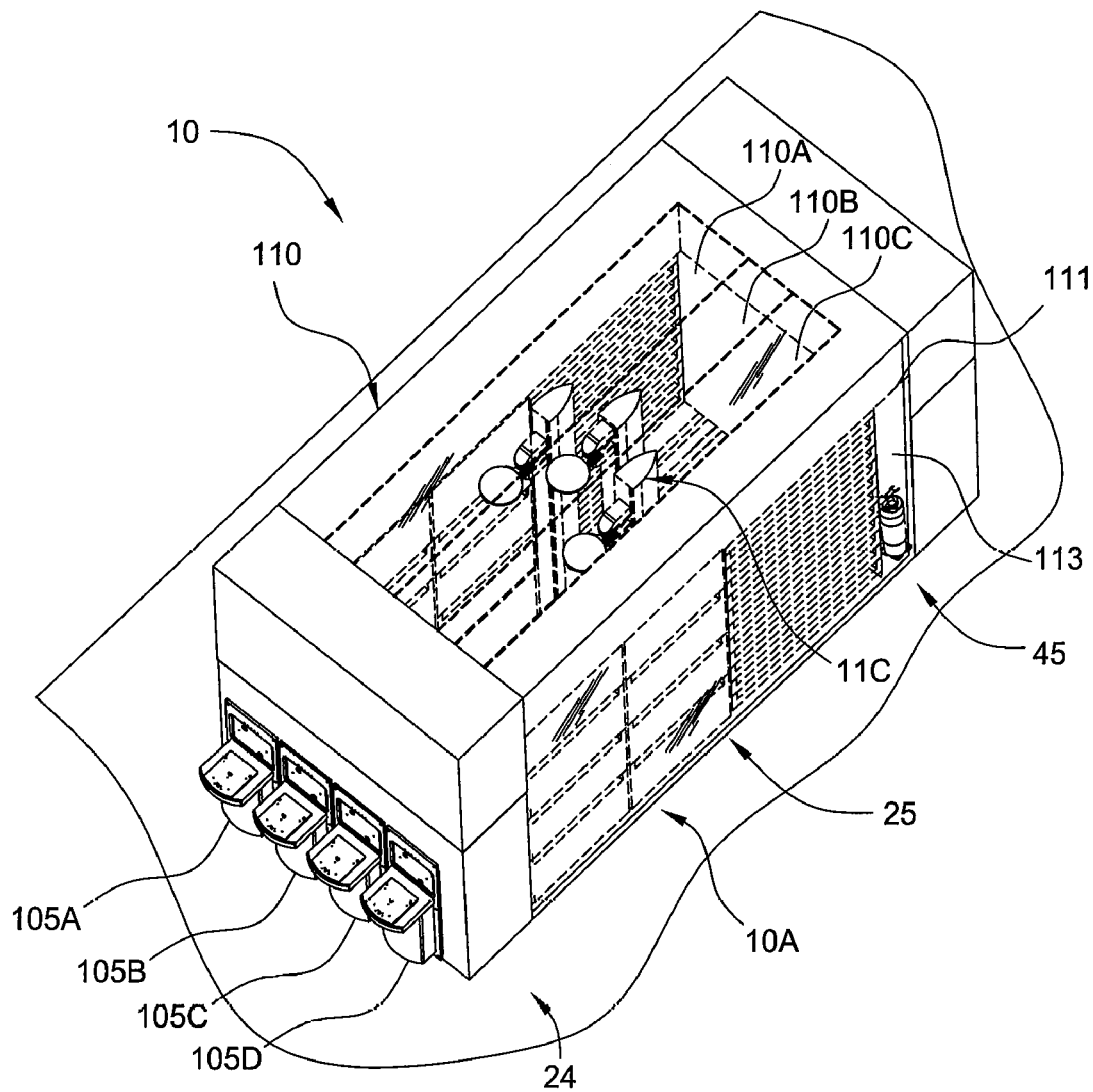
FIG. 8A is an isometric view illustrating another embodiment of a cluster tool illustrated in FIG. 1A that has an environmental enclosure attached, according to the present invention.

FIG. 8A illustrates one embodiment of the cluster tool 10 that has an attached environmental control assembly 110 that encloses the cluster tool 10 to provide controlled processing environment in which to perform the various substrate processing steps found in a desired processing sequence. FIG. 8A illustrates the cluster tool 10 configuration as illustrated in FIG. 1A with an environmental enclosure positioned over the processing chambers. The environmental control assembly 110 generally contains one or more filtration units 112, one or more fans (not shown), and an optional cluster tool base 10A. In one aspect, one or more walls 113 are added to the cluster tool 10 to enclose the cluster tool 10 and provide a controlled environment to perform the substrate processing steps. Generally the environmental control assembly 110 is adapted to control the air flow rate, flow regime (e.g., laminar or turbulent flow) and particulate contamination levels in the cluster tool 10. In one aspect, the environmental control assembly 110 may also control the air temperature, relative humidity, the amount of static charge in the air and other typical processing parameters that can be controlled by use of conventional clean room compatible heating ventilation and air conditioning (HVAC) systems. In operation the environmental control assembly 110 draws in air from a source (not shown), or region, outside of the cluster tool 10, by use of a fan (not shown) that then sends the air through a filter 111 and then through the cluster tool 10 and out of the cluster tool 10 through the cluster tool base 10A. In one aspect, the filter 111 is high efficiency particulate air (HEPA) filter. The cluster tool base 10A is generally the floor, or bottom region, of the cluster tool which contains a number of slots 10B (FIG. 12A) or other perforation that allow the air pushed through the cluster tool 10 by the fan(s) to exit the cluster tool 10.

FIG. 8A further illustrates one embodiment of the environmental control assembly 110 that has multiple separate environmental control assemblies 11A-C that provide controlled processing environment in which to perform the various substrate processing steps found in a desired processing sequence. The separate environmental control assemblies 110A-C, are each positioned over each of the robot assemblies 11 (e.g., elements 11A, 11B, etc. in FIGS. 1-6) in the central module 25 to separately control the air flow over the each robot assemblies 11. This configuration may be especially advantageous in the configurations illustrated in FIGS. 3A and 4A, since the robot assemblies are physically isolated from each other by the processing racks. Each of the separate environmental control assemblies 11A-C generally contains a filtration unit 112, a fan (not shown) and an optional cluster tool base 10A to exhaust the controlled air.

Figure 8B:
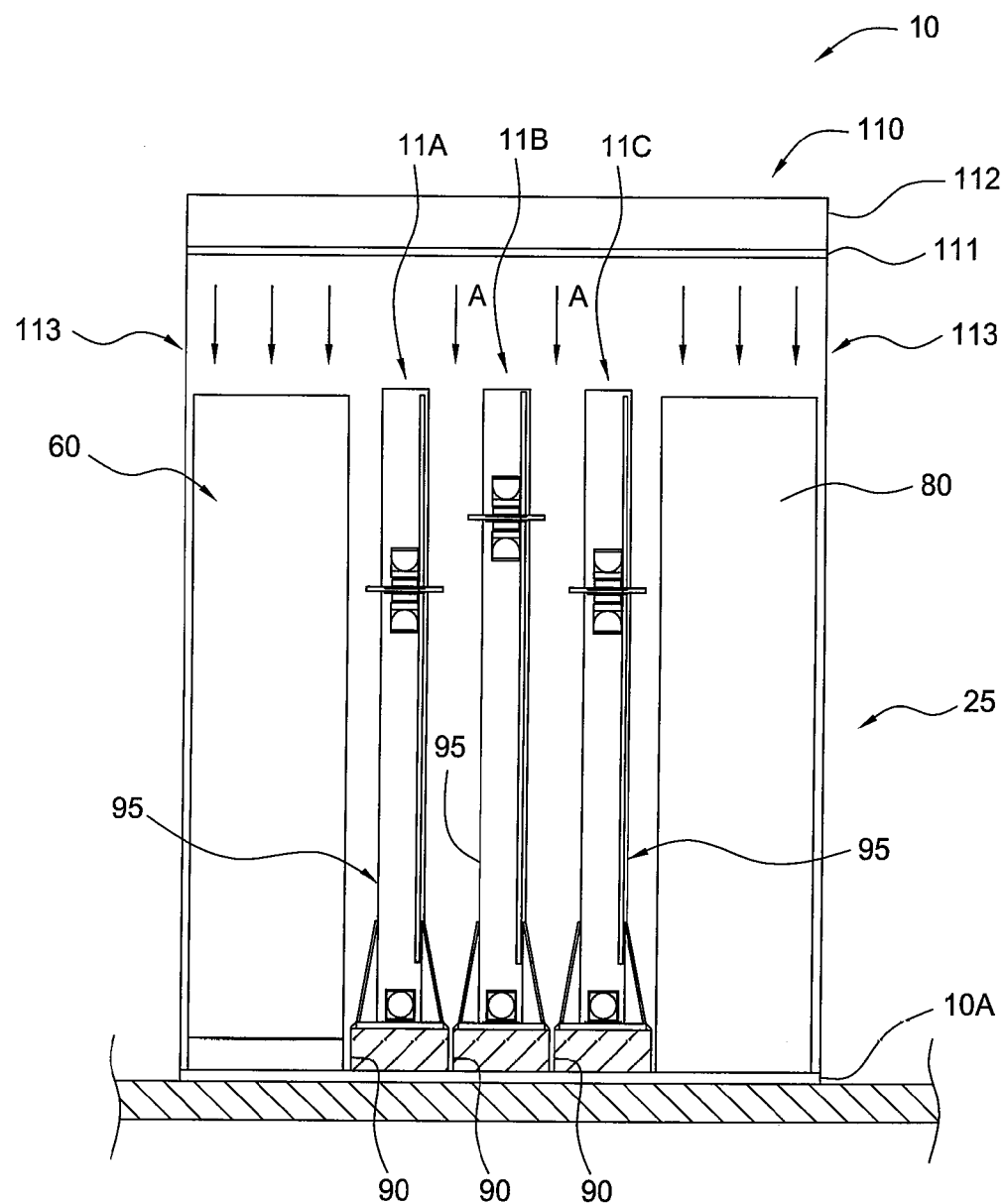
FIG. 8B is a cross-sectional view of the cluster tool illustrated in FIG. 8A, according to the present invention.

FIG. 8B illustrates a cross-sectional view of an environmental control assembly 110 that has a single filtration unit 112 which is mounted on a cluster tool 10 and is viewed using a cross-sectional plane oriented parallel to the y and z directions. In this configuration the environmental control assembly 110 has a single filtration unit 112, one or more fans (not shown), and a cluster tool base 10A. In this configuration the air delivered from the environmental control assembly 110 into the cluster tool 10 vertically (element "A"), around the processing racks 60, 80 and robot assemblies 11A-C, and out the cluster tool base 10A. In one aspect, the walls 113 are adapted to enclose and form a processing region inside the cluster tool 10 so that the processing environment around the processing chambers retained in the processing racks 60, 80 can be controlled by the air delivered by the environmental control assembly 110.

Figure 8C:
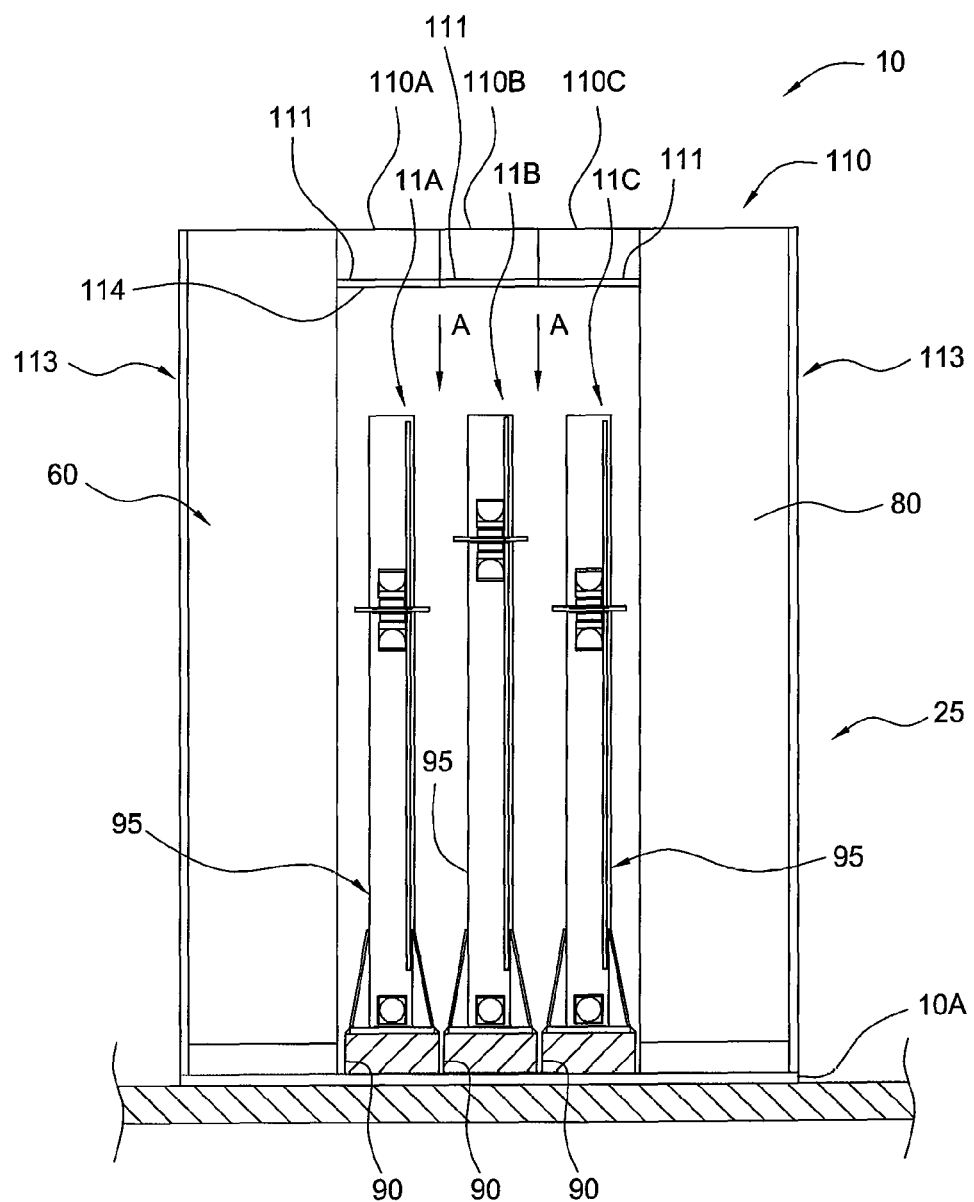
FIG. 8C is a cross-sectional view of one configuration of the according to the present invention.

FIG. 8C illustrates a cross-sectional view of an environmental control assembly 110 that has multiple separate environmental control assemblies 11A-C that are mounted on a cluster tool 10 and are viewed using a cross-sectional plane oriented parallel to the y and z directions (see FIG. 1A). In this configuration the environmental control assembly 110 contains a cluster tool base 10A, three environmental control assemblies 110A-C, a first processing rack 60 that extends to or above the lower surface 114 of the environmental control assemblies 110A-C, and a second processing rack 80 that extends to or above the lower surface 114 of the environmental control assemblies 110A-C. In general the three environmental control assemblies 110A-C will each contain one or more fans (not shown) and a filter 111. In this configuration the air delivered from each of the environmental control assemblies 110A-C into the cluster tool 10 vertically (element "A"), between the processing racks 60, 80 and robot assemblies 11A-C, and out the cluster tool base 10A. In one aspect, the walls 113 are adapted to enclose and form a processing region inside the cluster tool 10 so that the processing environment around the processing chambers retained in the processing racks 60, 80 can be controlled by the air delivered by the environmental control assembly 110.

In another embodiment, the cluster tool 10 is placed in clean room environment that is adapted to deliver low particulate containing air at a desired velocity through the cluster tool 10 and then out the cluster tool base 10A. In this configuration the environmental control assembly 110 is generally not needed, and thus is not used. The ability to control the properties air and environment around the processing chambers retained in the cluster tool 10 is an important factor in the control and/or minimization of the accumulation of particles, which can cause device yield problems caused by particulate contamination.

Robot Assemblies

In general the various embodiments of the cluster tool 10 described herein have particular advantage over prior art configurations due to the reduced cluster tool foot print created by the reduced size of the robot assemblies (e.g., element 11 in FIG. 9A) and a robot design that minimizes the physical encroachment of a robot into a space occupied by other cluster tool components (e.g., robot(s), process chambers) during the process of transferring a substrate. The reduced physical encroachment prevents collisions of the robot with other foreign components. While reducing the footprint of the cluster tool, the embodiments of the robot described herein, also has particular advantage due to the reduced number of axes that need to be controlled to perform the transferring motion. This aspect is important since it will improve the reliability of the robot assemblies and thus the cluster tool. The importance of this aspect may be better understood by noting that the reliability of a system is proportional to the product of the reliability of each component in the system. Therefore, a robot having three actuators that have a 99% up-time is always better than a robot that has four actuators having 99% up-time, since the system up-time for three actuators each having 99% up-time is 97.03% and for four actuators each having 99% up-time is 96.06%.

The embodiments of the cluster tool 10 described herein also have particular advantage over prior art configurations due to the reduced number of pass-through chambers (e.g., elements 9A-C in FIG. 1B), required to transfer a substrate though the cluster tool. The prior art cluster tool configurations commonly install two or more pass-through chambers, or of interim substrate retaining stations, in the processing sequence so that the cluster tool robots can transfer a substrate between one robot that is centrally positioned between one or more processing chambers to another robot that is centrally positioned between one or more other processing chambers during the processing sequence. The process of successively placing a substrate in multiple pass-through chambers that will not perform a subsequent processing step wastes time, decreases the availability of the robot(s), wastes space in the cluster tool, and increases the wear on the robot(s). The addition of the pass-through steps will also adversely affect device yield, due to the increase in the number of substrate handoffs which will increase the amount of backside particle contamination. Also, substrate processing sequences that contain multiple pass-through steps will inherently have different substrate wafer histories, unless the time spent in the pass-through chamber is controlled for every substrate. Controlling the time in the pass-through chamber will increase the system complexity, due to an added process variable, and it will likely hurt the maximum achievable substrate throughput. The aspects of the invention, described herein, avoid these pitfalls of the prior art configurations, since the cluster tool configuration generally only has the pass-through steps (e.g., steps 502 and 518 in FIG. 1F) before any processing has occurred on a substrate and after all of the processing steps have been completed on a substrate, and thus will generally have little to no affect on the substrates wafer history and will not significantly add to the processing sequence substrate transfer time, due to the removal of pass-through steps between the processing steps.

In a case where the system throughput is robot limited, the maximum substrate throughput of the cluster tool is governed by the total number of robot moves to complete the process sequence and the time it takes to make the robot move. The time it takes a robot to make a desired move is usually limited by robot hardware, distance between processing chambers, substrate cleanliness concerns, and system control limitations. Typically the robot move time will not vary much from one type of robot to another and is fairly consistent industry wide. Therefore, a cluster tool that inherently has fewer robot moves to complete the processing sequence will have a higher system throughput than a cluster tool that requires more moves to complete the processing sequence, such as cluster tools that contains multiple pass-through steps.

Cartesian Robot Configuration

Figure 9A:
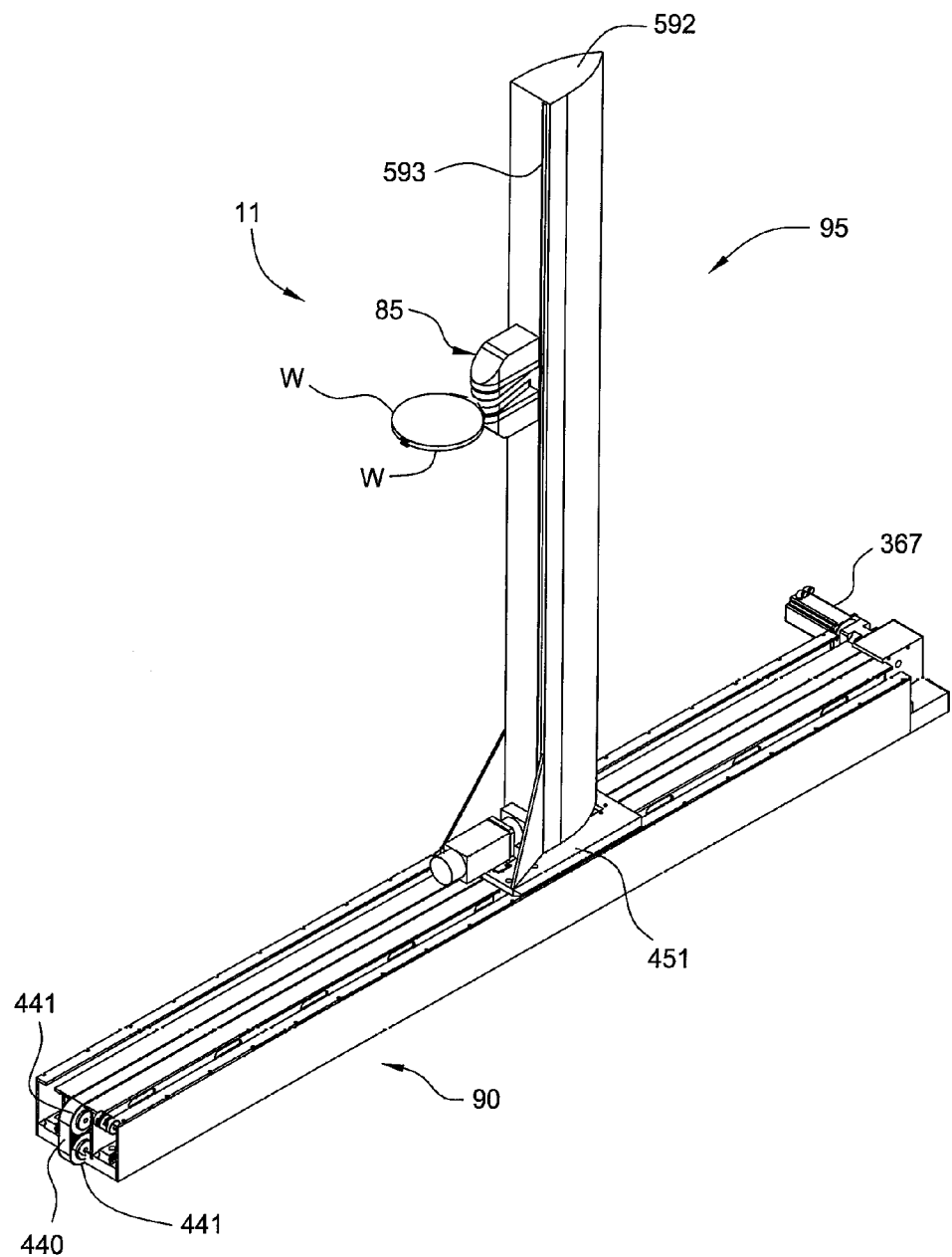
FIG. 9A is an isometric view illustrating one embodiment of a robot that may be adapted to transfer substrates in various embodiments of the cluster tool.

FIG. 9A illustrates one embodiment of a robot assembly 11 that may be used as one or more of the robot assemblies 11 (e.g., elements 11A-H shown in FIGS. 1-6 above). The robot assembly 11 generally contains a robot hardware assembly 85, one or more vertical robot assemblies 95 and one or more horizontal robot assemblies 90. A substrate can thus be positioned in any desired x, y and z position in the cluster tool 10 by the cooperative motion of the robot hardware assemblies 85, vertical robot assemblies 95 and horizontal robot assemblies 90, from commands sent by the system controller 101.

Figure 10A:
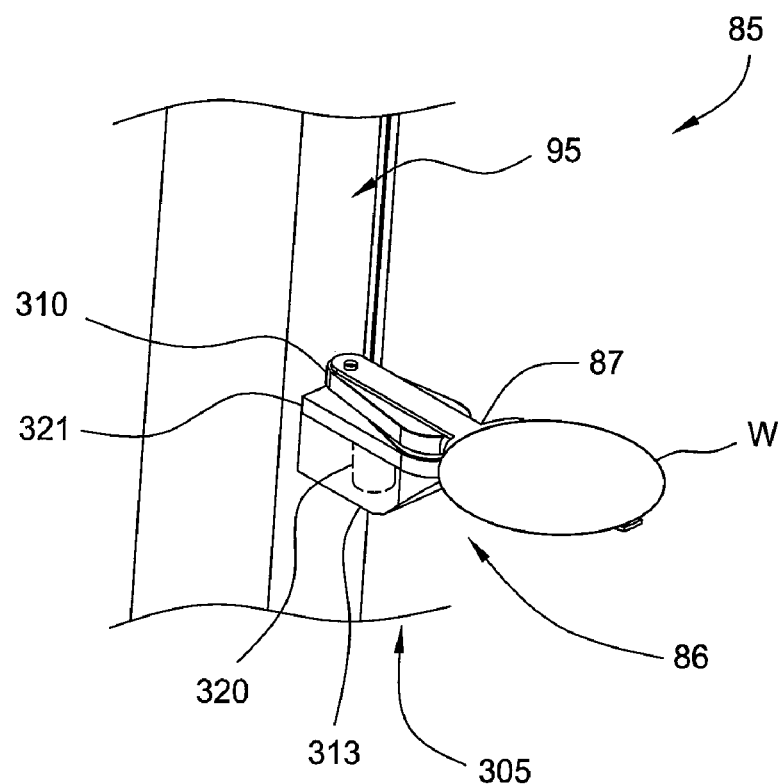
FIG. 10A is an isometric view illustrating one embodiment of a robot hardware assembly having a single robot assembly according to the present invention.
Figure 10B:
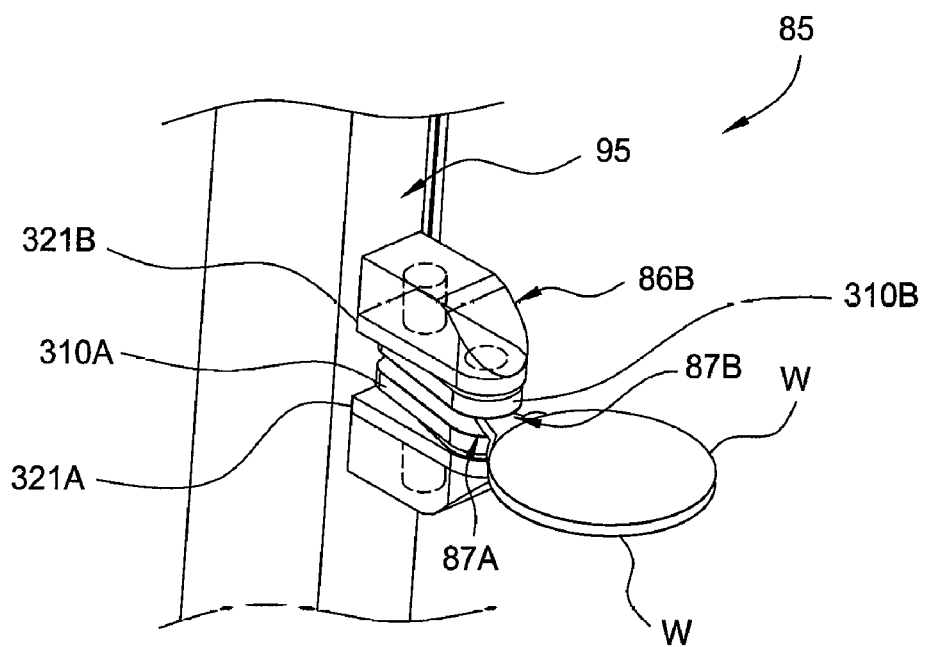
FIG. 10B is an isometric view illustrating one embodiment of a robot hardware assembly having a dual robot assembly according to the present invention.

The robot hardware assembly 85 generally contains one or more transfer robot assemblies 86 that are adapted to retain, transfer and position one or more substrates by use of commands sent from the system controller 101. In one embodiment, the transfer robot assemblies 86 shown in FIGS. 9-11 are adapted to transfer the substrates in a horizontal plane, such as a plane that includes the X and Y directions illustrated in FIG. 11A, due to the motion of the various transfer robot assemblies 86 components. In one aspect, the transfer robot assemblies 86 are adapted to transfer a substrate in a plane that is generally parallel to the substrate supporting surface 87C (FIG. 10C) of the robot blades 87. FIG. 10A illustrates one embodiment of the robot hardware assembly 85 that contains a single transfer robot assembly 86 that may be adapted to transfer substrates. FIG. 10B illustrates one embodiment of the robot hardware assembly 85 that contains two transfer robot assemblies 86 that are positioned in an opposing orientation to each other so that the blades 87A-B (and first linkages 310A-310B) can be placed a small distance apart. The configuration shown in FIG. 10B, or "over/under" type blade configuration, may be advantageous, for example, where it is desired to remove a substrate from a processing chamber prior to placing the next substrate to be processed in the same processing chamber, without causing the robot hardware assembly 85 to leave its basic position to move the "removed" substrate to another chamber (i.e., "swap" substrates). In another aspect, this configuration may allow the robot to fill up all of the blades and then transfer the substrates in groups of two or more substrates to a desired location in the tool. The process of grouping substrates in groups of two or more can help to improve substrate throughput in the cluster tool by reducing the number of robot movements required to transfer the substrates. While transfer robot assemblies 86 depicted in FIGS. 10A-B are the two bar linkage robot 305 type of robot (FIG. 10C), this configuration is not intended to be limiting as to the orientation and type of robot assembly that may be used in conjunction with the embodiments discussed herein. In general, the embodiment of the robot hardware assembly 85 that has two transfer robot assemblies 86, as illustrated in FIG. 10B, will have two transfer robot assemblies 86 which contain the same basic components, and thus the discussion of a single transfer robot assembly 86 hereafter, is intended to also describe the components found in the two robot assembly aspect(s).

One advantage of the cluster tool and robot configurations illustrated in FIGS. 9-11, is that the size of the region that surrounds a transfer robot assembly 86 in which the robot components and substrate are free to move without colliding with other cluster tool components external to the robot assembly 11, is minimized. The area in which the robot and substrate are free to move is known as the "transferring region" (element 91 in FIG. 11C). The transferring region 91 may generally be defined as volume (x, y and z directions) in which the robot Is free to move while a substrate is retained on a robot blade without colliding with other cluster tool components. While the transferring region may be described as a volume, often the most important aspect of the transferring region is the horizontal area (x and y-directions) which the transferring region occupies, since it directly affects a cluster tool's footprint and CoO. The horizontal area of the transferring region is an important factor in defining the footprint of the cluster tool, since the smaller the horizontal components of the transferring region, the closer the various robots assemblies (e.g., elements 11A, 11B, 11C, etc. in FIGS. 1-6) can be placed together or the closer a robot can be placed to a processing rack. One factor in the defining size of the transferring region is the need to assure that the transferring region is large enough to reduce or prevent a robot's physical encroachment into the space occupied by other cluster tool components. The embodiments described herein have particular advantage over the prior art due to the way in which the embodiments retract the robots assembly 86 components into the transferring region oriented along the transfer direction (x-direction) of the horizontal motion assembly 90.

Referring to FIG. 11J, the horizontal area can generally be broken into two components the width "$W_1$" (y-direction) and the length "L" (x-direction). The embodiments described herein have further advantage due to the reduced width "$W_1$" of the clearance area surrounding the robot to assure that the robot can reliably position a substrate into a processing chamber. The benefits of the reduced width "$W_1$," improvement over conventional multi-bar linkage selective compliance assembly robot arm (SCARA) type robots can be understood by noting that conventional SCARA robots (e.g., item CR in FIG. 11K) generally have arms (e.g., element $A_1$) that when retracted extends a distance from the center of the robot (e.g., item C), which increases the relative spacing of the robots to each other (i.e., width "$W_2$"), since the area around the robot must be clear so that the arm components can be rotationally oriented without interfering with other cluster tool components (e.g., other robots, processing rack components). The conventional SCARA type robot configurations are also more complex than some of the embodiments described herein since they also have more axes to control to cause the substrate to be oriented and positioned in a processing chamber. Referring to FIG. 11J, in one aspect, the width $W_1$ of the transferring region 91 is between about 5 and about 50 percent larger than the size of the substrate (i.e., substrate "S" FIG. 11J). In one example, where the substrate is a 300 mm semiconductor wafer the width $W_1$ of the transferring region would be between about 315 mm and about 450 mm, and preferably between about 320 mm and about 360 mm. Referring to FIG. 1B, in one example, the distance between the side 60B of the first processing rack 60 and the side 80A of the second processing rack 80 may be about 945 mm (e.g., 315%) for a 300 mm substrate processing tool. In another example, the distance between the side 60B of the first processing rack 60 and the side 80A of the second processing rack 80 may be about 1350 mm (e.g., 450%) for a 300 mm substrate processing tool. It should be noted that the transferring region is generally intended to describe a region around the robot in which it is able move once the robot blade has been retracted after picking up the substrate in a desired position until it moves to a starting position (SP) outside the next processing chamber in the processing sequence.

Two Bar Linkage Robot Assembly

Figure 10C:
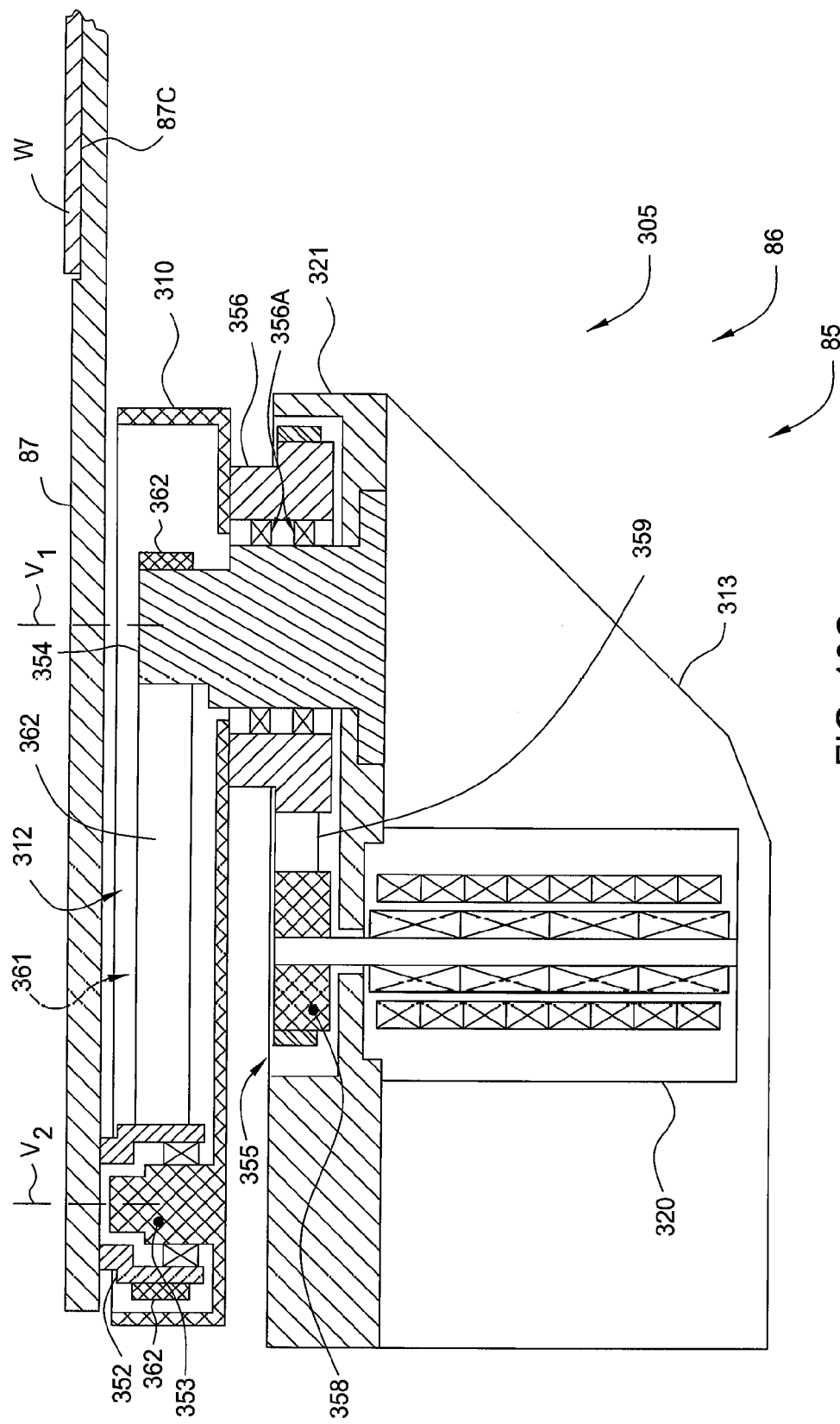
FIG. 10C is a cross-sectional view of one embodiment of the robot hardware assembly illustrated in FIG. 10A, according to the present invention.
Figure 13A:
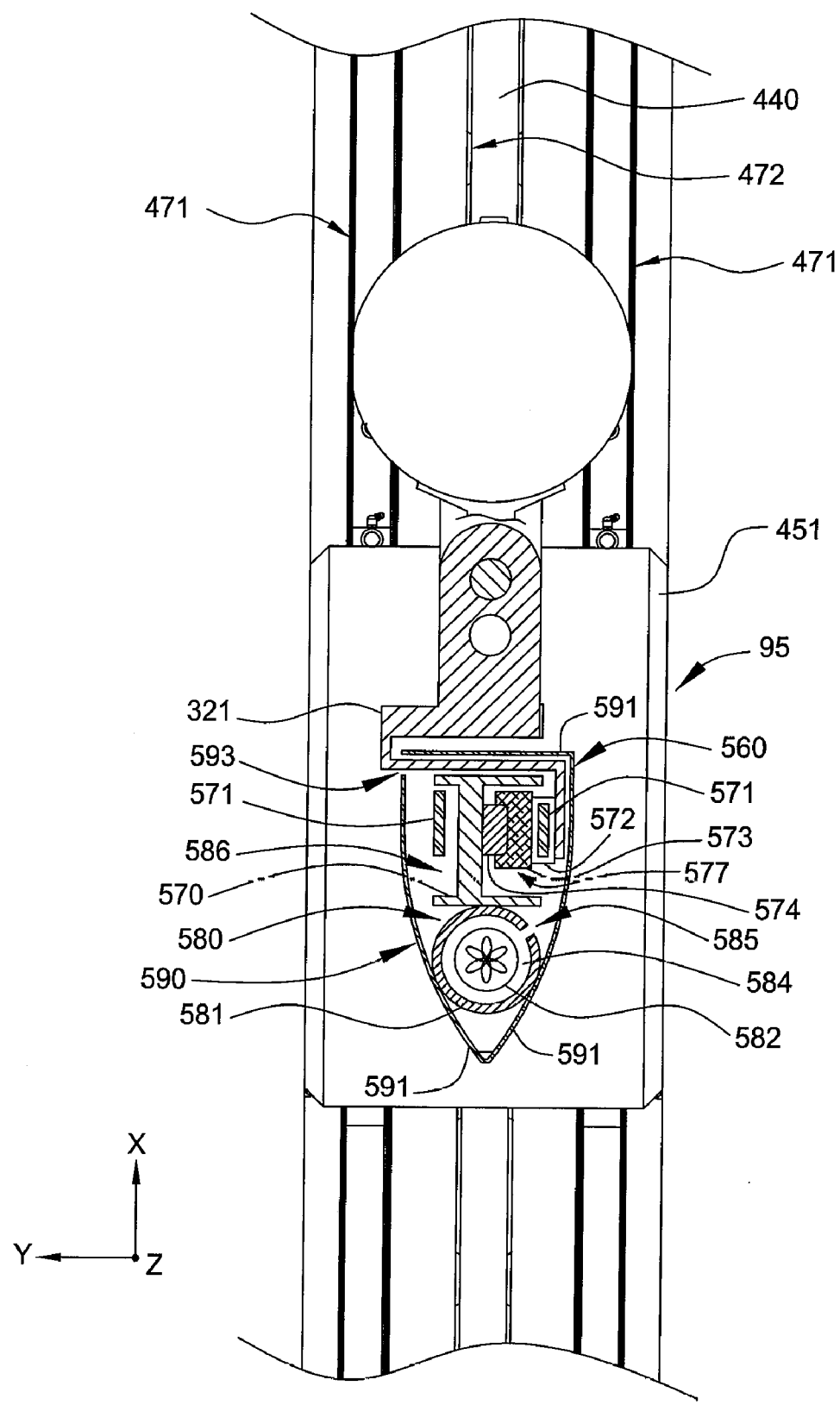
FIG. 13A is a cross-sectional view of the vertical motion assembly illustrated in FIG. 9A, according to the present invention.

FIGS. 10A and 10C, illustrates one embodiment of a two bar linkage robot 305 type of transfer robot assembly 86 that generally contains a support plate 321, a first linkage 310, a robot blade 87, a transmission system 312 (FIG. 10C), an enclosure 313 and a motor 320. In this configuration the transfer robot assembly 86 is attached to the vertical motion assembly 95 through the support plate 321 which is attached to the vertical actuator assembly 560 (FIG. 13A). FIG. 10C illustrates a side cross-sectional view of one embodiment of the two bar linkage robot 305 type of transfer robot assembly 86. The transmission system 312 in the two bar linkage robot 305 generally contains one or more power transmitting elements that are adapted to cause the movement of the robot blade 87 by motion of the power transmitting elements, such as by the rotation of motor 320. In general, the transmission system 312 may contain gears, pulleys, etc. that are adapted to transfer rotational or translation motion from one element to another. In one aspect the transmission system 312, as shown in FIG. 10C, contains a first pulley system 355 and a second pulley system 361. The first pulley system 355 has a first pulley 358 that is attached to the motor 320, a second pulley 356 attached to the first linkage 310, and a belt 359 that connects the first pulley 358 to the second pulley 356, so that the motor 320 can drive the first linkage 310. In one aspect, a plurality of bearings 356A are adapted to allow the second pulley 356 to rotate about the axis $V_1$ of the third pulley 354.

The second pulley system 361 has a third pulley 354 that is attached to support plate 321, a fourth pulley 352 that is attached to the blade 87 and a belt 362 that connects the third pulley 354 to the fourth pulley 352 so that the rotation of the first linkage 310 causes the blade 87 to rotate about the bearing axis 353 (pivot $V_2$ in FIG. 11A) coupled to the first linkage 310. When in transferring a substrate the motor drives the first pulley 358 which causes the second pulley 356 and first linkage 310 to rotate, which causes the fourth pulley 352 to rotate due to the angular rotation of the first linkage 310 and belt 362 about the stationary third pulley 354. In one embodiment, the motor 320 and system controller 101 are adapted to form a closed-loop control system that allows the angular position of the motor 320 and all the components attached thereto to be controlled. In one aspect the motor 320 is a stepper motor or DC servomotor.

In one aspect, the transmission ratio (e.g., ratio of diameters, ratio of the number of gear teeth) of the first pulley system 355 and second pulley system 361 may be designed to achieve a desired shape and resolution of the path (e.g., element $P_1$ in FIG. 11C or 11D) the substrate moves along as it is positioned by a transfer robot assembly 86. The transmission ratio will be hereafter defined as the driving element size to the driven element size, or in this case, the ratio of number of teeth of on third pulley 354 to the number of teeth on the fourth pulley 352. Therefore, for example, where the first linkage 310 is rotated 270 degrees which causes the blade 87 to rotate 180 degrees equates to a 0.667 transmission ratio or alternately a 3:2 gear ratio. The term gear ratio is meant to denote that $D_1$ number of turns of the first gear causes $D_2$ number of turns of the second gear, or an $D_1:D_2$ ratio. Therefore, a 3:2 ratio means that three turns of the first gear will cause two turns of the second gear and thus the first gear must be about two thirds the size of the second gear. In one aspect, the gear ratio of the third pulley 354 to the fourth pulley 352 is between about 3:1 to about 4:3, preferably between about 2:1 and about 3:2.

Figure 10D:
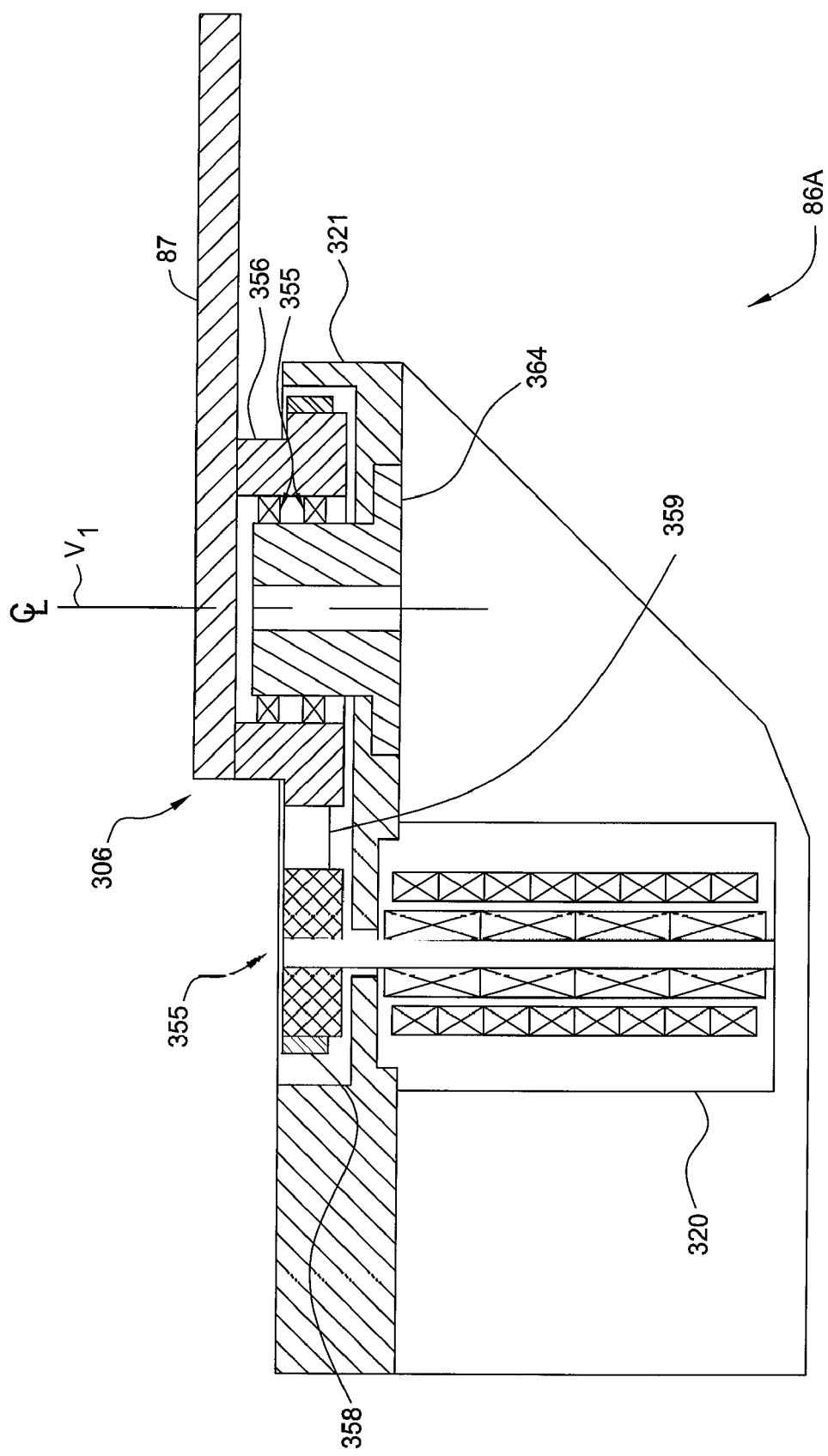
FIG. 10D is a cross-sectional view of one embodiment of a robot hardware assembly, according to the present invention.
Figure 10E:
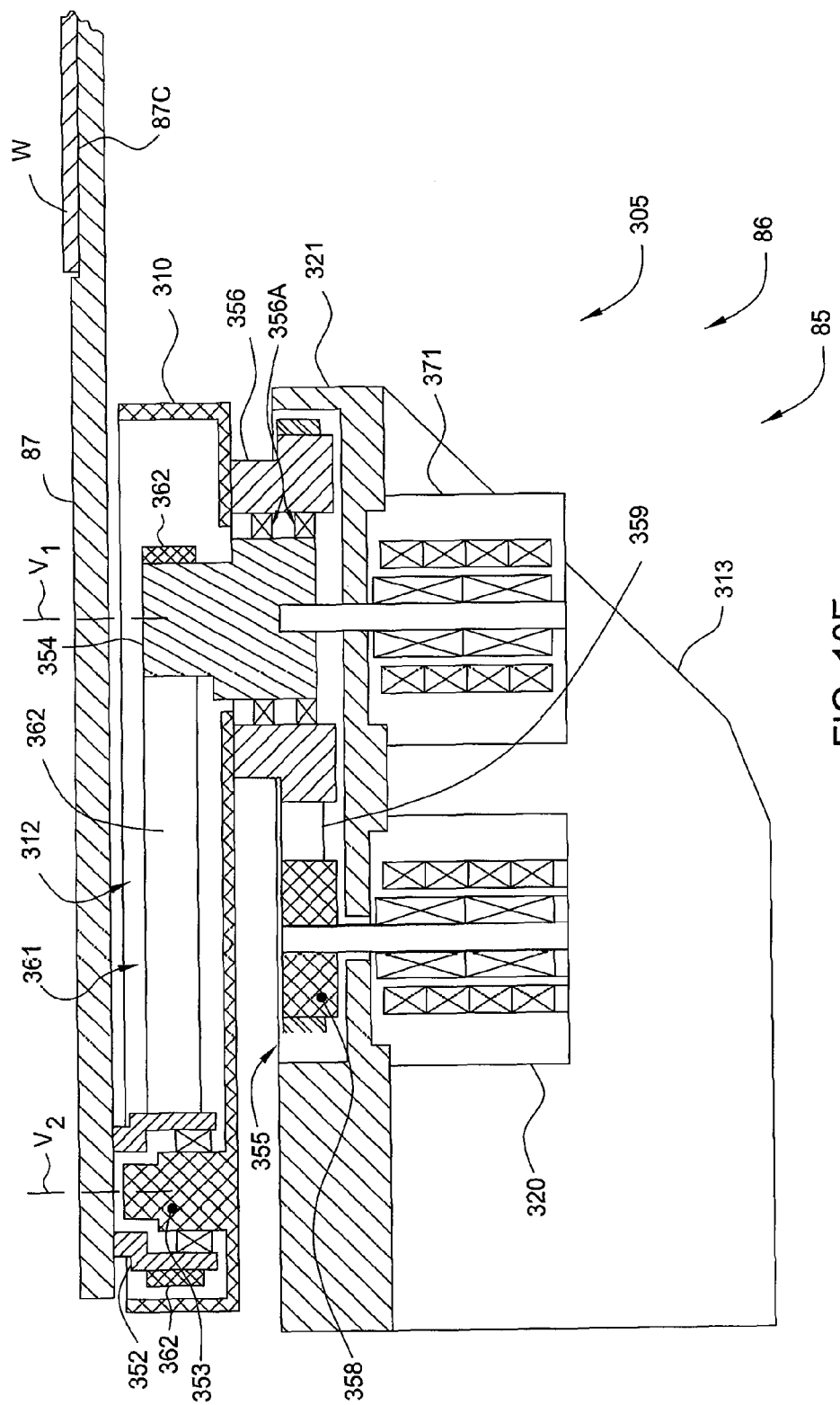
FIG. 10E is a cross-sectional view of one embodiment of the robot hardware assembly illustrated in FIG. 10A, according to the present invention.

FIG. 10E illustrates another embodiment of a two bar linkage robot 305 type of transfer robot assembly 86 that generally contains a support plate 321, a first linkage 310, a robot blade 87, a transmission system 312 (FIG. 10E), an enclosure 313, a motor 320 and a second motor 371. The embodiment illustrated in FIG. 10E is similar to the embodiment shown in FIG. 10C except in this configuration the rotational position of third pulley 354 can be adjusted by use of the second motor 371 and commands from the controller 101. Since FIG. 10C and 10E are similar like numbers are used for clarity. In this configuration the transfer robot assembly 86 is attached to the vertical motion assembly 95 through the support plate 321 which is attached to the vertical actuator assembly 560 (FIG. 13A). FIG. 10E illustrates a side cross-sectional view of one embodiment of the two bar linkage robot 305 type of transfer robot assembly 86. The transmission system 312 in the two bar linkage robot 305 generally contains two power transmitting elements that are adapted to cause the movement of the robot blade 87 by motion of the motor 320 and/or the second motor 371. In general, the transmission system 312 may contain gears, pulleys, etc. that are adapted to transfer rotational or translation motion from one element to another. In one aspect, the transmission system 312 contains a first pulley system 355 and a second pulley system 361. The first pulley system 355 has a first pulley 358 that is attached to the motor 320, a second pulley 356 attached to the first linkage 310, and a belt 359 that connects the first pulley 358 to the second pulley 356, so that the motor 320 can drive the first linkage 310. In one aspect, a plurality of bearings 356A are adapted to allow the second pulley 356 to rotate about the axis $V_1$ of the third pulley 354. In one aspect, not shown in FIG. 10E, the bearings 356A are mounted on a feature formed on the support plate 321 rather than the third pulley 354 as shown in FIG. 10E.

The second pulley system 361 has a third pulley 354 that is attached to the second motor 371, a fourth pulley 352 that is attached to the blade 87 and a belt 362 that connects the third pulley 354 to the fourth pulley 352 so that the rotation of the first linkage 310 causes the blade 87 to rotate about the bearing axis 353 (pivot $V_2$ in FIG. 11A) coupled to the first linkage 310. The second motor 371 is mounted on the support plate 321. When transferring a substrate the motor 320 drives the first pulley 358 which causes the second pulley 356 and first linkage 310 to rotate, which causes the fourth pulley 352 to rotate due to the angular rotation of the first linkage 310 and belt 362 about the third pulley 354. In this configuration, versus the configuration shown in FIG. 10C, the third pulley can be rotated while the motor 320 is rotating the first linkage 310 which allows the gear ratio between the third pulley 354 and the fourth pulley 352 to be varied by adjusting the relative motion between the third pulley 354 and the fourth pulley 352. One will note that the gear ratio affects the robot blade 87 motion relative to the first linkage 310. In this configuration the gear ratio is not fixed by the size of the gears, and may be changed in different parts of the robot blade transferring motion to achieve a desired robot blade transfer path (see FIG. 11D). In one embodiment, the motor 320, the second motor 371 and the system controller 101 are adapted to form a closed-loop control system that allows the angular position of the motor 320, the angular position of the second motor 371 and all the components attached to these elements to be controlled. In one aspect, the motor 320 and the second motor 371 are a stepper motor or DC servomotor.

FIGS. 11A-D illustrate a plan view of one embodiment of a robot assembly 11 that uses a two bar linkage robot 305 configuration to transfer and position substrates in a desired position in a second process chamber 532 retained in the cluster tool 10. The two bar linkage robot 305 generally contains a motor 320 (FIG. 10A-C), a first linkage 310 and a robot blade 87 that are connected so that rotational motion of the motor 320 causes the first linkage 310 to rotate which then causes the robot blade 87 to rotate and/or translate along a desired path. The advantage of this configuration is ability of the robot to transfer a substrate to a desired position in the cluster tool without the components of the robot extending into a space that is currently occupied, or will be occupied, by another robot or system component.

Figure 11A:
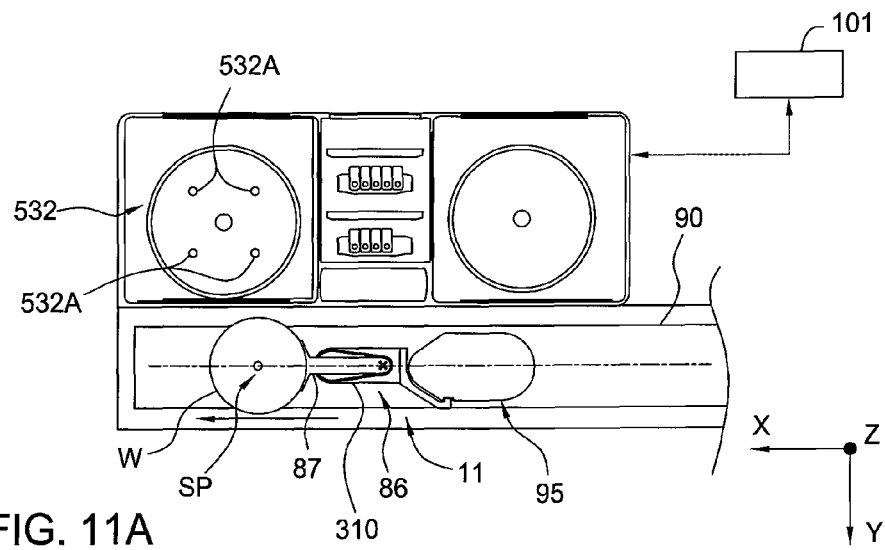
FIG. 11A is a plan view of one embodiment of robot assembly illustrating various positions of the robot blade as it transfers a substrate into a processing chamber, according to the present invention.
Figure 11B:
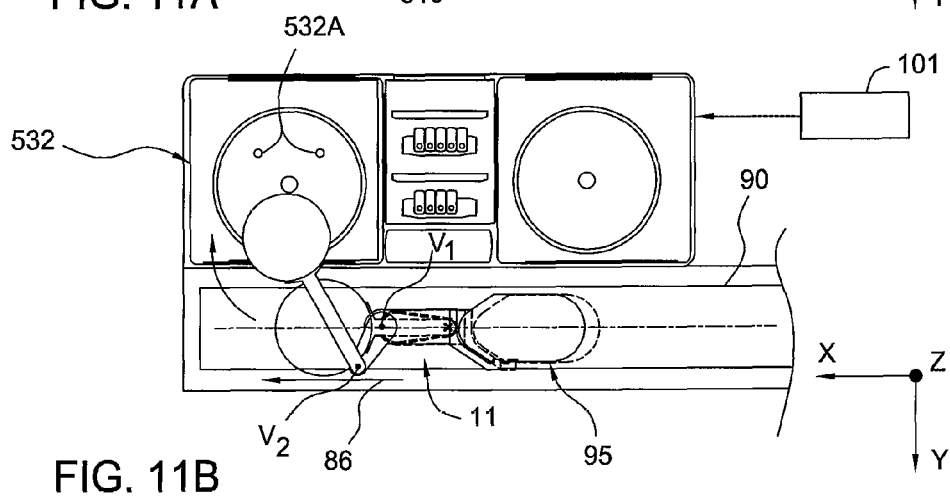
FIG. 11B illustrates various possible paths of the center of the substrate as it is transferred into a processing chamber, according to the present invention.
Figure 11C:
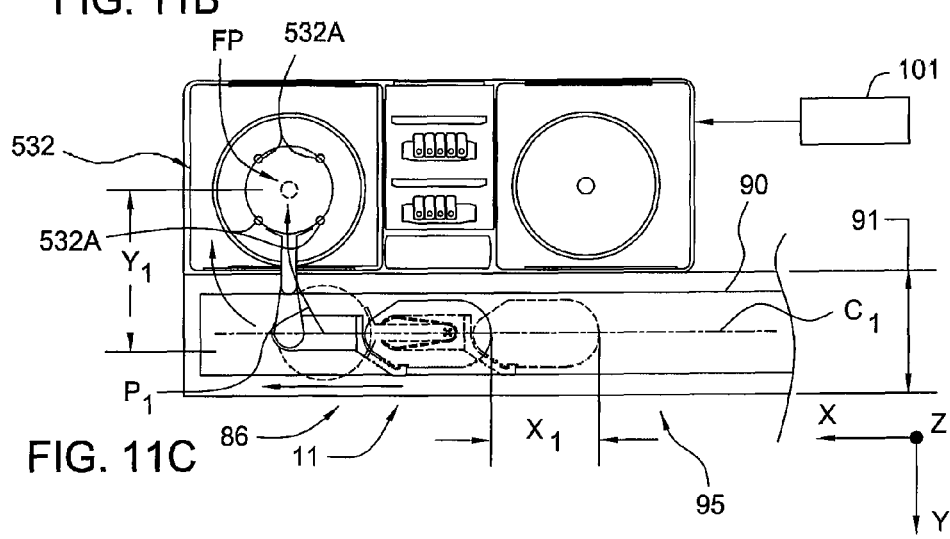
FIG. 11C is a plan view of one embodiment of robot assembly illustrating various positions of the robot blade as it transfers a substrate into a processing chamber, according to the present invention.

FIGS. 11A-C illustrates the motion of a transfer robot assembly 86, contained in a robot hardware assembly 85, by illustrating a number of sequential snapshots in time (e.g., $T_0$-$T_2$ corresponding to FIGS. 11A-C, respectively) of the position of the various transfer robot assembly 86 components as a substrate is transferred into a processing chamber 532. Referring to FIG. 11A, at time To the transfer robot assembly 86 is generally positioned in a desired vertical orientation (z-direction) by use of the vertical motion assembly 95 components and in a desired horizontal position (x-direction) by use of the horizontal motion assembly 90 components. The robot position at $T_0$, shown in FIG. 11A, will be referred to herein as the starting position (item SP). Referring to FIG. 11B, at time $T_1$ the first linkage 310, in the two bar linkage robot 305, is pivoted about pivot point $V_1$ thus causing the coupled robot blade 87 to translate and rotate about a pivot point $V_2$, while the position of the transfer robot assemblies 86 in the x-direction is adjusted by use of the horizontal motion assembly 90 components and the system controller 101. Referring to FIG. 11C, at time $T_2$ the robot blade 87 has been extended a desired distance (element $Y_1$) in the y-direction from the centerline $C_1$ of the transfer region 91 and is positioned in a desired x-direction position (element $X_1$) to place a substrate in a desired final position (item FP), or handoff position in the processing chamber 532. Once the robot has positioned the substrate in the final position the substrate can then be transferred to the process chamber substrate receiving components, such as lift pins or other substrate supporting components (e.g., elements 532A in FIG. 11A). After transferring the substrate to the process chamber receiving components the robot blade may then be retracted following the steps described above but in reverse.

FIG. 11C further illustrates an example of one possible path (item $P_1$) of the center of the substrate as it is moved from the starting position to the final position, as illustrated in FIGS. 11A-C above. In one aspect of the invention, the shape of the path can be varied by the adjustment of the rotational position of the first linkage 310 relative to the position of the transfer robot assembly 86 along the x-direction by use of the horizontal motion assembly 90. This feature has advantage since the shape of the curve can be specifically adapted to allow a robot blade 87 to access the processing chamber without colliding with the various process chamber substrate receiving components (e.g., elements 532A) or encroaching the transfer region 91 of the other robots. This advantage becomes especially apparent when a processing chamber is configured to be accessed from multiple different directions, or orientations, which thus limit the position and orientation of the substrate receiving components that can be used to reliably support a substrate and prevent a collision between the robot blade 87 and the substrate receiving components.

Figure 11D:
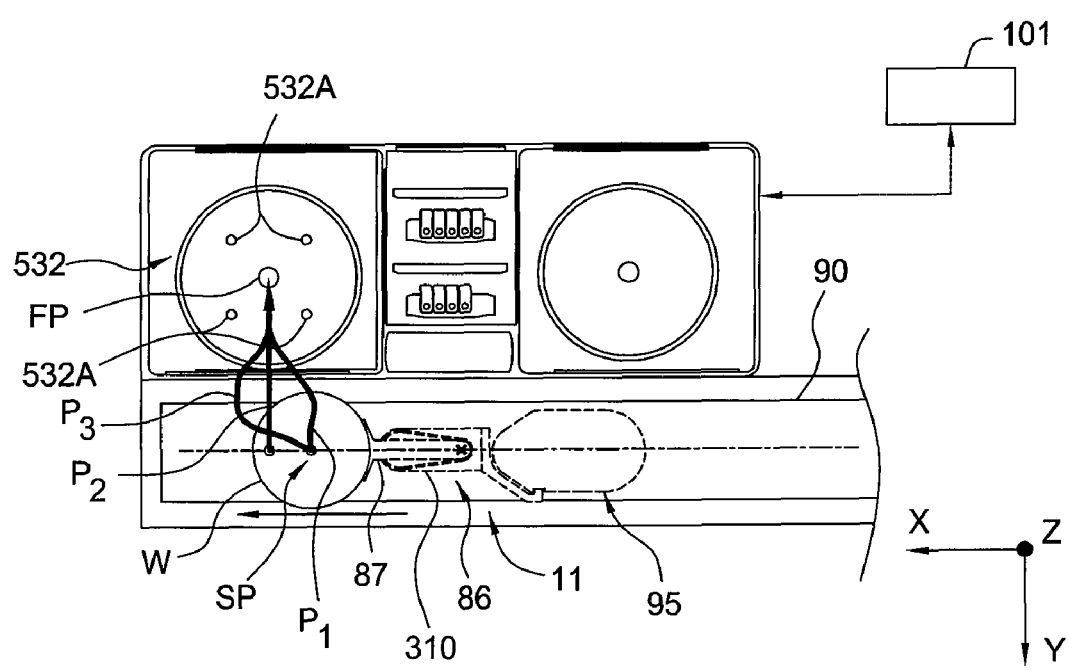
FIG. 11D is a plan view of one embodiment of robot assembly illustrating various positions of the robot blade as it transfers a substrate into a processing chamber, according to the present invention.
Figure 11E:
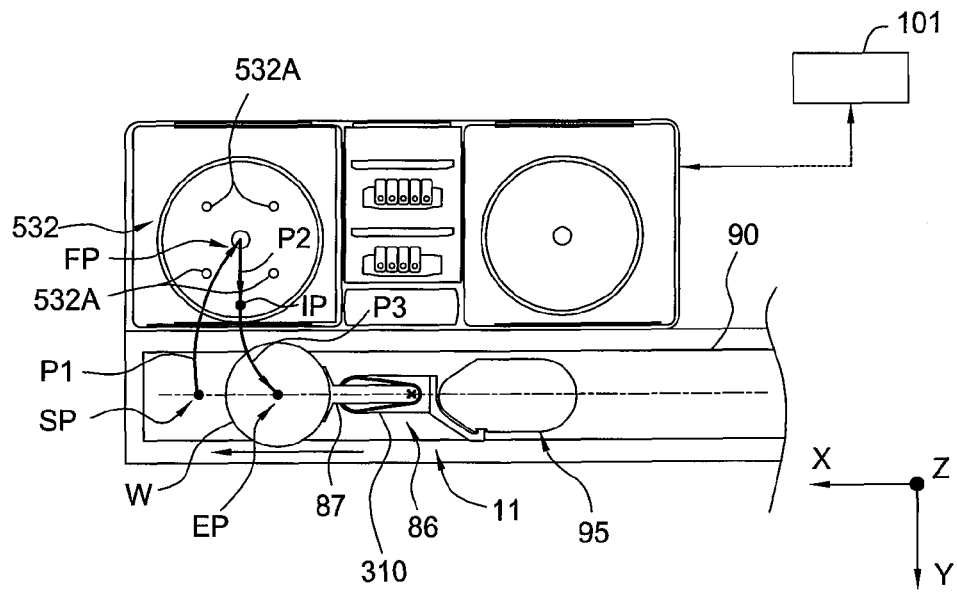
FIG. 11E is a plan view of one embodiment of robot assembly illustrating various positions of the robot blade as it transfers a substrate into a processing chamber, according to the present invention.
Figure 11F:
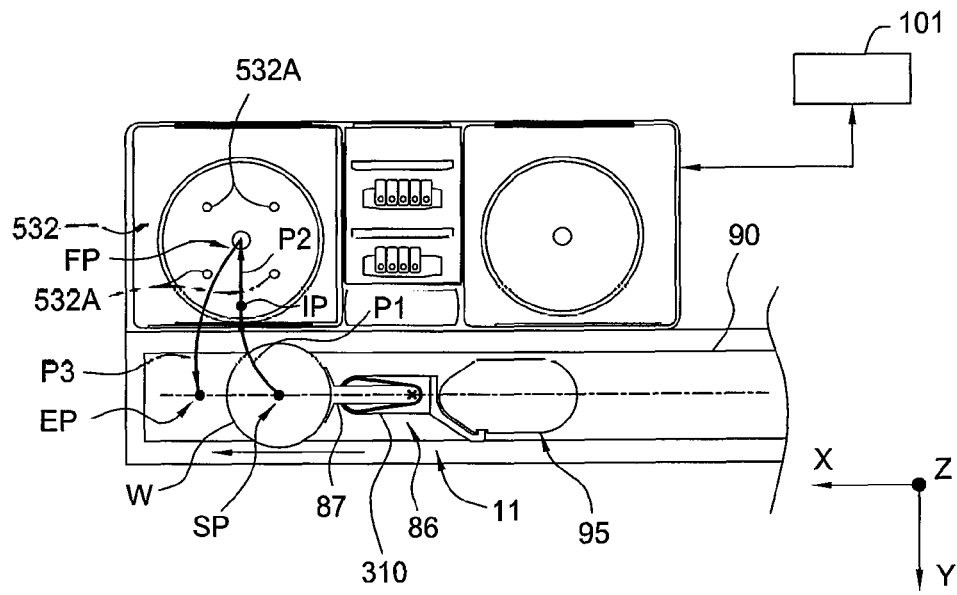
FIG. 11F is a plan view of one embodiment of robot assembly illustrating various positions of the robot blade as it transfers a substrate into a processing chamber, according to the present invention.

FIG. 11D illustrates a few examples of possible paths $P_1$-$P_3$ that may be used to transfer a substrate into a desired position in the processing chamber 532. The paths $P_1$-$P_3$ illustrated in FIGS. 11D-F are intended to show the motion of the center of the substrate, or center of the substrate supporting area of the robot blade 87, as it is positioned by the robot assembly 11 components. The substrate transfer path $P_2$ illustrated in FIG. 11D illustrates the path of a substrate when the second pulley system 361 of a transfer robot assembly 86 has a transmission ratio of 2:1. Since the motion of the substrate when using a 2:1 transmission ratio is a straight line, this configuration can remove the need to translate the robot hardware assembly 85 in the X-direction while extending the robot blade 87 in the Y-direction. The benefits of the reduced complexity of motion in this configuration may in some cases be tempered by the inability to design the reliable substrate receiving components that will not interfere with the robot blade 87 as the substrate is transferred into the processing chamber from various different sides of the processing chamber.

FIGS. 11E-11F illustrate a multistep transfer motion of a substrate into the processing chamber 532. In one embodiment, the multistep transfer motion is broken up into three transfer paths (paths $P_1$-$P_3$) which can be used to transfer the substrate into the processing chamber 532 (FIG. 11E) or out of the processing chamber (FIG. 11F). This configuration may be especially useful to reduce the high accelerations experienced by the substrate and robot assembly 11 during the transfer process and also reduce the complexity of the robot motion by use of single axis control as much as possible during the transfer process. The high accelerations experienced by the robot can generate vibrations in the robot assembly which can affect the transfer processes positional accuracy, the reliability of the robot assembly and possibly movement of the substrate on the robot blade. It is believed one cause of the high accelerations experienced by the robot assembly 11 occurs when coordinated motions are used to transfer the substrate. The term "coordinated motions" as used herein is intended to describe the movement of two or more axes (e.g., transfer robot assemblies 86, horizontal motion assembly 90, vertical motion assembly 95) at the same time to cause a substrate to move from one point to the next.

FIG. 11E illustrates a three transfer path multistep transfer motion which is used to transfer a substrate to the substrate receiving components 532A found in the processing chamber 532. Before the multistep transfer motion process is performed the transfer robot assembly 86 is generally positioned in the starting position (SP in FIG. 11E) which may require the substrate to be moved to a desired vertical orientation (z-direction) by use of the vertical motion assembly 95 components and in a desired horizontal position (x-direction) by use of the horizontal motion assembly 90 components. In one aspect, once the substrate is in the starting position the substrate is then moved along path $P_1$ to the final position (FP) by use of the transfer robot assemblies 86, the horizontal motion assembly 90 and the system controller 101. In another aspect, the substrate is positioned along path $P_1$ using a reduced number of axes of control, such as only one axis of control. For example, a single axis of control may be completed by causing the movement of the robot blade, and substrate, by the control of the transfer robot assembly 86 which is in communication with the controller 101. In this configuration the use of a single axis can greatly simplify the control of the substrate or robot blade motion and reduce the time it takes to move from the starting point to the intermediate position. The next step in the multistep transfer motion process the substrate is then transferred to the process chamber substrate receiving components, such as lift pins or other substrate supporting components (e.g., elements 532A in FIG. 11A) by moving in the z-direction by use of the vertical motion assembly 95 components or by moving the substrate receiving components 532A vertically by use of an substrate receiving component actuator (not shown). In one aspect, as shown in FIGS. 11E and 11F, the transfer robot assembly 86 is adapted to translate the substrate W in the plane that that is parallel to the X and Y directions, as illustrated by paths P1 and P3.

After transferring the substrate to the process chamber receiving components the robot blade may then be retracted following paths $P_2$ and $P_3$. The path $P_2$, in some cases may require a coordinated motion between the transfer robot assembly 86 and the horizontal motion assembly 90 to assure that the robot blade 87 does not hit the substrate supporting components 532A as it is being retracted from the processing chamber 532. In one aspect, as shown in FIG. 11E, the path $P_2$, which describes the motion of the center of the substrate supporting area of the robot blade 87, is a linear path which extends from the final position (FP) to some intermediate point (IP) between the final position and the end point (EP) position. In general, the intermediate point is a point where the robot blade has been retracted far enough so that it will not come into contact with any of the chamber components when it is moved in a simplified or accelerated motion along path $P_3$ to the endpoint point position. In one aspect, once the robot blade is in the intermediate point position the substrate is then moved along path $P_3$ to the end point by use of the transfer robot assemblies 86, the horizontal motion assembly 90 and the system controller 101. In one aspect, the substrate is positioned at the end point (EP) by use of only one axis of control, such as by motion of the transfer robot assemblies 86 which is in communication with the controller 101. In this configuration the use of a single axis can greatly simplify the control of the motion and reduce the time it takes to move from the intermediate point (IP) to the end point (EP) position.

FIG. 11F illustrates a three transfer path multistep transfer motion which is used to remove a substrate from the substrate receiving components 532A found in the processing chamber 532. Before the multistep transfer motion process, shown in FIG. 11F, is performed the transfer robot assembly 86 is generally positioned in the starting position (SP in FIG. 11F) which may require the substrate to be moved to a desired vertical orientation (z-direction) by use of the vertical motion assembly 95 components and in a desired horizontal position (x-direction) by use of the horizontal motion assembly 90 components. In one aspect, once the substrate is in the starting position the substrate is then moved along path $P_1$ to the intermediate position (IP) by use of the transfer robot assemblies 86, the horizontal motion assembly 90 and the system controller 101. In general, the intermediate point is a point where the robot blade has been inserted far enough so that it will not come into contact with any of the chamber components as it moved in a simplified or accelerated motion along path $P_1$ to the intermediate point. In another aspect, the substrate is positioned along path $P_1$ using a reduced number of axes of control, such as only one axis of control. For example, a single axis of control may be completed by causing the movement of the robot blade, and substrate, by the control of the transfer robot assembly 86 which is in communication with the controller 101. In this configuration the use of a single axis can greatly simplify the control of the substrate or robot blade motion and reduce the time it takes to move from the starting point to the intermediate position.

After transferring the substrate to the intermediate position the robot blade may then be further inserted into the chamber following paths $P_2$. The path $P_2$, in some cases may require a coordinated motion between the transfer robot assembly 86 and the horizontal motion assembly 90 to assure that the robot blade 87 does not hit the substrate supporting components 532A as it is being extended into the processing chamber 532. In one aspect, as shown in FIG. 11F, the path $P_2$, which describes the motion of the center of the substrate supporting area of the robot blade 87, is a linear path which extends from the intermediate point (IP) to the final position (FP). After the robot blade is positioned in the final position the substrate is then removed from the process chamber substrate receiving components 532A by moving the transfer robot assembly 86 in the z-direction by use of the vertical motion assembly 95 or by moving the substrate receiving components 532A vertically by use of an substrate receiving component actuator (not shown).

After removing the substrate from the process chamber receiving components the robot blade may then be retracted following paths $P_3$. The path $P_3$, in some cases may require a coordinated motion between the transfer robot assembly 86 and the horizontal motion assembly 90. In one aspect, the substrate is positioned at the end point (EP) by use of only one axis of control, such as by motion of a transfer robot assembly 86 which is in communication with the controller 101. In this configuration the use of a single axis can greatly simplify the control of the motion and reduce the time it takes to move from the final position (FP) to the end point (EP) position. In one aspect, as shown in FIG. 11F, the path $P_3$, which describes the motion of the center of the substrate supporting area of the robot blade 87, is a non-linear path which extends from the final position (FP) to some end point (EP).

Single Axis Robot Assembly

FIGS. 10D and 11G-I illustrate another embodiment of a robot assembly 11 wherein the transfer robot assembly 86A is a single axis linkage 306 (FIG. 10D) configuration to transfer and position substrates in a desired position in a second process chamber 532 retained in the cluster tool 10. The single axis linkage 306 generally contains a motor 307 (FIG. 10D) and a robot blade 87 that are connected so that rotational motion of the motor 320 causes the robot blade 87 to rotate. The advantage of this configuration is ability of the robot to transfer a substrate to a desired position in the cluster tool using only a less complicated and more cost effective single axis to control the blade 87, while also reducing the chance of extending the robot components into a space that could be occupied by another robot during the transferring process.

FIG. 10D illustrates a side cross-sectional view of a single axis linkage 306, which generally contains a motor 307, a support plate 321 and a robot blade 87 that are connected to the motor 307. In one embodiment, as shown in FIG. 10D, the robot blade 87 is connected to a first pulley system 355. The first pulley system 355 has a first pulley 358 that is attached to the motor 320, a second pulley 356 attached to the robot blade 87, and a belt 359 that connects the first pulley 358 to the second pulley 356. In this configuration the second pulley 356 is mounted on the pivot 364 that is attached to the support plate 321 through and bearings 354A, so that the motor 307 can rotate the robot blade 87. In one embodiment of the single axis linkage 306, the robot blade 87 is directly coupled to the motor 307 to reduce the number of robot components, reduce the robot assembly cost and complexity, and reduce the need to maintain the components in the first pulley system 355. The single axis linkage 306 may be advantageous due to the simplified motion control system and thus improved robot and system reliability.

Figure 11G:
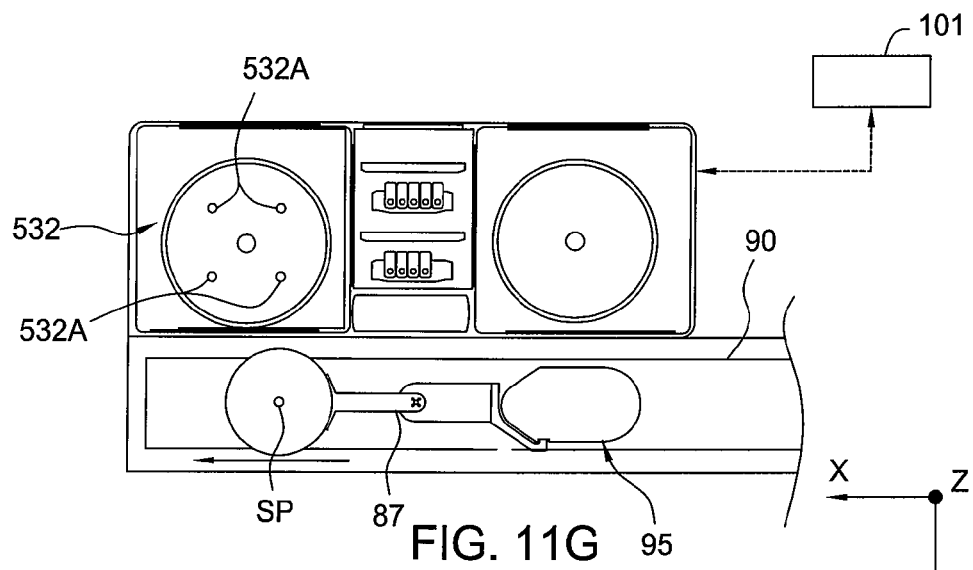
FIG. 11G is a plan view of one embodiment of robot assembly illustrating various positions of the robot blade as it transfers a substrate into a processing chamber, according to the present invention.
Figure 11H:
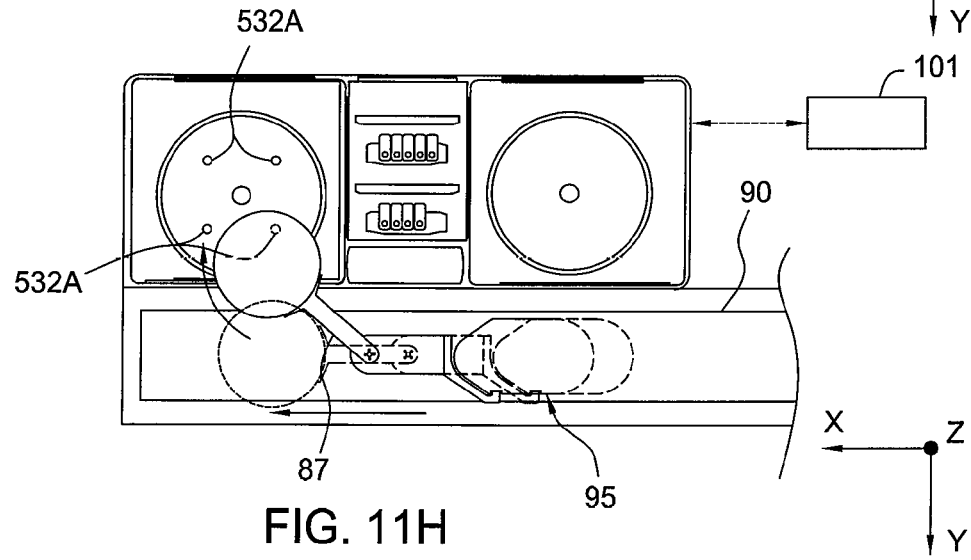
FIG. 11H is a plan view of one embodiment of robot assembly illustrating various positions of the robot blade as it transfers a substrate into a processing chamber, according to the present invention.
Figure 11I:
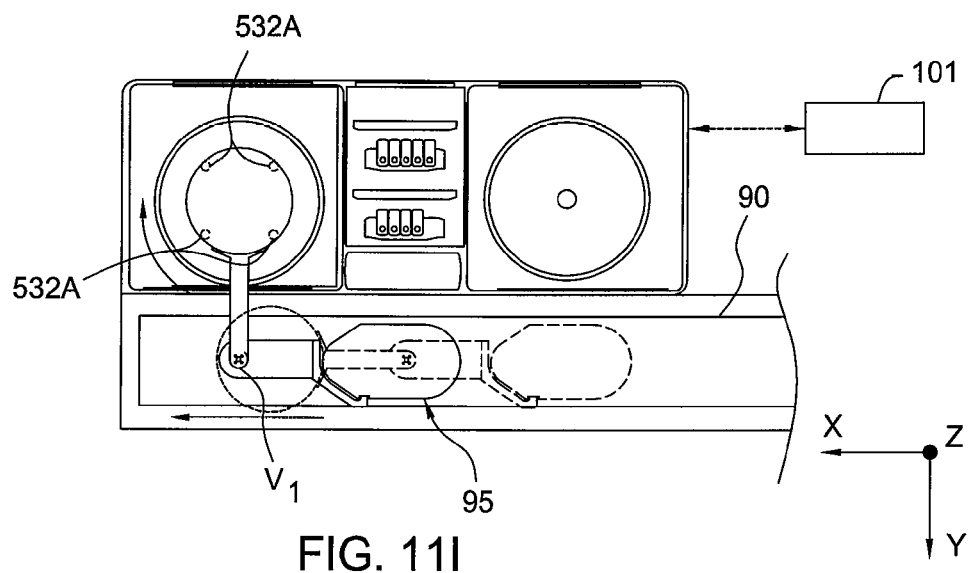
FIG. 11I is a plan view of one embodiment of robot assembly illustrating various positions of the robot blade as it transfers a substrate into a processing chamber, according to the present invention.

FIGS. 11G-J are plan views of the single axis linkage 306 type of transfer robot assembly 86, which illustrate the motion of the single axis linkage 306, by showing a number of sequential snapshots in time (e.g., items $T_0$-$T_2$) of the position of the various transfer robot assembly 86 components as a substrate is transferred into a processing chamber 532. Referring to FIG. 11G, at time $T_0$ the transfer robot assembly 86 is generally positioned in a desired vertical orientation (z-direction) by use of the vertical motion assembly 95 components and in a desired horizontal position (x-direction) by use of the horizontal motion assembly 90 components. The robot position at To, shown in FIG. 11C, will be referred to herein as the starting position (item SP discussed above). Referring to FIG. 11H, at time $T_1$ the robot blade 87 is pivoted about pivot point $V_1$ thus causing the robot blade 87 to rotate, while the position of the transfer robot assemblies 86 is adjusted in the x-direction by use of the system controller 101. Referring to FIG. 11I, at time $T_2$ the robot blade 87 has been rotated to a desired angle and the robot assembly has been positioned in a desired x-direction position so that the substrate is in a desired final position (item FP), or handoff position, in the processing chamber 532. FIG. 11D, discussed above, also illustrates a few examples of possible paths $P_1$-$P_3$ that may be used to transfer a substrate into a desired position in the processing chamber 532 by use of the single axis linkage 306. After transferring the substrate to the process chamber receiving components the robot blade may then be retracted following the steps described above but in reverse.

Horizontal Motion Assembly

Figure 12A:
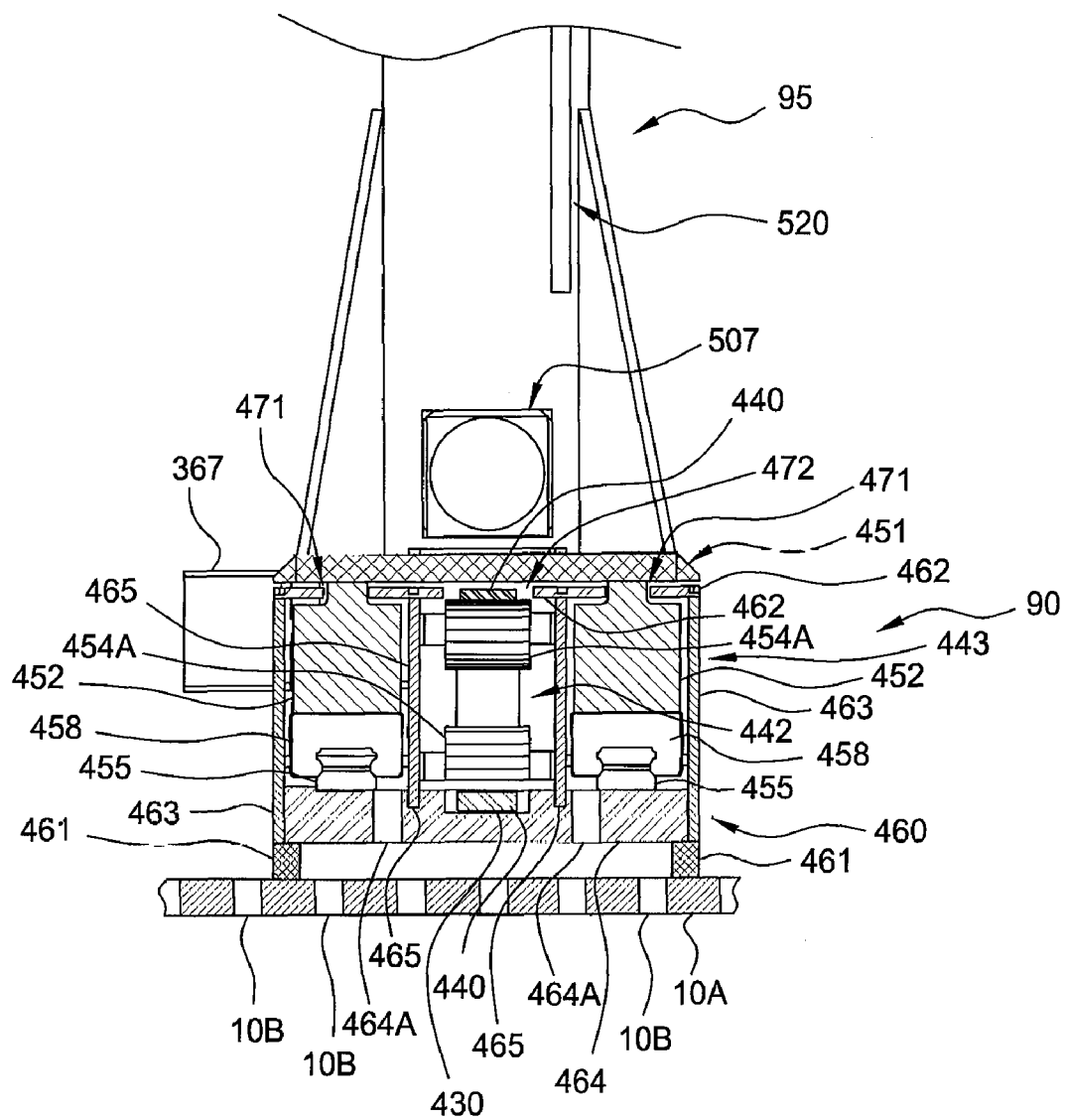
FIG. 12A is a cross-sectional view of the horizontal motion assembly illustrated in FIG. 9A, according to the present invention.
Figure 12B:
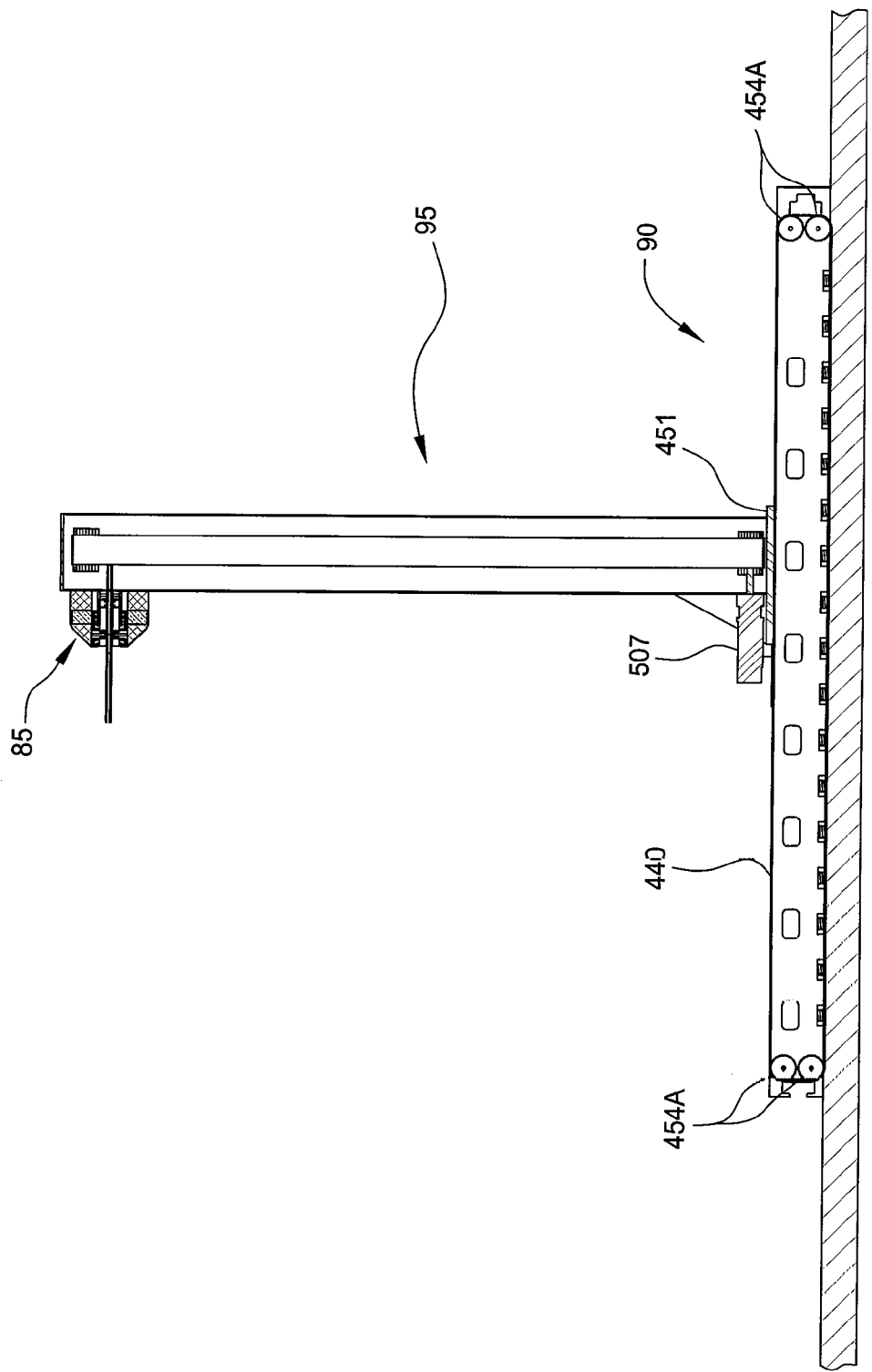
FIG. 12B is a cross-sectional view of the horizontal motion assembly illustrated in FIG. 9A, according to the present invention.

FIG. 12A illustrates a cross-sectional view of one embodiment of the horizontal motion assembly 90 taken along a plane parallel to the y-direction. FIG. 12B is a side cross-sectional view of one embodiment of the robot assembly 11 that has been centrally cut down the length of the horizontal motion assembly 90. The horizontal motion assembly 90 generally contains an enclosure 460, an actuator assembly 443 and a sled mount 451. The actuator assembly 443 generally contains at least one horizontal linear slide assembly 468 and a motion assembly 442. The vertical motion assembly 95 is attached to the horizontal motion assembly 90 through the sled mount 451. The sled mount 451 is a structural piece that supports the various loads created as the vertical motion assembly 95 is positioned by the horizontal motion assembly 90. The horizontal motion assembly 90 generally contains two horizontal linear slide assemblies 468 that each have a linear rail 455, a bearing block 458 and a support mount 452 that support the weight of the sled mount 451 and vertical motion assembly 95. This configuration thus allows for a smooth and precise translation of the vertical motion assembly 95 along the length of the horizontal motion assembly 90. The linear rail 455 and the bearing block 458 may be linear ball bearing slides or a conventional linear guide, which are well known in the art.

Referring to FIGS. 12A-B, the motion assembly 442 generally contains sled mount 451, a horizontal robot actuator 367 (FIGS. 10A and 12A), a drive belt 440, and two or more drive belt pulleys 454A that are adapted to control the position of the vertical motion assembly 95 along the length of the horizontal motion assembly 90. In general, the drive belt 440 is attached to the sled mount 451 (e.g., bonded, bolted or clamped) to form a continuous loop that runs along the length of the horizontal motion assembly 90 and is supported at the ends of the horizontal motion assembly 90 by the two or more drive belt pulleys 454A. FIG. 12B illustrates one configuration that has four drive belt pulleys 454A. In one embodiment, the horizontal robot actuator 367 is attached to one of the drive belt pulleys 454A so that rotational motion of the pulley 454A will cause the drive belt 440 and the sled mount 451, which is attached to the vertical motion assembly 95, to move along the horizontal linear slide assemblies 468. In one embodiment, the horizontal robot actuator 367 is a direct drive linear brushless servomotor, which is adapted to move the robot relative to the horizontal linear slide assembly 468.

The enclosure 460 generally contains a base 464, one or more exterior walls 463 and an enclosure top plate 462. The enclosure 460 is adapted to cover and support the components in the horizontal motion assembly 90, for safety and contamination reduction reasons. Since particles are generated by mechanical components that roll, slide, or come in contact with each other, it is important to assure that the components in the horizontal motion assembly 90 do not contaminate the substrate surface while the substrates are transferred through the cluster tool 10. The enclosure 460 thus forms an enclosed region that minimizes the chance that particles generated inside the enclosure 460 will make their way to the surface of a substrate. Particulate contamination has direct effect on device yield and thus CoO of the cluster tool.

The enclosure top plate 462 contains a plurality of slots 471 that allow the plurality of support mounts 452 in the horizontal linear slide assemblies 468 to extend through the enclosure top plate 462 and connect to the sled mount 451. In one aspect, the width of the slots 471 (size of the opening in the y-direction) are sized to minimize the chance of particles making their way outside of the horizontal motion assembly 90.

The base 464 of the enclosure 460 is a structural member that is designed to support the loads created by the weight of the sled mount 451 and vertical motion assembly 95, and loads created by the movement of the vertical motion assembly 95. In one aspect, the base 464 further contains a plurality of base slots 464A that are positioned along the length of the horizontal motion assembly 90 to allow air entering the slots 471 of the enclosure top plate 462 to exit the enclosure through the base slots 464A and out the slots 10B formed in the cluster tool base 10A. In one embodiment of the cluster tool 10, no cluster tool base 10A is used and thus the horizontal motion assembly 90 and processing racks may be positioned on the floor of the region in which the cluster tool 10 is installed. In one aspect, the base 464 is positioned above the cluster tool base 10A, or floor, by use of the enclosure supports 461 to provide an unrestricted and uniform flow path for air to flow through the horizontal motion assembly 90. In one aspect the enclosure supports 461 may also be adapted to act as conventional vibration dampers. Air flow created by the environmental control assembly 110 or clean room environment that flows through the enclosure 460 in one direction, preferably downward, will help to reduce the possibility of particles generated inside the enclosure 460 from making its way to the substrate surface. In one aspect, the slots 471 formed in the enclosure top plate 462 and the base slots 464A are designed to restrict the volume of air flowing from the environmental control assembly 110 so that a pressure drop of at least a 0.1" wg is achieved between the outside of the enclosure top plate 462 to the interior region of the enclosure 460. In one aspect, a central region 430 of the enclosure 460 is formed to isolate this region from the other parts of the horizontal motion assembly by use of the internal walls 465. The addition of internal walls 465 can minimize recirculation of the air entering the enclosure 460 and acts as an air flow directing feature.

Referring to FIG. 12A and FIG. 13A, in one aspect of the enclosure 460, the drive belt is positioned to form a small gap between drive belt 440 and the drive belt slot 472 formed in the enclosure top plate 462. This configuration may be advantageous to prevent particles generated inside the enclosure 460 from making their way outside of the enclosure 460.

Figure 12C:
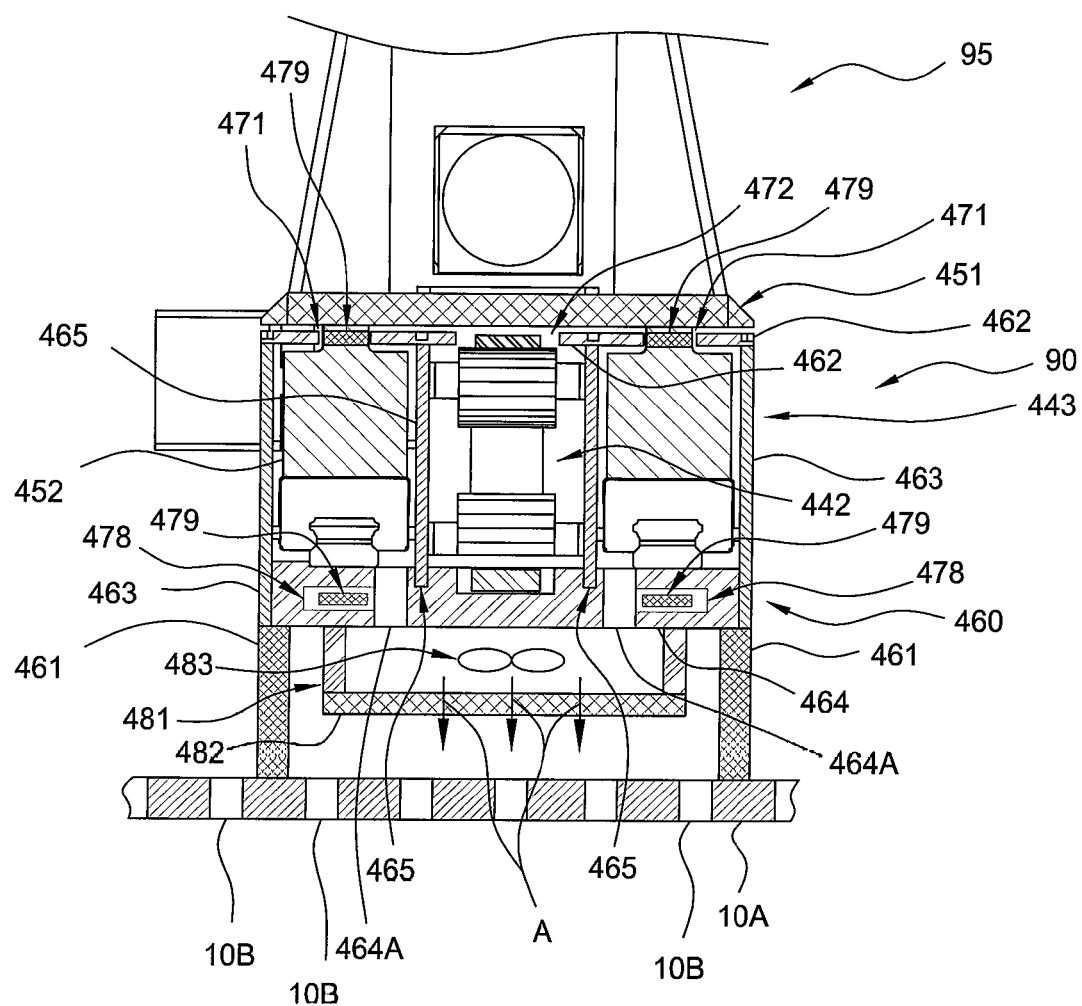
FIG. 12C is a cross-sectional view of the horizontal motion assembly illustrated in FIG. 9A, according to the present invention.

Referring to FIG. 12C, in one another aspect of the enclosure 460, a fan unit 481 may be attached to the base 464 and adapted to draw air from inside the enclosure 460 through the base slots 464A formed in the base 464. In another aspect, the fan unit 481 pushes the particulate containing air through a filter 482 to remove particles before it is exhausted (see item "A") through the cluster tool base 10A or floor. In this configuration a fan 483, contained in the fan unit, is designed to create a negative pressure inside the enclosure 460 so that air outside the enclosure is drawn into the enclosure thus limiting the possibility of particles generated inside the enclosure 460 from leaking out. In one embodiment, the filter 482 is a HEPA type filter or other type of filter that can remove the generated particulates from the air. In one aspect, the length and width of the slots 471 and the size of the fan 483 are selected so that a pressure drop created between a point external to the enclosure 460 and a point inside the enclosure 460 is between about 0.02 inches of water (~5 Pa) and about 1 inch of water (~250 Pa).

In one embodiment of the horizontal motion assembly 90, a shield belt 479 is positioned to cover the slots 471 to prevent particles generated inside of the horizontal motion assembly 90 from making there way to the substrate. In this configuration the shield belt 479 forms a continuous loop that runs along the length of the horizontal motion assembly 90 and is positioned in the slot 471 so that the open area formed between the shield belt 479 and the enclosure top plate 462 are as small as possible. In general, the shield belt 479 is attached to the support mounts 452 (e.g., bonded, bolted or clamped) to form a continuous loop that runs along the length of the horizontal motion assembly 90 and is supported at the ends of the horizontal motion assembly 90 by the two or more drive belt pulleys (not shown). In the configuration illustrated in FIG. 12C, the shield belt 479 may be attached to the support mounts 452 at the level of the slot 471 (not shown) and be looped back through the horizontal motion assembly 90 in a channel 478 machined into the base 464 to form a continuous loop. The shield belt(s) 479 thus enclose the interior region of the horizontal motion assembly 90.

Vertical Motion Assembly

Figure 13B:
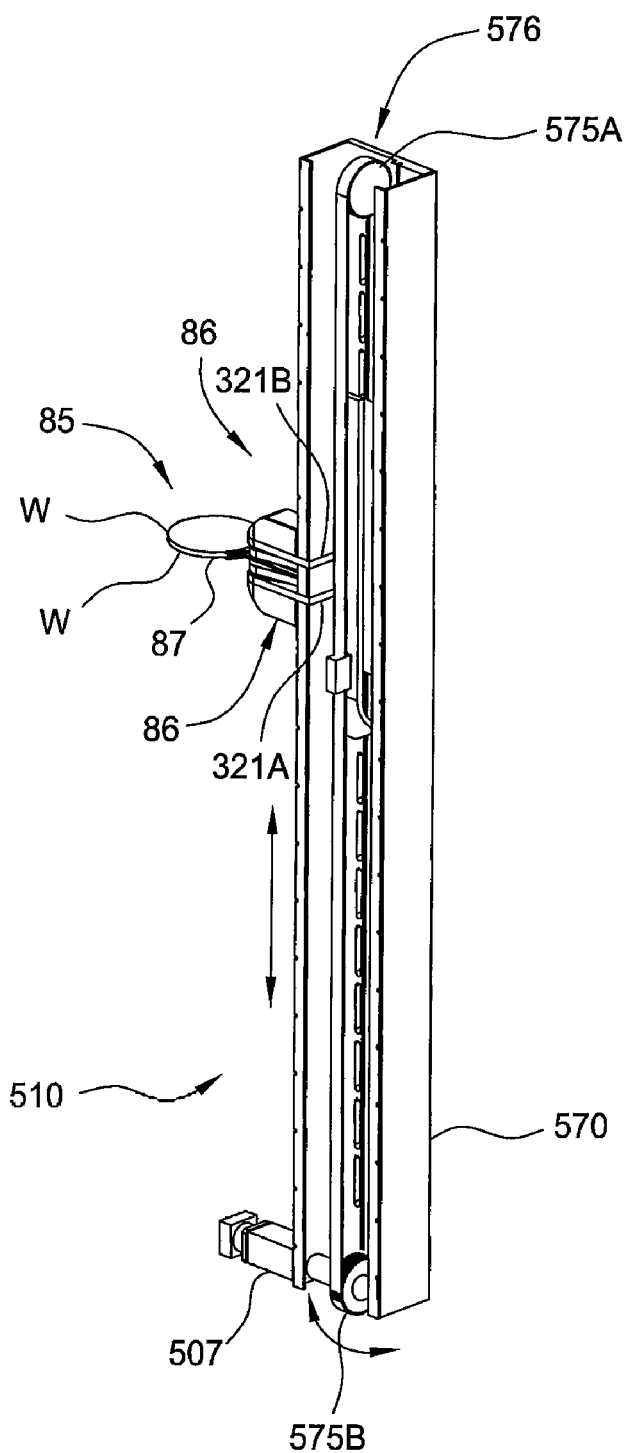
FIG. 13B is an isometric view illustrating one embodiment of a robot illustrated in FIG. 13A that may be adapted to transfer substrates in various embodiments of the cluster tool.

FIGS. 13A-B illustrate one embodiment of the vertical motion assembly 95. FIG. 13A is a plan view of the vertical motion assembly 95 illustrating the various aspects of the design. The vertical motion assembly 95 generally contains a vertical support 570, vertical actuator assembly 560, a fan assembly 580, a support plate 321, and a vertical enclosure 590. The vertical support 570 is generally a structural member that is bolted, welded, or mounted to the sled mount 451, and is adapted to support the various components found in the vertical motion assembly 95.

The fan assembly 580 generally contains a fan 582 and a tube 581 that forms a plenum region 584 which is in fluid communication with the fan 582. The fan 582 is generally a device that is adapted to impart motion to air by use of some mechanical means, for example, rotating fan blades, moving bellows, moving diaphragms, or moving close toleranced mechanical gears. The fan 582 is adapted to draw a negative pressure in the interior region 586 of the enclosure 590 relative to the exterior of the enclosure 590 by creating a negative pressure in the plenum region 584 which is in fluid communication with the plurality of slots 585 formed in the tube 581 and the interior region 586. In one aspect, the number, size and distribution of the slots 585, which may be round, oval or oblong, are designed to evenly draw air from all areas of the vertical motion assembly 95. In one aspect, interior region 586 may also be adapted to house the plurality of cables (not shown) that are used to transfer signals between with the various robot hardware assembly 85 and components of vertical motion assembly 95 components with the system controller 101. In one aspect, the fan 582 is adapted to deliver the air removed from the interior region 586 into the central region 430 of the horizontal motion assembly 90 where it is then evacuated from the horizontal motion assembly 90 through the base slots 464A.

The vertical actuator assembly 560 generally contains a vertical motor 507 (FIGS. 12A and 13B), a pulley assembly 576 (FIG. 13B), and a vertical slide assembly 577. The vertical slide assembly 577 generally contains a linear rail 574 and a bearing block 573 which are attached to the vertical support 570 and the motion block 572 of the pulley assembly 576. The vertical slide assembly 577 is adapted to guide and provide smooth and precise translation of the robot hardware assembly 85 and also support the weight an loads created by the movement of the robot hardware assembly 85 along the length of the vertical motion assembly 95. The linear rail 574 and the bearing block 573 may be linear ball bearing slides, precision shaft guiding systems, or a conventional linear guide, which are well known in the art. Typical linear ball bearing slides, precision shaft guiding systems, or a conventional linear guides can be purchased from SKF USA Inc., or the Daedal Division of Parker Hannifin Corporation of Irwin, Pa.

Referring to FIGS. 13A and 13B, the pulley assembly 576 generally contains a drive belt 571, a motion block 572 and two or more pulleys 575 (e.g., elements 575A and 575B) which are rotationally attached to the vertical support 570 and vertical motor 507 so that a support plate (e.g., elements 321A-321B in FIG. 13B), and thus robot hardware assembly 85, can be positioned along the length of the vertical motion assembly 95. In general, the drive belt 571 is attached to the motion block 572 (e.g., bonded, bolted or clamped) to form a continuous loop that runs along the length of the vertical motion assembly 95 and is supported at the ends of the vertical motion assembly 95 by the two or more drive belt pulleys 575 (e.g., elements 575A and 575B). FIG. 13B illustrates one configuration that has two drive belt pulleys 575A-B. In one aspect, the vertical motor 507 is attached to one of the drive belt pulley 575B so that rotational motion of the pulley 575B will cause the drive belt 571 and the support plate(s), and thus robot hardware assembly 85, to move along the vertical linear slide assemblies 577. In one embodiment, the vertical motor 507 is a direct drive linear brushless servomotor, which is adapted to move the robot hardware assembly 85 relative to the vertical slide assembly 577 and thus the drive belt 571 and two or more pulleys 575 are not required.

The vertical enclosure 590 generally contains a one or more exterior walls 591 and an enclosure top 592 (FIG. 9A) and slot 593 (FIGS. 9A, 12A and 13A). The vertical enclosure 590 is adapted to cover the components in the vertical motion assembly 95, for safety and contamination reduction reasons. In one aspect, the vertical enclosure 590 is attached and supported by the vertical support 570. Since particles are generated by mechanical components that roll, slide, or come in contact with each other, it is important to assure that the components in the vertical motion assembly 95 do not contaminate the substrate surface while the substrates are transferred through the cluster tool 10. The enclosure 590 thus forms an enclosed region that minimizes the chance that particles generated inside the enclosure 590 will make their way to the surface of a substrate. Particulate contamination has direct effect on device yield and thus CoO of the cluster tool. Therefore, in one aspect, the size of the slot 593 (i.e., length and width) and/or the size of the fan 582 (e.g., flow rate) are configured so that the number of particles that can escape from the vertical motion assembly 95 is minimized. In one aspect, the length (Z-direction) and width (X-direction) of the slot 593 and the size of the fan 582 are selected so that a pressure drop created between a point external to the exterior walls 591 and the interior region 586 is between about 0.02 inches of water (~5 Pa) and about 1 inch of water (~250 Pa). In one aspect, the width of the slot 593 is between about 0.25 inches and about 6 inches.

The embodiments described herein generally have advantage over the prior art designs that are adapted to lift the robot components by use of components that must fold, telescope or retract back into itself to reach their lowest position vertical position. The issue arises since the lowest position of the robot is limited by the size and orientation of the vertical motion components that must fold, telescope or retract back into itself is due to the interference of the vertical motion components. The position of the prior art vertical motion components when they cannot retract any farther is often called the "dead space," or "solid height," due to the fact that the lowest robot position is limited by the height of the retracted components. In general, the embodiments described herein get around this problem since the bottom of the one or more transfer robot assemblies 86 are not supported underneath by the components in the vertical motion assembly 95 and thus the lowest position is only limited by the length of the linear rail 574 and the size of the robot hardware assembly 85 components. In one embodiment, as illustrated in FIGS. 13A-13B, the robot assemblies are supported in a cantilever fashion by the support plate 321 that is mounted to the vertical slide assembly 577. It should be noted that the configurations of the support plate 321 and the components in the robot hardware assembly 85 as shown in FIGS. 10C-10E are not intended to be limiting to the scope of the invention described herein since the orientation of the support plate 321 and the robot hardware assembly 85 may be adjusted to achieve a desired structural stiffness, and/or desired vertical stroke of the vertical motion assembly 95.

The embodiments of the vertical motion assembly 95 described herein also have advantage over the prior art vertical movement designs, such as ones that must fold, telescope or retract back into itself, due to the improved accuracy and/or precision of the robot hardware assembly 85 motion due to the constrained motion along a vertical slide assembly 577. Thus, in one aspect of the invention, the motion of the robot hardware assemblies is always guided by a rigid member (e.g., vertical slide assembly 577) that provides a structural stiffness and positional accuracy to the components as they move along the length of the vertical motion assembly 95.

Dual Horizontal Motion Assembly Configuration

Figure 14A:
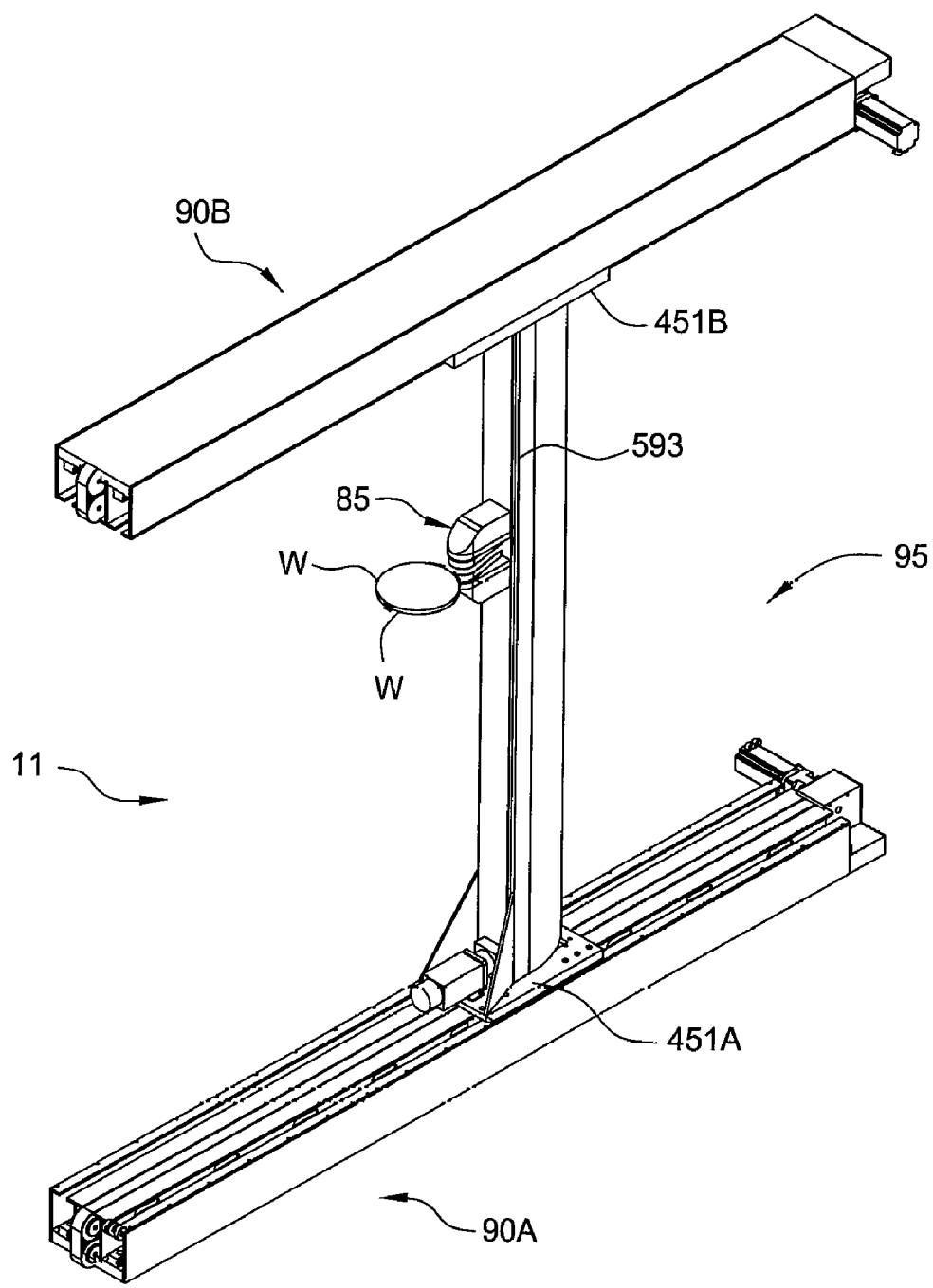
FIG. 14A is an isometric view illustrating one embodiment of a robot that may be adapted to transfer substrates in various embodiments of the cluster tool.

FIG. 14A illustrates one embodiment of a robot assembly 11 that uses a two horizontal motion assemblies 90 that may be used as one or more of the robot assemblies 11A-H shown in FIGS. 1-6 above. In this configuration the robot assembly 11 generally contains a robot hardware assembly 85, a vertical motion assembly 95 and two horizontal robot assemblies 90 (e.g., elements 90A and 90B). A substrate can thus be positioned in any desired x, y and z position by the cooperative motion of the robot hardware assemblies 85, vertical robot assemblies 95 and horizontal robot assemblies 90A-B, from commands sent by the system controller 101. One advantage of this configuration is that the stiffness of the robot assembly 11 structure during dynamic motion of the vertical motion assembly 95 along the transfer direction (x-direction) can be enhanced allowing for higher accelerations during movement and thus improved substrate transfer times.

In one aspect, the components found in the vertical motion assembly 95, the upper horizontal motion assembly 90B and the lower horizontal motion assembly 90A contain the same basic components discussed above and thus like numbers will be used where appropriate. In one aspect, vertical motion assembly 95 is connected to the lower sled mount 451A and upper sled mount 451B which are positioned along the x-direction by use of the motion assembly 442 retained in each of the horizontal motion assemblies 90A and 90B. In another embodiment of the robot assembly 11, a single motion assembly 442 mounted to one of the horizontal motion assemblies (e.g., element 90A) and the other horizontal motion assemblies (e.g., element 90B) acts as just a support to guide one end of the vertical motion assembly 95.

Substrate Grouping

In an effort to be more competitive in the market place and thus reduce cost of ownership (CoO), electronic device manufacturers often spend a large amount of time trying to optimize the process sequence and chamber processing time to achieve the greatest substrate throughput possible given the cluster tool architecture limitations and the chamber processing times. In process sequences that have short chamber processing times and have a large number of processing steps a significant portion of the time it takes to process a substrate is taken up by the processes of transferring the substrates in a cluster tool between the various processing chambers. In one embodiment of the cluster tool 10, the CoO is reduced by grouping substrates together and transferring and processing the substrates in groups of two or more. This form of parallel processing thus increases the system throughput, and reduces the number of moves a robot has to make to transfer a batch of substrates between the processing chambers, thus reducing wear on the robot and increasing system reliability.

In one embodiment of the cluster tool 10, the front end robot assembly 15, the robot assemblies 11 (e.g., elements 11A, 11B, etc. in FIGS. 1-6) and/or the rear robot assembly 40 may be adapted to transfer substrates in groups of two or more to improve the system throughput by parallel processing the substrates. For example, in one aspect, the robot hardware assembly 85 has multiple independently controllable transfer robot assemblies 86A and 86B (FIG. 10B) that are used to pick up one or more substrates from a plurality of processing chambers and then transfer and deposit the substrates in a plurality of subsequent processing chambers. In another aspect, each transfer robot assembly 86 (e.g., 86A or 86B) is adapted to separately pick-up, transfer and drop off multiple substrates. In this case, for example, a robot hardware assembly 85 that has two transfer robot assemblies 86 can be adapted to pick-up a substrate "W" using a first blade 87A, from a first processing chamber and then move to second processing chamber to pick-up a substrate using a second blade 87B, so that they can be transferred and dropped off in a group.

Figure 15A:
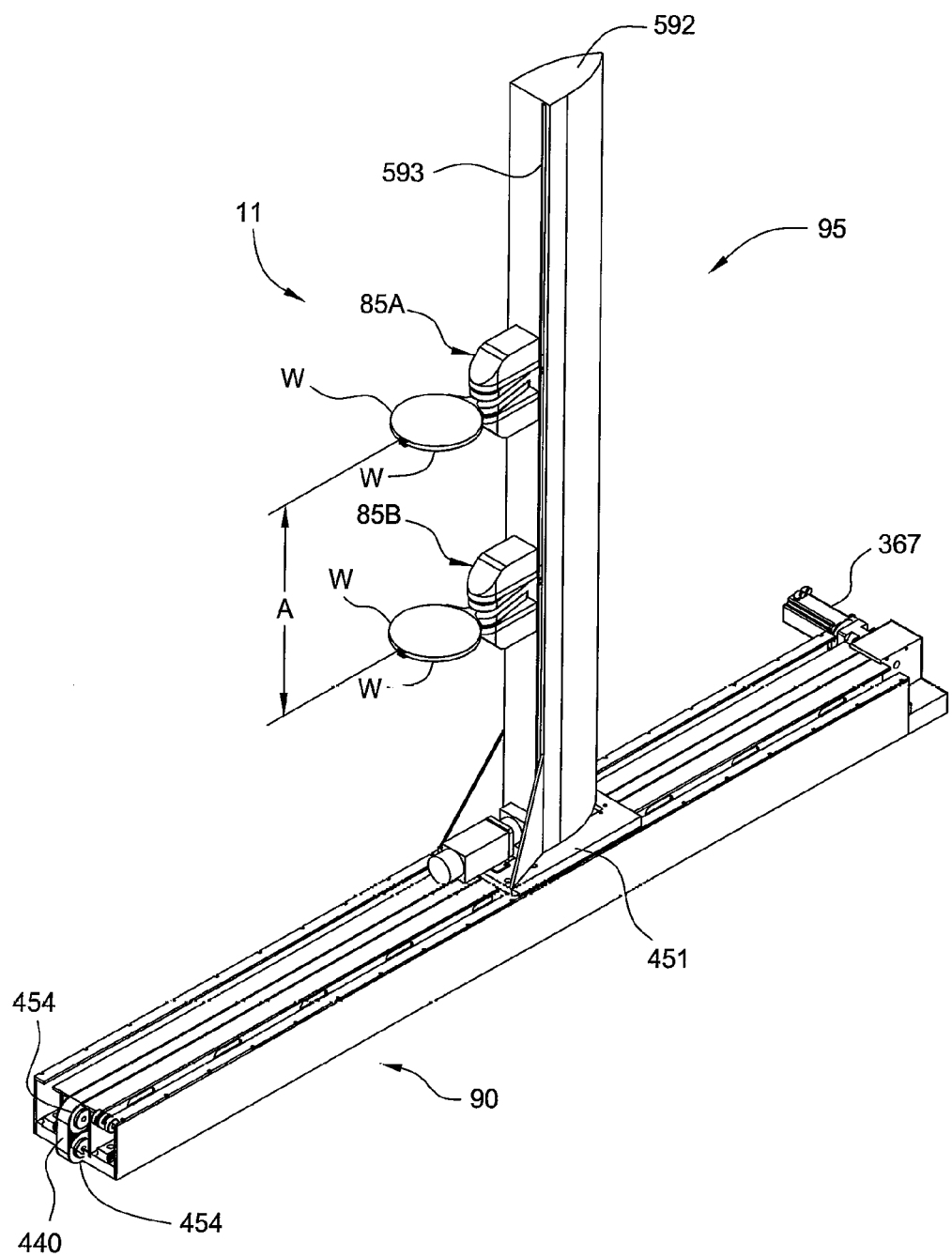
FIG. 15A is an isometric view illustrating one embodiment of a robot that may be adapted to transfer substrates in various embodiments of the cluster tool.

In one embodiment of the robot assembly 11, as illustrated in FIG. 15A, the robot hardware assembly 85 contains two robot hardware assemblies 85 (e.g., elements 85A and 85B) that have at least one transfer robot assemblies 86, which are spaced a desired distance, or pitch, apart (element "A"), and are adapted simultaneously to pick-up or drop off substrates from two different processing chambers. The spacing, or pitch A, between the two robot hardware assemblies 85 may be configured to correspond the spacing between two processing chambers mounted in one of the processing racks and thus allow the robot assembly 11 to simultaneously access the two processing chambers at once. This configuration thus has particular advantage in improving the substrate throughput and cluster tool reliability by being able to transfer two or more substrates in groups.

Robot Blade Hardware Configuration

FIGS. 16A-16D illustrate one embodiment of a robot blade assembly 900 that may be used with some of the embodiments described herein to support and retain a substrate "W" while it is transferred through the cluster tool 10 using a robot assembly 11. In one embodiment, the robot blade assembly 900 may be adapted to replace the blade 87, and thus can be coupled to the first pulley system 355 or the second pulley system 361 components illustrated in FIGS. 10A-10E at the connection point (element "CP") formed in the blade base 901. The inventive robot blade assembly 900 is adapted to hold, "grip", or restrain a substrate "W" so that the accelerations experienced by a substrate during a transferring process will not cause the substrate position to move from a known position on the robot blade assembly 900. Movement of the substrate during the transferring process will generate particles and reduce the substrate placement accuracy and repeatability by the robot. In the worst case the accelerations can cause the substrate to be dropped by the robot blade assembly 900.

The accelerations experienced by the substrate can be broken up into three components: a horizontal radial acceleration component, a horizontal axial acceleration component and a vertical acceleration component. The accelerations experienced by the substrate are generated as the substrate is accelerated or decelerated in the X, Y and Z directions during the substrate movement through the cluster tool 10. Referring to FIG. 16A, the horizontal radial acceleration component and the horizontal axial acceleration component are shown as forces $F_A$ and $F_R$, respectively. The forces experienced are related to the mass of the substrate times the acceleration of substrate minus any frictional forces created between the substrate and the robot blade assembly 900 components. In the embodiments described above, the radial acceleration is generally created as the substrate is being rotated into position by a transfer robot assembly 86 and can act in either direction (i.e., +Y or −Y directions). The axial acceleration is generally created as the substrate is positioned in the X-direction by the horizontal motion assembly 90 and/or by the motion of the transfer robot assembly 86 and can act in either direction (i.e., +X or −X directions). The vertical acceleration is generally created as the substrate is positioned in the Z-direction by the vertical motion assembly 95 and can act in either direction (i.e., +Z or −Z directions) or cantilever induced structural vibrations.

FIG. 16A is a schematic plan view of one embodiment of the robot blade assembly 900 which is adapted to support the substrate "W." The robot blade assembly 900 generally contains a blade base 901, an actuator 910, a brake mechanism 920, a position sensor 930, a clamp assembly 905, one or more reaction members 908 (e.g., one shown), and one or more substrate support components 909. The clamp assembly 905 generally contains a clamp plate 906 and one or more contact members 907 (i.e., two contact members shown in FIG. 16A) mounted on the clamp plate 906. The clamp plate 906, contact members 907, reaction member 908, and blade base 901 can be made from a metal (e.g., aluminum, nickel coated aluminum, SST), a ceramic material (e.g., silicon carbide), or a plastic material that will be able to reliably withstand the accelerations (e.g., 10-30 m/s$^2$) experienced by the robot blade assembly 900 during the transferring process and will not generate or attract particles due to the interaction with the substrate. FIG. 16B is side schematic cross-sectional view of the robot blade assembly 900 shown in FIG. 16A, which has been sectioned through the center of the robot blade assembly 900. For clarity the components positioned behind the cross-sectional plane in FIG. 16B have been left out (e.g., contact members 907), while the brake assembly 930 has been retained in this view.

Referring to FIGS. 16A and 16B, when in use the substrate "W" is pressed against the retaining surface 908B of the reaction member 908 by a holding force ($F_1$) delivered to substrate "W" by the actuator 910 through the contact members 907 in the clamp assembly 905. In one aspect, the contact members 907 are adapted to contact and urge the edge "E" of the substrate "W" against the retaining surface 908B. In one aspect, the holding force may be between about 0.01 and about 3 kilograms force (kgf). In one embodiment, as shown in FIG. 16A, it is desirable to distribute the contact members 907 an angular distance "A" apart to provide axial and radial support to the substrate as it is transferred by the robot assembly 11.

The process of restraining the substrate so that it can be reliably transferred through the cluster tool 10 using the robot blade assembly 900 will generally require three steps to complete. It should be noted that one or more of the steps described below may be completed simultaneously or sequentially without varying from the basic scope of the invention described herein. Before starting the process of picking up a substrate the clamp assembly 905 is retracted in the +X direction (not shown). The first step starts when a substrate is picked up from a substrate supporting component (e.g., elements 532A in FIG. 11A-11I, pass-through positions 9A-H in FIGS. 2A, 3A, etc.) so that the substrate rests on the substrate supporting surfaces 908A and 909A on the reaction member 908 and substrate support component 909, respectively. Next, the clamp assembly 905 is then moved in the −X direction until the substrate is restrained on the robot blade assembly 900 by the holding force ($F_1$) delivered to substrate "W" by the actuator 910 through the contact members 907 in the clamp assembly 905 and the reaction member 908. In the last step, the clamp assembly 905 is then held, or "locked", in place by the brake mechanism 920 to prevent the acceleration of the substrate during the transferring process from appreciably varying the holding force ($F_1$) and thus allow the substrate to move relative to the supporting surfaces. After the brake mechanism 920 restrains the clamp assembly 905 the substrate can then be transferred to another point in the cluster tool 10. To deposit a substrate to a substrate supporting components the steps described above can be completed in reverse.

In one aspect of the robot blade assembly 900, the brake mechanism 920 is adapted to limit the movement of the clamp assembly 905 in at least one direction (e.g., +X direction) during the transferring process. The ability to limit the motion of the clamp assembly 905 in a direction opposite to the holding force ($F_1$) supplied by the clamp assembly 905 will prevent the horizontal axial acceleration(s) from causing the holding force to appreciably decrease and thus allow the substrate to move around, which may generate particles, or from being dropped by the blade assembly 900 during the transferring process. In another aspect, the brake mechanism 920 is adapted to limit the movement of the clamp assembly 905 in at least two directions (e.g., +X and −X directions). In this configuration, the ability to limit the motion of the clamp assembly in the directions parallel to the holding force ($F_1$) direction will prevent the horizontal axial acceleration(s) from causing the holding force to appreciably increase, which may cause substrate breakage or chipping, or appreciably decrease, which may generate particles or cause the substrate to be dropped. In yet another embodiment, the brake mechanism 905 is adapted to limit all six degrees of freedom of the clamp assembly 905 to prevent, or minimize, the movement of the substrate. The ability to limit the movement of the clamp assembly 905 in a desired direction can be accomplished by using components that are adapted to restrain the motion of the clamp assembly 905. Typical components which may be used to restrain the motion of the clamp assembly 905 may include conventional latching mechanism (e.g., door latch type mechanisms) or other similar devices. In one aspect, the clamp assembly 905 motion is restrained by of a mechanism that applies a restraining force (element $F_2$ in FIG. 16A), such as the opposing brake assembly 920A discussed below.

In one embodiment, a position sensor 930 is used to sense the position of the clamp plate 906 so that the controller 101 can determine the status of the blade assembly 900 at any time during the transferring process. In one aspect, the position sensor 930 is adapted to sense that there is no substrate positioned on the blade assembly 900, or that the substrate has been misplaced on the supporting surfaces (elements 908A and 909A), by noting that the clamp plate 906 has moved too far in the −X direction due to the position of the clamp plate 906 from a force delivered by the actuator 910. Similarly, the position sensor 930 and controller 101 may be adapted to sense that a substrate is present by noting that the clamp plate 906 position is within a range of acceptable positions corresponding to when a substrate is present. In one aspect, the position sensor 930 is made up of a plurality of optical position sensors positioned at desired points, a linear variable displacement transducer (LVDT) or other comparable position sensing device that can be used to distinguish between acceptable and unacceptable positions of the clamp plate 906.

Figure 16C:
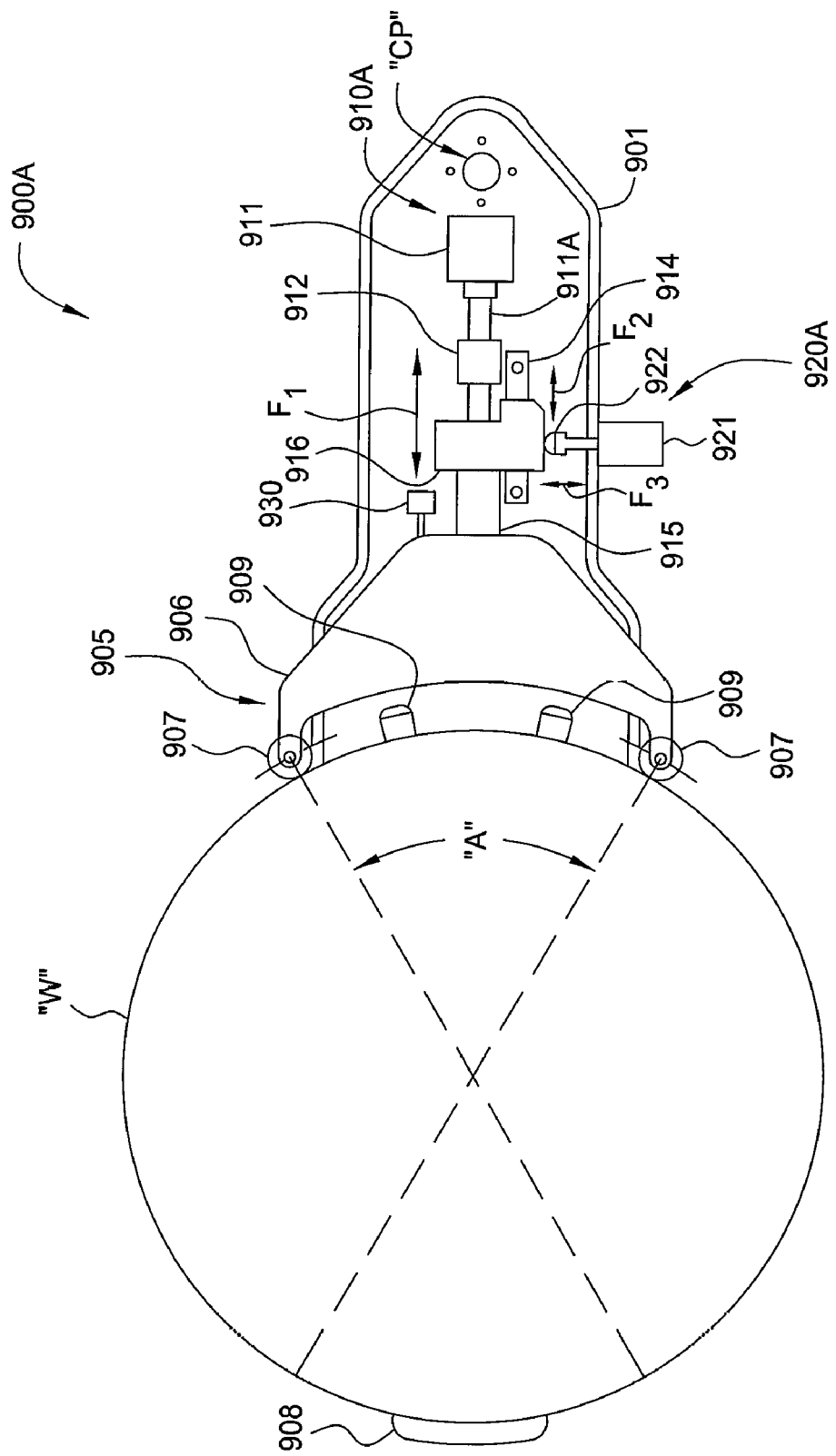
FIG. 16C is a plan view illustrating one embodiment of a robot blade assembly that may be adapted to transfer substrates in various embodiments of the cluster tool.

FIG. 16C schematically illustrates plan view of one embodiment of a blade assembly (element 900A) which has an opposing brake assembly 920A that replaces the schematic representation of the brake mechanism 920 in FIG. 16A. The opposing brake assembly 920A is adapted to restrain the clamp plate 906 in position during a substrate transferring process. The embodiment illustrated in FIG. 16C is similar to the configurations illustrated in FIGS. 16A-B except for the addition of the opposing brake assembly 920A, a actuator assembly 910A and various supporting components and thus, for clarity, like element numbers have been used where appropriate. The embodiment of the robot blade assembly 900A generally contains a blade base 901, an actuator assembly 910A, an opposing brake mechanism 920A, a position sensor 930, a clamp assembly 905, a reaction member 908, and a substrate support component 909. In one embodiment, the clamp plate 906 is mounted on a linear slide (not shown) that is attached to the blade base 901 to align and restrain its motion of the clamp plate 906 in a desired direction (e.g., X-direction).

In one embodiment, the actuator assembly 910A contains an actuator 911, an actuator coupling shaft 911A, a coupling member 912, a guide assembly 914, a connection member 915, and a connection plate 916 connected to the coupling member 912 and to clamp plate 906 through the connection member 915. The coupling member 912 may be a conventional coupling joint or "floating joint" commonly used to connect various motion control components together. In one embodiment, the connection plate 916 is directly connected to the actuator coupling shaft 911A of the actuator 911. The guide assembly 914 may be a convention linear slide assembly, or ball bearing slide, that is connected to the connection plate 916 to align and guide the motion of the connection plate and thus the clamp plate 906. The actuator 911 is adapted to position the clamp plate 906 by moving the coupling shaft 911A, coupling member 912, connection member 915, and connection plate 916. In one aspect, the actuator 911 is an air cylinder, linear motor or other comparable positioning and force delivering device.

In one embodiment, the opposing brake assembly 920A contains an actuator 921 which is connected to the blade base 901 and coupled to a brake contact member 922. In this configuration the opposing brake assembly 921A is adapted to "lock", or restrain, the clamp plate 906 due to a restraining force $F_2$ generated by the opposing brake assembly 920A. In one embodiment, the restraining force $F_2$ is generated by a friction force formed between the connection plate 916 and the brake contact member 922 when the actuator 921 forces (element $F_3$) the brake contact member 922 against the connection plate 916. In this configuration the guide assembly 914 is designed to accept a side load generated from the brake force $F_3$ delivered by the actuator 921. The generated restraining force $F_2$ that holds the clamp plate 906 in place is equal to the brake force $F_3$ times the static friction coefficient created between the brake contact member 922 and the connection plate 916. The selection of the size of the actuator 921, and the brake contact member 922 and the connection plate 916 materials and surface finish can be optimized to assure that the generated restraining force is always larger than any force created during the acceleration of the substrate during the transferring process. In one aspect, the created restraining force $F_2$ is within a range between about 0.5 and about 3.5 kilograms-force (kgf). In one aspect, the brake contact member 922 may be made from a rubber or polymeric type material, such as polyurethane, ethylene-propylene rubber (EPDM), natural rubber, butyl rubber or other suitable polymeric materials, and the connection plate 916 are made from an aluminum alloy or a stainless steel alloy. In one embodiment, not shown, the coupling shaft 911A of the actuator 911 is directly coupled to the clamp plate 906 and the brake contact member 922 of the opposing brake assembly 920A is adapted to contact the coupling shaft 911A or the clamp plate to prevent their motion.

Figure 16D:
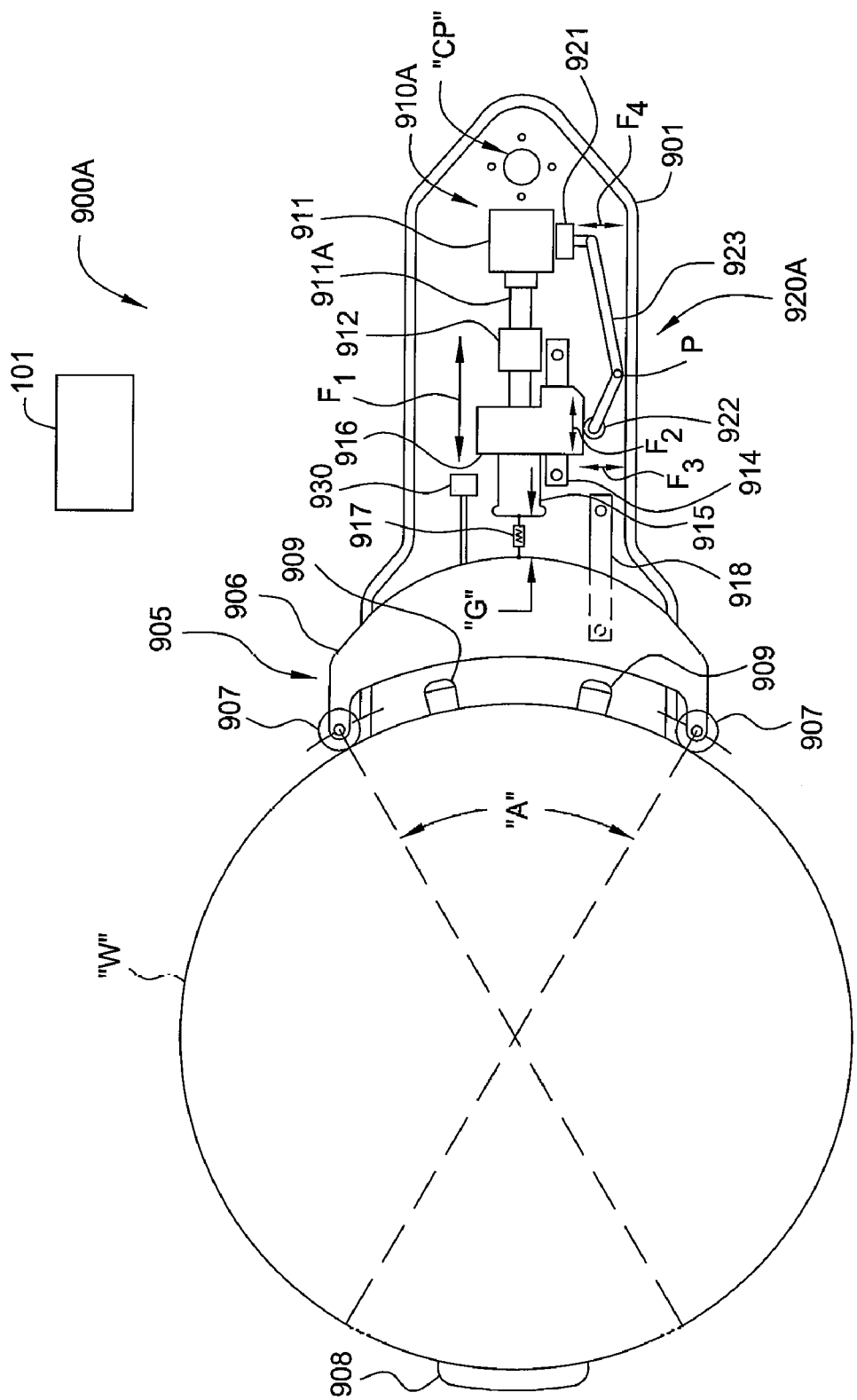
FIG. 16D is a plan view illustrating one embodiment of a robot blade assembly that may be adapted to transfer substrates in various embodiments or the cluster tool.

FIG. 16D schematically illustrates plan view of one embodiment of the blade assembly 900A which has a different configuration of the opposing brake assembly 920A than what is illustrated in FIG. 16C. In this configuration, the opposing brake assembly 920A contains a lever arm 923 that is connected to the brake contact member 922 at one end, the actuator 921 at the other end of the lever arm, and a pivot point "P" that is positioned somewhere between either end of the lever arm. In one aspect, the pivot point is connected to the blade base 901 and is adapted to support the lever arm 923 and the force $F_4$ supplied to the lever arm 923 from the actuator 921 as the brake contact member 922 is urged against the connection plate 916. In this configuration, by strategically positioning the pivot point "P" a mechanical advantage can be created by use of the lever arm 923 that can be used to supply a brake force $F_3$, and thus restraining force $F_2$, that exceeds forces achieved by direct contact with the force generating component of the actuator 921.

FIG. 16D also illustrates one embodiment of the blade assembly 900A that contains compliant member 917 that is positioned between the clamp plate 906 and connection member 915 to help sense the presence, or non-presence, of a substrate on the blade assembly 900A. The complaint member generally adds an extra degree-of-freedom that is used in conjunction with the position sensor 930 and controller 101 to sense whether the substrate is present, or not, on the blade assembly 900A once the restraining force $F_2$ has been applied to connection plate 916. If no other degree-of-freedom exists in the blade assembly 900A the restraining force $F_2$, which prevents, or inhibits, the clamp plate 906 from moving, would thus prevent the position sensor 930 and controller 101 from detecting the movement or loss of the substrate before or during the substrate transferring process.

Therefore, in one embodiment, the actuator assembly 910A generally contains an actuator 911, an actuator coupling shaft 911A, a coupling member 912, a guide assembly 914, a connection member 915, a compliant member 917, a clamp plate guide assembly 918, and a connection plate 916 connected to the coupling member 912 and to the clamp plate 906 through the connection member 915 and complaint member 917. The clamp plate guide assembly 918 is generally a convention linear slide assembly, or ball bearing slide, that is connected to the clamp plate 906 to align and guide its motion.

The complaint member 917 is generally a flexible component, such as a spring, flexure or other similar device that can deliver enough force upon the release of the potential energy generated by its deflection during the application of the holding force $F_1$ to cause the clamp plate 906 to move an amount that can be reliably measured by the position sensor 930 when the substrate moves or becomes "lost." In one aspect, the complaint member 917 is a spring that has a spring rate which is low enough to allow it to reach its "solid height" when the holding force $F_1$ is applied to the substrate. In another aspect, the connection member 915, complaint member 917 and clamp plate 906 are designed so that when the holding force $F_1$ is applied, the connection member 915 will come into contact with, or "bottom out" on, the clamp plate 906. One advantage of these types of configurations is that they prevent the holding force $F_1$ from varying during the transferring process, since the complaint member 917 is not be able to further deflect due to the accelerations experienced by the substrate during the transferring process, which will reduce the number of generated particles and prevent the loss of the substrate.

The following steps are intended to illustrate an example of how the complaint member 917 can be used to sense the presence of the substrate on the blade assembly 900A after the restraining force $F_2$ is applied to the connection plate 916. In the first step the actuator 911 applies the holding force $F_1$ to the substrate through the contact members 907 in the clamp assembly 905 and the reaction member 908 which cause the compliant member 917 to deflect an amount that causes the gap "G" between the connection member 915 and the clamp plate 906 to shrink. The controller 101 then checks to make sure that the clamp plate 906 is in an acceptable position by monitoring and noting the information received from the position sensor 930. Once the substrate has been sensed, and thus is in a desirable position on the blade assembly 900A, the restraining force $F_2$ is applied to the connection plate 916 to limit its motion in the direction parallel to the holding force ($F_1$) direction. Then if the substrate moves, and/or becomes "un-gripped", the potential energy generated in the compliant member 917, due to its deflection during the application of the holding force $F_1$, will cause the clamp plate 906 to move away from the restrained connection plate 916 which is then sensed by the position sensor 930 and controller 101. The noted movement of the clamp plate 906 by the position sensor 930 will allow the controller 101 to stop the transferring process or prevent the transferring process from occurring, which may help prevent damage to the substrate and system.

While the foregoing is directed to embodiments of the present invention, other and further embodiments of the invention may be devised without departing from the basic scope thereof, and the scope thereof is determined by the claims that follow.

The invention claimed is:

1. A method of transferring a substrate in a cluster tool adapted to operate at a first pressure, comprising:
   providing a first processing rack that comprises a first array of three or more groups of two or more vertically stacked processing chambers that each have a first side that is aligned along a first direction which is generally orthogonal to a vertical direction, wherein each of the three or more groups of two or more vertically stacked chambers within the first array are positioned along the first direction;
   positioning a second processing rack that comprises a second array of three or more groups of two or more vertically stacked processing chambers that each have a first side that is aligned along the first direction so that the first side of each of the processing chambers in the first processing rack and the first side of each of the processing chambers in the second processing rack are facing each other, wherein each of the three or more groups of two or more vertically stacked chambers within the second array are positioned along the first direction;
   positioning at least three robot assemblies between each of the first sides of the processing chambers in the first and second processing racks, wherein each of the three robot assemblies are adapted to position a substrate in a desired position in the first direction;
   transferring the substrate from at least one processing chamber contained within a first group of processing chambers in the first processing rack to at least one processing chamber contained within a second group of processing chambers in the first processing rack using a first robot assembly;
   transferring the substrate from at least one processing chamber contained within the second group of processing chambers in the first processing rack to a first group of processing chambers in the second processing rack using a second robot assembly;
   transferring the substrate from at least one processing chamber contained within a first group of processing chambers in the second processing rack to at least one processing chamber contained within a second group of processing chambers in the second processing rack using a third robot assembly; and
   generating a second pressure that is less than the first pressure in an enclosure positioned around an actuator assembly that is disposed within the first, the second or the third robot assembly, wherein the actuator assembly is adapted to position the substrate in the first or the vertical direction.

2. The method of claim 1, further comprising transferring a substrate from one or more processing chambers contained within the first group of two or more vertically stacked processing chambers in the first processing rack to one or more processing chambers contained within a third group of two or more vertically stacked processing chambers in the first processing rack using the third robot assembly.

3. The method of claim 1, wherein the second robot assembly is generally adjacent to the first and third robot assemblies and is positioned between the first and third robot assemblies along a second direction, wherein the second direction is substantially orthogonal to the first direction.

4. The method of claim 3, wherein the distance between a centerline of the first robot assembly to a centerline of the second robot assembly and a centerline of the second robot assembly to the centerline of the third robot assembly is between about 315 mm and about 450 mm, wherein the center lines are all parallel to the first direction and the distance between the centerlines is measured in the second direction.

5. The method of claim 1, further comprising:
   supporting a substrate on a substrate support that is positioned outside the enclosure and coupled to the actuator assembly in the first, the second or the third robot assembly through a slot formed in the enclosure, wherein the generating the pressure below atmospheric pressure in the enclosure causes air to flow into the enclosure from the outside through the slot.

6. The method of claim 1, wherein the first pressure is about atmospheric pressure.

7. A method of transferring a substrate in a cluster tool adapted to operate at a first pressure, comprising:
   transferring a substrate from a first pass-through chamber to a first array of processing chambers positioned along a first direction using a first robot assembly which is adapted to position the substrate at a desired position in the first direction and at a desired position in a second direction, wherein the second direction is generally orthogonal the first direction;
   transferring a substrate from the first pass-through chamber to the first array of processing chambers using a second robot assembly which is adapted to position the substrate at a desired position in the first direction at a desired position in a second direction;
   transferring a substrate from a substrate cassette to the first pass-through chamber using a front end robot that is positioned in a front end assembly, wherein the front end assembly is adjacent to a transferring region that contains the first array of processing chambers, the first robot assembly and the second robot assembly; and generating a second pressure that is less than the first pressure in an enclosure positioned around an actuator assembly that is disposed within the first, the second or the third robot assembly, wherein the actuator assembly is adapted to position the substrate in the first or the second direction.

8. The method of claim 7, further comprising transferring a substrate from a second pass-through chamber to the first array of processing chambers using the first or the second robot assemblies, wherein the second pass-through chamber is positioned a distance in the second direction from the first pass-through chamber.

9. The method of claim 7, further comprising a front end assembly having a front end robot that is adapted to transfer a substrate from a substrate cassette to the first pass-through chamber.

10. The method of claim 7, further comprising:
supporting a substrate on a substrate support that is positioned outside the enclosure and coupled to the actuator assembly in the first, the second or the third robot assembly through a slot formed in the enclosure, wherein the generating the pressure below atmospheric pressure in the enclosure causes air to flow into the enclosure from the outside through the slot.

11. The method of claim 7, wherein the first pressure is about atmospheric pressure.

12. A method for transferring a substrate in a cluster tool, comprising:
transferring a substrate in a first direction using a first robot assembly which is positioned in the cluster tool and adapted to position the substrate at a desired position in the first direction and at a desired position in a second direction, wherein the second direction is generally orthogonal the first direction;

transferring a substrate in the first direction using a third robot assembly which is positioned in the cluster tool and adapted to position the substrate at a desired position in the first direction and at a desired position in the second direction;

transferring a substrate in the first direction using a second robot assembly which is positioned in the cluster tool and adapted to position the substrate at a desired position in the first direction and at a desired position in the second direction; and generating a pressure in an enclosure that is lower than the pressure outside of the enclosure, the enclosure containing an actuator assembly and being disposed within the first, the second or the third robot assembly.

13. The method of claim 12, wherein generating the pressure includes a pressure drop in the enclosure of between about 0.02 inches of water and about 1 inch of water.

14. The method of claim 13, wherein the pressure outside of the enclosure is about atmospheric pressure.

15. The method of claim 12, wherein generating the pressure includes a pressure drop in the enclosure of about 0.1 inches of water.

16. The method of claim 15, wherein the pressure outside of the enclosure is about atmospheric pressure.

17. The method of claim 12, further comprising:
exhausting air from the enclosure into the environment surrounding the cluster tool.

18. The method of claim 17, wherein the air is filtered prior to exhausting into the environment surrounding the cluster tool.

19. The method of claim 17, wherein the enclosure is disposed on the first robot assembly and the air is exhausted from the enclosure through a central region formed in the second robot assembly or third robot assembly.

* * * * *

UNITED STATES PATENT AND TRADEMARK OFFICE
CERTIFICATE OF CORRECTION

PATENT NO. : 7,798,764 B2
APPLICATION NO. : 11/553820
DATED : September 21, 2010
INVENTOR(S) : Rice et al.

Page 1 of 1

It is certified that error appears in the above-identified patent and that said Letters Patent is hereby corrected as shown below:

In the Specifications:
In the Brief Description of the Drawings:
Column 6, Line 58, please delete "or" and insert --of-- therefor;

In the Detailed Description:
Column 20, Line 42, please delete "A5" and insert --$A_5$-- therefor;

Column 24, Line 41, please delete "11A-C" and Insert --110A-C-- therefor;

Column 24, Line 52, please delete "11A-C" and insert --110A-C-- therefor;

Column 25, Line 6, please delete "11A-C" and insert --110A-C-- therefor;

Column 27, Line 44, please delete "Is" and insert --is-- therefor;

Column 30, Line 54, please delete "To" and insert --$T_0$-- therefor;

Column 34, Line 46, please delete "To" and insert --$T_0$-- therefor;

Signed and Sealed this
Eighteenth Day of January, 2011

David J. Kappos
*Director of the United States Patent and Trademark Office*

UNITED STATES PATENT AND TRADEMARK OFFICE
CERTIFICATE OF CORRECTION

PATENT NO. : 7,798,764 B2  Page 1 of 1
APPLICATION NO. : 11/553820
DATED : September 21, 2010
INVENTOR(S) : Rice et al.

It is certified that error appears in the above-identified patent and that said Letters Patent is hereby corrected as shown below:

On the Title Page:
Item (56) References Cited in U.S. Patent Documents

On page 2, column 2, please delete "D341,418 S 11/1993 Akimoto et al." and insert --D341,428 S 11/1993 Turner-- therefor;

On page 4, column 2, please delete "6,458,208 B1 10/2002 Anai et al." and insert --6,458,607 B1 10/2002 Rangarajan et al.-- therefor;

Please delete "6,503,003 B2 1/2003 Hasebe et al." and insert --6,502,003 B1 12/2002 Jacobs et al.-- therefor;

Please delete "6,579,370 B2 6/2003 Kimura et al." and insert --6,579,730 B2 6/2003 Li et al.-- therefor.

Signed and Sealed this
Twenty-first Day of June, 2011

David J. Kappos
*Director of the United States Patent and Trademark Office*